(12) United States Patent
Kawashima

(10) Patent No.: US 9,041,145 B2
(45) Date of Patent: May 26, 2015

(54) SEMICONDUCTOR DEVICE

(75) Inventor: Yoshiyuki Kawashima, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 671 days.

(21) Appl. No.: 13/093,693

(22) Filed: Apr. 25, 2011

(65) Prior Publication Data

US 2011/0260228 A1   Oct. 27, 2011

(30) Foreign Application Priority Data

Apr. 26, 2010   (JP) ................................. 2010-100984

(51) Int. Cl.
| | | |
|---|---|---|
| H01L 21/70 | (2006.01) | |
| H01L 29/792 | (2006.01) | |
| H01L 29/423 | (2006.01) | |
| H01L 27/06 | (2006.01) | |

(52) U.S. Cl.
CPC ........... *H01L 29/792* (2013.01); *H01L 27/0629* (2013.01); *H01L 29/4234* (2013.01); *H01L 29/42344* (2013.01)

(58) Field of Classification Search
None
See application file for complete search history.

(56) References Cited

U.S. PATENT DOCUMENTS

| | | | |
|---|---|---|---|
| 7,230,294 B2 | 6/2007 | Lee et al. | |
| 7,750,394 B2 | 7/2010 | Shimizu et al. | |
| 7,872,289 B2 * | 1/2011 | Noguchi et al. | 257/296 |
| 7,872,298 B2 * | 1/2011 | Shimamoto et al. | 257/320 |
| 7,956,406 B2 | 6/2011 | Yasuda | |
| 7,985,996 B2 | 7/2011 | Ueno | |
| 2007/0210371 A1 * | 9/2007 | Hisamoto et al. | 257/316 |
| 2009/0078990 A1 * | 3/2009 | Yasuda | 257/326 |

FOREIGN PATENT DOCUMENTS

| | | |
|---|---|---|
| JP | 2005-136416 | 5/2005 |
| JP | 2009-81316 A | 4/2009 |
| JP | 2009-164260 | 7/2009 |
| JP | 2010-040797 | 2/2010 |

OTHER PUBLICATIONS

Office Action issued Feb. 25, 2014, in Japanese Patent Application No. 2010-100984.

* cited by examiner

*Primary Examiner* — Tan N Tran
*Assistant Examiner* — Scott R Wilson
(74) *Attorney, Agent, or Firm* — Miles & Stockbridge P.C.

(57) ABSTRACT

The performances of a semiconductor device are improved. Between a memory gate electrode and a p type well, and between a control gate electrode and the memory gate electrode of a split gate type nonvolatile memory, an insulation film having a charge accumulation layer therein is formed. The insulation film includes a lamination film of a silicon oxide film, a silicon nitride film formed thereover, another silicon oxide film formed thereover, and an insulation film formed thereover, and thinner than the upper silicon oxide film. The insulation film is in contact with the memory gate electrode including polysilicon. The insulation film is formed of a metal compound containing at least one of Hf, Zr, Al, Ta, and La, and hence can cause Fermi pinning, and has a high dielectric constant.

18 Claims, 51 Drawing Sheets

5 : INSULATION FILM
5a, 5c : SILICON OXIDE FILM
5b : SILICON NITRIDE FILM
5d : INSULATION FILM
CG : CONTROL GATE ELECTRODE
MG : MEMORY GATE ELECTRODE

| OPERATION \ APPLIED VOLTAGE | Vd | Vcg | Vmg | Vs | Vb |
|---|---|---|---|---|---|
| WRITE | 0.5V | 1V | 10V | 5 | 0 |
| ERASE | OPEN | 0 | -6V | 6 | 0 |
| READ | 1V | 1.5V | 0 | 0 | 0 |

FIG. 15
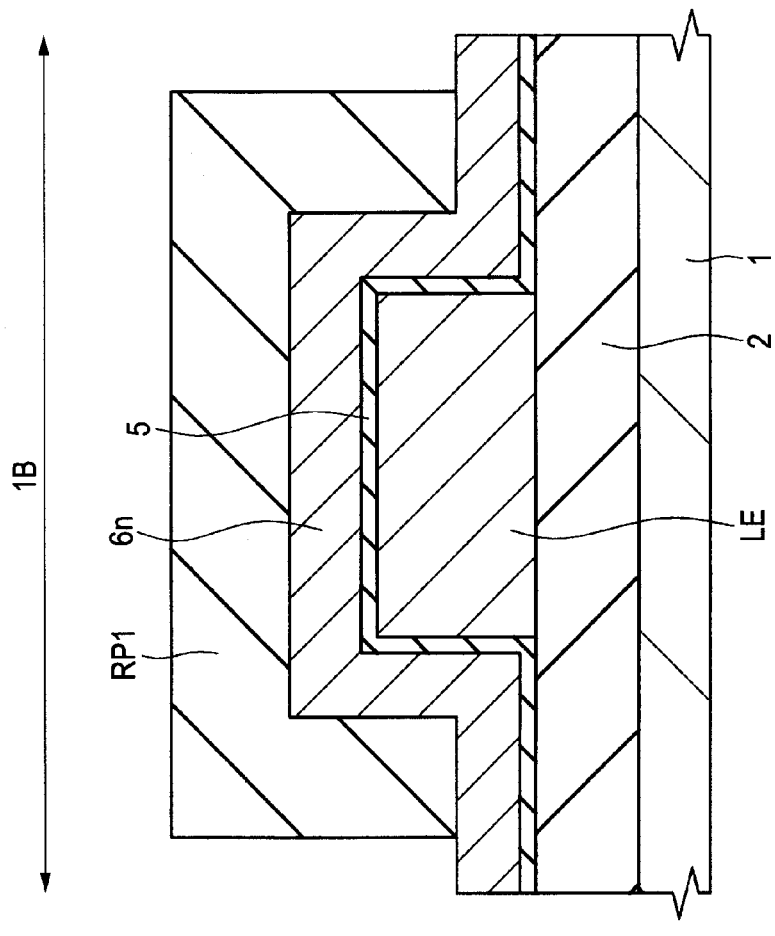
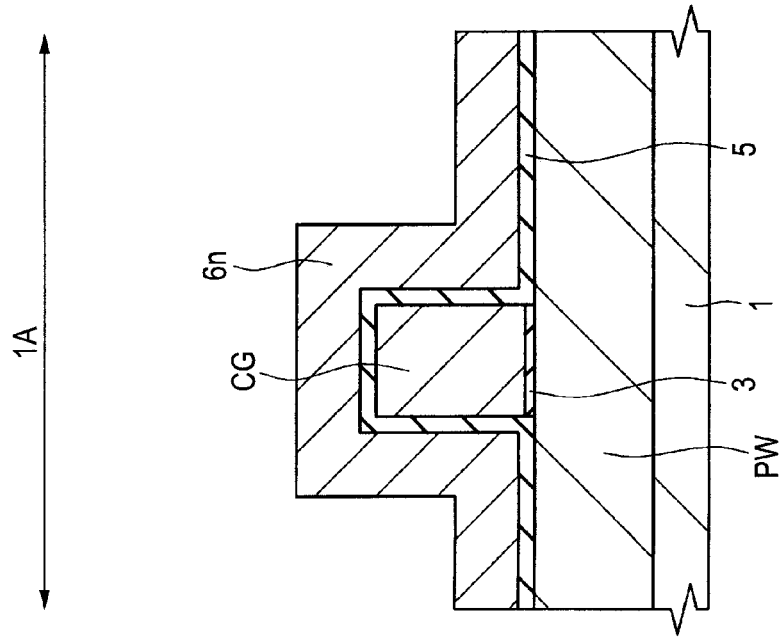

SEMICONDUCTOR DEVICE

CROSS-REFERENCE TO RELATED APPLICATIONS

The disclosure of Japanese Patent Application No. 2010-100984 filed on Apr. 26, 2010 including the specification, drawings and abstract is incorporated herein by reference in its entirety.

BACKGROUND

The present invention relates to a semiconductor device. More particularly, it relates to a technology effectively applicable to a semiconductor device having a nonvolatile memory.

As electrically writable/erasable nonvolatile semiconductor storage devices, EEPROMs (Electrically Erasable and Programmable Read Only Memories) have been widely used. The storage devices (memories) typified by currently and widely used flash memories have conductive floating gate electrodes surrounded by an oxide film and trapping insulation films under gate electrodes of MISFETs. The storage devices use charge accumulation states at the floating gates and the trapping insulation film as stored information, and read out the information as a threshold value of each transistor. The trapping insulation film denotes an insulation film capable of accumulating electric charges. As one example thereof, mention may be made of a silicon nitride film.

Injection/discharge of charges into such charge accumulation regions causes each MISFET to be shifted in threshold value and to operate as a storage element. The flash memories include a split gate type cell using a MONOS (Metal-Oxide-Nitride-Oxide-Semiconductor) film. Such a memory has the following advantages: use of a silicon nitride film as a charge accumulation region leads to an excellent data holding reliability because electric charges are accumulated discretely as compared with a conductive floating gate, and the excellent data holding reliability can reduce the film thickness of the oxide films over and under the silicon nitride film, which enables a lower voltage for write/erase operation; and other advantages.

Japanese Unexamined Patent Publication No. 2009-81316 (Patent Literature 1) describes the technology regarding a nonvolatile semiconductor storage device which has a first insulation film disposed over a channel between source/drain diffusion layers, a charge accumulation layer disposed over the first insulation film, a second insulation film including plurality of layers, and disposed over the charge accumulation layer, and a control gate electrode disposed over the second insulation film.

[Patent Literature 1] Japanese Unexamined Patent Publication No. 2009-81316

SUMMARY

In a related-art split gate type nonvolatile memory, as a lamination gate insulation film, for example, there is formed an ONO (Oxide-Nitride-Oxide) film of a lamination structure including a silicon oxide film, a silicon nitride film, and a silicon oxide film. In recent years, for the nonvolatile memory using the ONO film, there have been demands for further improving the data holding characteristic of the nonvolatile memory, and improving other performances than the data holding characteristic of a semiconductor device having a nonvolatile memory.

It is an object of the present invention to provide a technology capable of improving the performances of semiconductor device.

The foregoing and other objects and novel features of the present invention will be apparent from the description of this specification and the accompanying drawings.

Summaries of the representative ones of the inventions disclosed in the present application will be described in brief as follows.

A semiconductor device in accordance with a representative embodiment has: a lamination gate insulation film formed between a memory gate electrode and a semiconductor substrate, and between a control gate electrode and the memory gate electrode, and having a charge accumulation layer in the inside thereof. Then, the lamination gate insulation film includes a lamination film of a first silicon oxide film, a charge accumulation layer formed over the first silicon oxide film, a second silicon oxide film formed over the charge accumulation layer, and an insulation film formed over the second silicon oxide film, and formed of a metal compound containing at least one of Hf, Zr, Al, Ta, and La. The thickness of the insulation film is smaller than the thickness of the second silicon oxide film.

Effects obtainable by the representative ones of the inventions disclosed in the present application will be described in brief as follows.

In accordance with representative embodiments, it is possible to improve the performances of the semiconductor device.

BRIEF DESCRIPTION OF THE DRAWINGS

FIG. 15 is an essential part cross-sectional view of the semiconductor device during a manufacturing step following that of FIG. 12;

DETAILED DESCRIPTION

Figure 1:
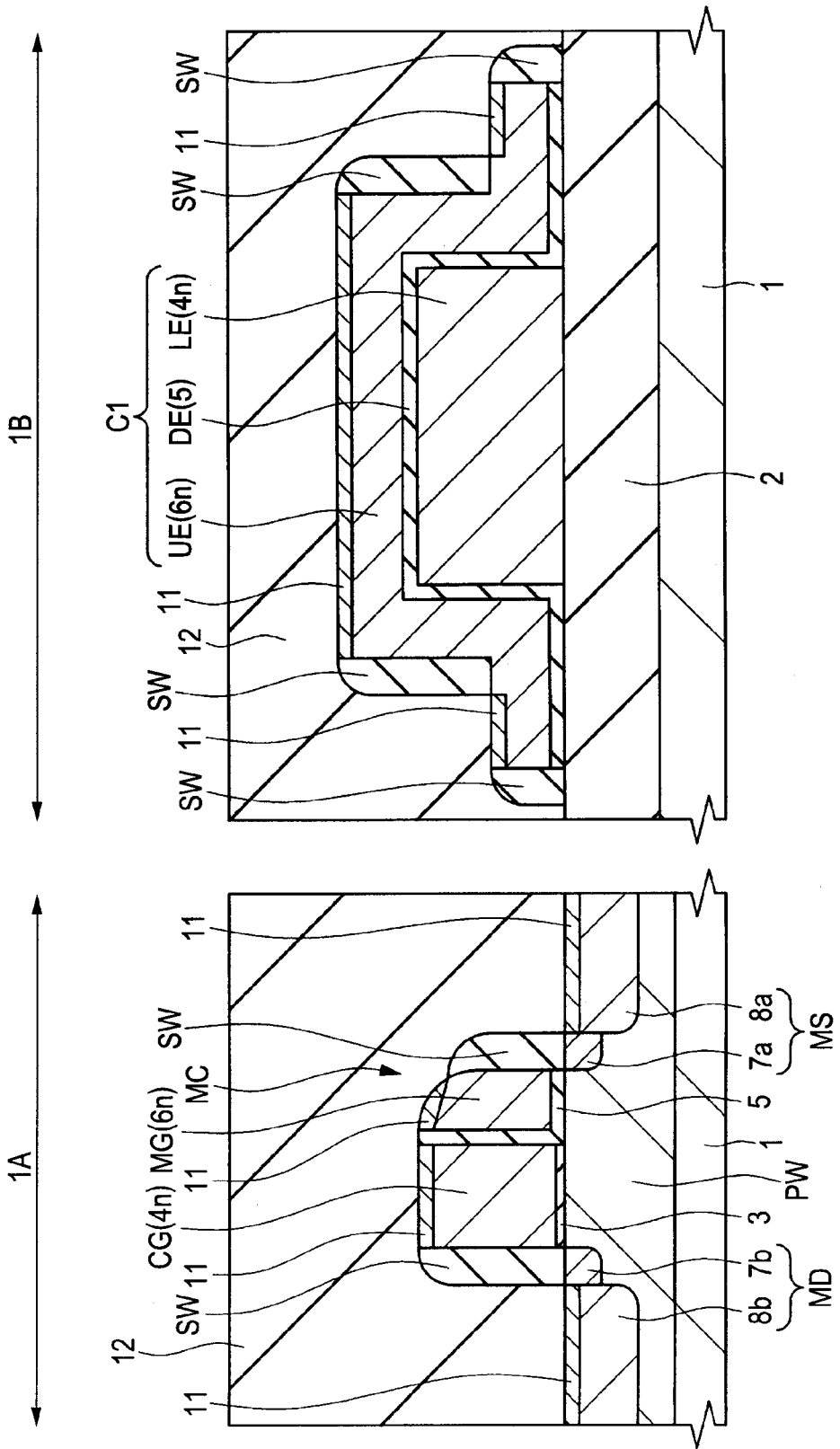
FIG. 1 is an essential part cross-sectional view of a semiconductor device which is one embodiment of the present invention.

In the following embodiment, the embodiment may be described in a plurality of divided sections or embodiments for convenience, if required. However, unless otherwise specified, these are not independent of each other, but are in a relation such that one is a modified example, details, complementary explanation, or the like of a part or the whole of the other. Further, in the following embodiments, when a reference is made to the number of elements, and the like (including number, numerical value, quantity, range, or the like), the number of elements is not limited to the specific number, but may be greater than or less than the specific number, unless otherwise specified, and except the case where the number is apparently limited to the specific number in principle, and other cases. Further in the following embodiments, it is needless to say that the constitutional elements (including element steps, or the like) are not always essential, unless otherwise specified, and except the case where they are apparently considered essential in principle, and other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numerical values and ranges.

Below, embodiments of the present invention will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar parts will not be repeated in principle, unless particularly required.

Further, in drawings to be used in embodiments, hatching may be omitted for ease of understanding of the drawings even in a cross-sectional view. Whereas, for ease of understanding of the drawings, hatching may be provided even in a plan view.

First Embodiment

The present invention is a semiconductor device including a nonvolatile memory (nonvolatile storage element, flash memory, or nonvolatile semiconductor storage device). The nonvolatile memory mainly uses a trapping insulation film (charge accumulable insulation film) as a charge accumulation part. In the following embodiments, a nonvolatile memory will be described with reference to a memory cell based on an n channel type MISFET (MISFET: Metal Insulator Semiconductor Field Effect Transistor), and using a trapping insulation film. Further, the polarities (the polarity of applied voltage and the polarity of carriers for write/erase/read) in the following embodiments are for describing the operation in the case of a memory cell based on an n channel type MISFET. When a memory cell is based on a p channel type MISFET, by inverting all the polarities of applied potentials, the conductivity type of carriers, and the like, it is possible to obtain the same operation in principle.

A semiconductor device of the present embodiment will be described by reference to the accompanying drawings.

Figure 2:
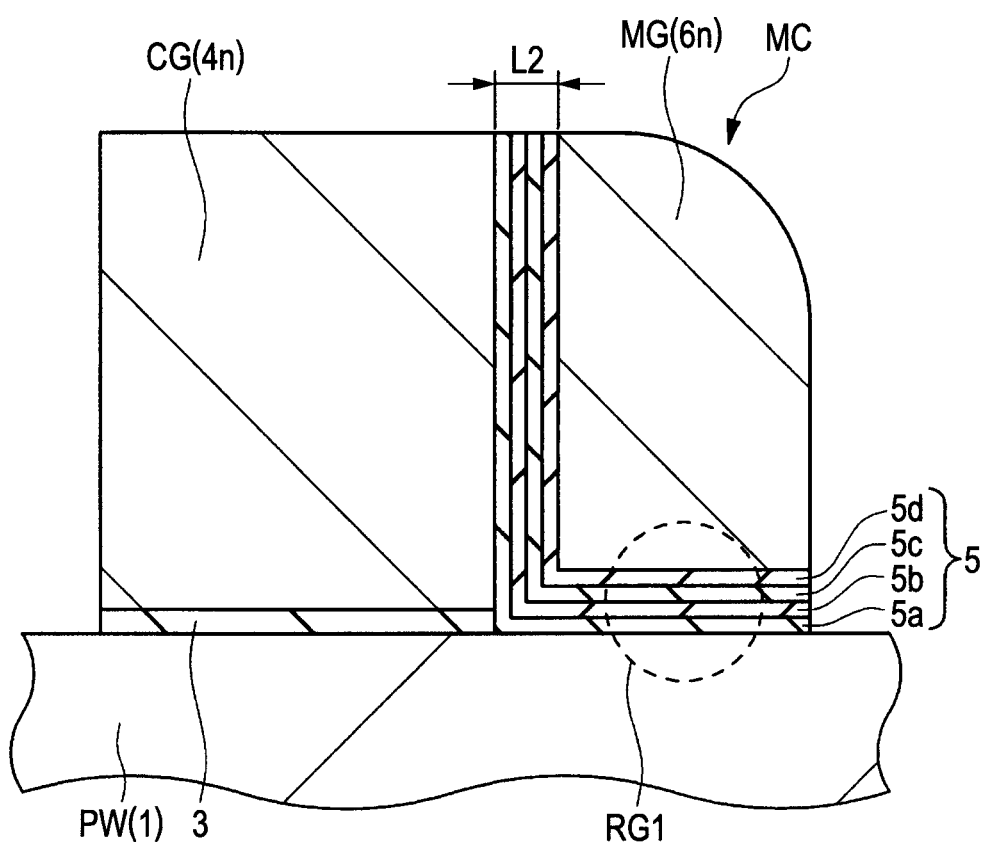
FIG. 2 is a partially enlarged cross-sectional view of a portion of FIG. 1 on an enlarged scale.
Figure 3:
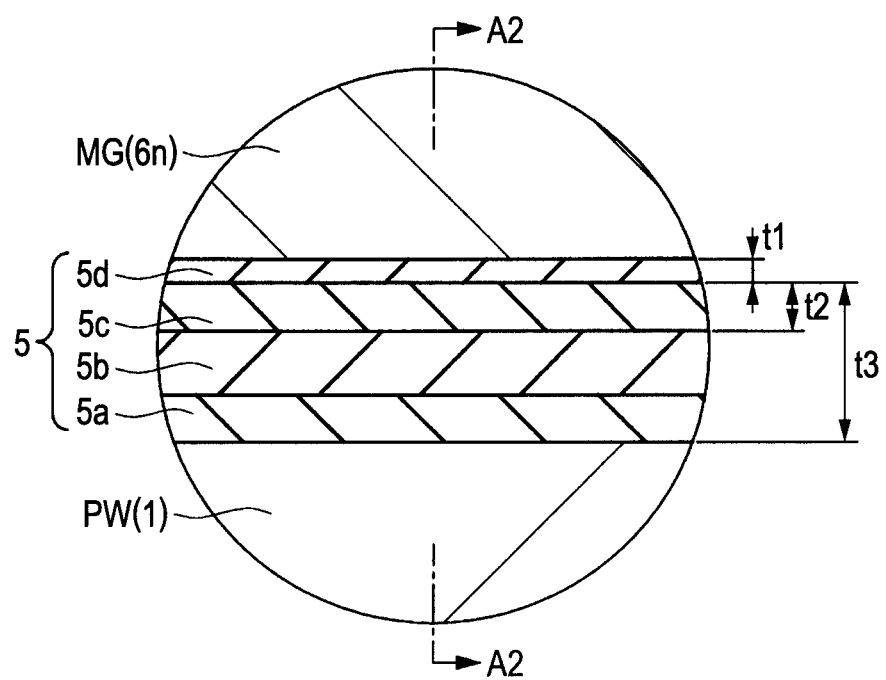
FIG. 3 is a partially enlarged cross-sectional view of a portion of FIG. 2 on an enlarged scale.
Figure 4:
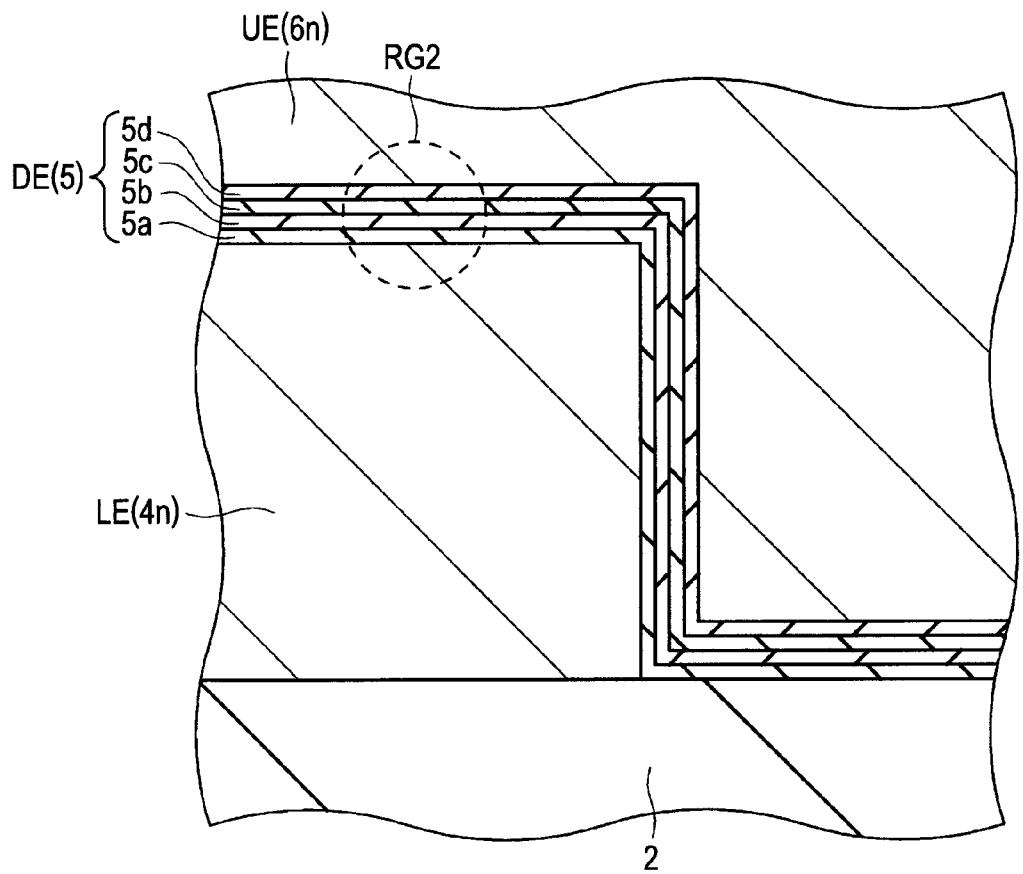
FIG. 4 is a partially enlarged cross-sectional view of a portion of FIG. 1 on an enlarged scale.
Figure 5:
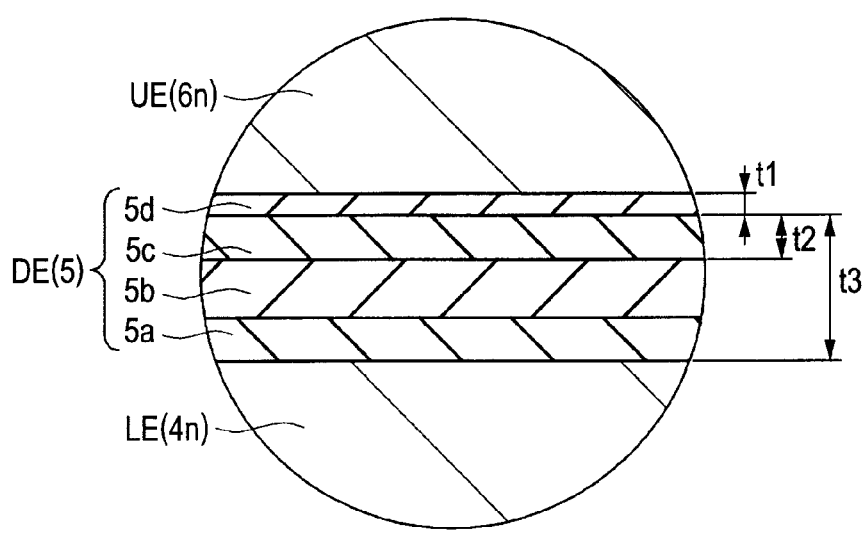
FIG. 5 is a partially enlarged cross-sectional view of a portion of FIG. 4 on an enlarged scale.

FIG. 1 is an essential part cross-sectional view of the semiconductor device of the present embodiment. FIG. 2 is a partially enlarged cross-sectional view (essential part cross-sectional view) of a memory cell MC in the semiconductor device of the present embodiment, and shows a part (a part of the memory cell region 1A) of FIG. 1 on an enlarged scale. FIG. 3 is an enlarged view of a region RG1 surrounded by a dotted circle in FIG. 2. FIG. 4 is a partially enlarged cross-sectional view (essential part cross-sectional view) of a capacitive element C1 in the semiconductor device of the present embodiment, and shows a part (a part of a capacitor formation region 1B) of FIG. 1 on an enlarged scale. FIG. 5 is an enlarged view of a region RG2 surrounded by a dotted circle in FIG. 4. Incidentally, FIG. 2 shows only a control gate electrode CG, a memory gate electrode MG, and insulation films 3 and 5, and a substrate region (a part of a semiconductor substrate 1 forming a p type well PW) immediately under them of the structure of FIG. 1 for facilitating understanding thereof.

The semiconductor device of the present embodiment is a semiconductor device including a nonvolatile memory. FIG. 1 shows an essential part cross-sectional view of the memory cell region 1A and the capacitor formation region 1B of the nonvolatile memory. The memory cell region 1A is a region in which the memory cell MC of the nonvolatile memory is formed. The capacitor formation region 1B is a region in which a PIP type capacitive element C1 is formed. The memory cell region 1A and the capacitor formation region 1B correspond to mutually different regions of the main surface of the same semiconductor substrate 1. For ease of understanding, in FIG. 1, the memory cell region 1A and the capacitor formation region 1B are shown adjacent to each other. However, both may not be adjacent to each other. The positional relationship (actual positional relationship) between the memory cell region 1A and the capacitor formation region 1B can be changed, if required. Further, in FIG. 1, the memory cell region 1A and the capacitor formation region 1B are shown separate from each other. However, these are formed in the same semiconductor substrate 1. The capacitive element C1 formed in the capacitor formation region 1B is used in a peripheral circuit, or the like. Herein, the peripheral circuit is, for example, a processor such as a CPU, a control circuit, a sense amplifier, a column decoder, a row decoder, or an input/output circuit.

As shown in FIG. 1, in a semiconductor substrate (semiconductor wafer) 1 including a p type single-crystal silicon having a specific resistance of, for example, about 1 to 10 Ωcm, or the like, an element isolation region 2 for isolating elements is formed. In an active region isolated (defined) by the element isolation region 2, p type well PW is formed. The p type well PW is mainly formed in the memory cell region 1A. In the capacitor formation region 1B, the element isolation region 2 is formed, and hence the p type well. PW is not formed.

In the p type well PW in the memory cell region 1A, there is formed a memory cell MC of a nonvolatile memory including a memory transistor and a control transistor (selection transistor) as shown in FIG. 1. In the memory cell region 1A, in actuality, a plurality of memory cells MC are formed in an array. However, in the memory cell region 1A of FIG. 1, the cross section of one memory cell MC of them is shown. The memory cell region 1A is electrically separated from other regions by the element isolation region 2.

As shown in FIGS. 1 to 3, the memory cell MC of the nonvolatile memory in the semiconductor device of the present embodiment is a memory cell of a split gate type, and includes two MISFETs of a control transistor (selection transistor) having a control gate electrode (selection gate electrode) CG, and a memory transistor having a memory gate electrode (gate electrode for memory) MG coupled with each other.

Herein, a MISFET (Metal Insulator Semiconductor Field Effect Transistor) having a gate insulation film including a charge accumulation part (charge accumulation layer) and a memory gate electrode MG is referred to as a memory transistor (transistor for storage). Whereas, a MISFET having the gate insulation film and the control gate electrode CG is referred as a control transistor (selection transistor, or transistor for selecting memory cell). Therefore, the memory gate electrode MG is a gate electrode of the memory transistor.

The control gate electrode CG is a gate electrode of the control transistor. The control gate electrode CG and the memory gate electrode MG are gate electrodes forming the (memory cell of) the nonvolatile memory.

Below, a configuration of the memory cell MC will be described specifically.

As shown in FIGS. 1 to 3, the memory cell MC of the nonvolatile memory has n type semiconductor regions MS and MD for source and drain, respectively, formed in the p type well PW of the semiconductor substrate 1, a control gate electrode (first gate electrode) CG formed over the top of the semiconductor substrate 1 (p type well PW), and a memory gate electrode (second gate electrode) MG formed over the top of the semiconductor substrate 1 (p type well PW), and adjacent to the control gate electrode CG. Then, the memory cell MC of the nonvolatile memory further has an insulation film (first insulation film) 3 formed between the control gate electrode CG and the semiconductor substrate 1 (p type well PW), and an insulation film (second insulation film) 5 formed between the memory gate electrode MG and the semiconductor substrate 1 (p type well PW) and between the memory gate electrode MG and the control gate electrode CG.

The control gate electrode CG and the memory gate electrode MG extend and are disposed side by side along the main surface of the semiconductor substrate 1 with the insulation film 5 interposed between the opposing side surfaces (sidewalls) thereof. The direction of extension of the control gate electrode CG and the memory gate electrode MG is the direction perpendicular to the paper plane of FIG. 1. The control gate electrode CG and the memory gate electrode MG are formed over the top of the semiconductor substrate 1 (p type well PW) between the semiconductor region MD and the semiconductor region MS via the insulation films 3 and 5 (in which, for the control gate electrode CG, via the insulation film 3, and for the memory gate electrode MG, via the insulation film 5). On the side of the semiconductor region MS, the memory gate electrode MG is situated. On the side of the semiconductor region MD, the control gate electrode CG is situated.

The control gate electrode CG and the memory gate electrode MG are adjacent to each other with the insulation film 5 interposed therebetween. The memory gate electrode MG is formed in a sidewall spacer form over the sidewall of the control gate electrode CG via the insulation film 5. Further, the insulation film 5 extends across both regions of a region between the memory gate electrode MG and the semiconductor substrate 1 (p type well PW) and a region between the memory gate electrode MG and the control gate electrode CG.

The insulation film 3 formed between the control gate electrode CG and the semiconductor substrate 1 (p type well PW) (i.e., a portion of the insulation film 3 under the control gate electrode CG) functions as the gate insulation film of the control transistor. Whereas, the insulation film 5 between the memory gate electrode MG and the semiconductor substrate 1 (p type well PW) (i.e., a portion of the insulation film 5 under the memory gate electrode MG) functions as the gate insulation film of the memory transistor (the gate insulation film having a charge accumulation part in the inside thereof).

The insulation film 3 can be formed of, for example, a silicon oxide film or a silicon oxynitride film. Further, for the insulation film 3, there may be used, other than the silicon oxide film, the silicon oxynitride film, or the like, a metal oxide film having a higher dielectric constant than that of a silicon nitride film, such as a hafnium oxide film, an aluminum oxide film (alumina), or a tantalum oxide film.

The insulation film 5 includes a lamination film having a silicon oxide film (oxide film, first silicon oxide film) 5a, a silicon nitride film (nitride film, charge accumulation layer) 5b over the silicon oxide film 5a, a silicon oxide film (oxide film, second silicon oxide film) 5c over the silicon nitride film 5b, and an insulation film 5d over the silicon oxide film 5c. Of the insulation film 5, the uppermost-layer insulation film 5d is in contact with the memory gate electrode MG. Namely, the top surface of the insulation film 5d forms the top surface (uppermost surface) of the insulation film 5. The top surface of the insulation film 5d is in contact with the (bottom surface and side surface of) the memory gate electrode MG. Of the insulation film 5, the lowermost-layer silicon oxide film 5a is in contact with the substrate region of the semiconductor substrate 1 (Si substrate region, region in which a channel region is formed).

The insulation film 5 has a lamination structure of the silicon oxide film 5a, the silicon nitride film 5b, the silicon oxide film 5c, and the insulation film 5d. Therefore, the insulation film 5 extending in a region between the memory gate electrode MG and the semiconductor substrate 1 (p type well PW), and in a region between the memory gate electrode MG and the control gate electrode CG can also be regarded as a lamination gate insulation film (gate insulation film of the lamination structure). However, a portion of the insulation film 5 between the memory gate electrode MG and the semiconductor substrate 1 (p type well PW) functions as a gate insulation film of the memory transistor. Whereas, a portion of the insulation film 5 between memory gate electrode MG and the control gate electrode CG functions as an insulation film for establishing an insulation (electric separation) between the memory gate electrode MG and the control gate electrode CG.

Of the insulation film 5, the silicon nitride film 5b is an insulation film for accumulating electric charges, and functions as a charge accumulation layer (charge accumulation part). Namely, the silicon nitride film 5b is a trapping insulation film formed in the insulation film 5. For this reason, the insulation film 5 can be regarded as an insulation film having a charge accumulation part (charge accumulation layer, herein, the silicon nitride film 5b) in the inside thereof.

The silicon oxide film 5c and the silicon oxide film 5a situated over and under the silicon nitride film 5b can function as charge blocking layers (charge blocking films, charge confining layers). The silicon nitride film 5b is interposed between the silicon oxide film 5c and the silicon oxide film 5a. This structure enables accumulation of electric charges into the silicon nitride film 5b. The silicon oxide film 5a, the silicon nitride film 5b, and the silicon oxide film 5c can also be regarded as an ONO (oxide-nitride-oxide) film.

As one of main features, the uppermost-layer insulation film 5d of the insulation film 5 is an insulation film capable of causing Fermi level pinning. Further, as another feature of main features, the insulation film 5d has a high dielectric constant (relative dielectric constant). Namely, the insulation film 5d is an insulation film capable of causing Fermi level pinning, and is also an insulation film (high-k film) with a higher dielectric constant than that of silicon nitride. For this reason, from both viewpoints of capability of causing Fermi level pinning, and the high dielectric constant, the insulation film 5d is formed of (includes) a metal compound containing at least one of Hf (hafnium), Zr (zirconium), Al (aluminum), Ta (tantalum), and La (lanthanum). As the metal compounds, the metal oxides of the foregoing materials are particularly preferable. As the preferable material for the insulation film 5d, mention may be specifically made of hafnium oxide ($HfO_x$, typically, $HfO_2$), zirconium oxide ($ZrO_x$, specifically $ZrO_2$), aluminum oxide ($Al_xO_y$, typically, $Al_2O_3$), tantalum oxide ($Ta_xO_y$, typically, $Ta_2O_3$), or lanthanum oxide ($La_xO_y$, typically, $La_2O_3$). Although particularly described later, in the insulation film 5, the thickness t1 of the insulation film 5d is smaller than the thickness t2 of the silicon oxide film 5c (i.e., t1<t2). It is more preferable that the thickness t1 of the insulation film 5d is equal to, or smaller than the half of the thickness t2 of the silicon oxide film 5c (i.e., t1≤t2×0.5).

The insulation film 5d is an insulation film capable of causing Fermi level pinning. Therefore, at the interface between the insulation film 5d and the memory gate electrode MG, Fermi level pinning occurs. Namely, the insulation film 5d is in contact with the memory gate electrode MG. For this reason, at the interface between the insulation film 5d and the memory gate electrode MG, Fermi level pinning occurs. As compared with the case where there is no insulation film 5d (in this case, the silicon oxide film 5c is in contact with the memory gate electrode MG), the Fermi level is pinned at a lower position (lower energy position).

From another viewpoint, the material for the insulation film 5d is selected such that the Fermi level of the n type silicon film 6n (memory gate electrode MG) in the vicinity of the interface is lower in the case where the n type silicon film 6n (memory gate electrode MG) is formed in contact with the insulation film 5d than in the case where the n type silicon film 6n (memory gate electrode MG) is formed in contact with the silicon oxide film 5c. This can be implemented by forming (configuring) the insulation film 5d with a metal compound containing at least one of Hf (hafnium), Zr (zirconium), Al (aluminum), Ta (tantalum), and La (lanthanum). Out of these, preferred is hafnium oxide, zirconium oxide, aluminum oxide, tantalum oxide, or lanthanum oxide. Therefore, it is particularly preferable that the insulation film 5d is any of a hafnium oxide film, a zirconium oxide film, an aluminum oxide film, a tantalum oxide film, or a lanthanum oxide film.

The semiconductor region MS is a semiconductor region functioning as one of the source region or the drain region. The semiconductor region MD is a semiconductor region functioning as the other of the source region or the drain region. Herein, the semiconductor region MS is a semiconductor region functioning as the source region. The semiconductor region MD is a semiconductor region functioning as the drain region. The semiconductor regions MS and MD each includes a semiconductor region including n type impurities introduced therein (n type impurity diffusion layer), and each has a LDD (lightly doped drain) structure. Namely, the semiconductor region MS for source has an $n^-$ type semiconductor region 7a, and an $n^+$ type semiconductor region 8a having a higher impurity concentration than that of the $n^-$ type semiconductor region 7a. The semiconductor region MD for drain has an $n^-$ type semiconductor region 7b, and an $n^+$ type semiconductor region 8b having a higher impurity concentration than that of the $n^-$ type semiconductor region 7b. The $n^+$ type semiconductor region 8a is deeper in junction depth, and higher in impurity concentration than the $n^-$ type semiconductor region 7a. Whereas, the $n^+$ type semiconductor region 8b is deeper in junction depth, and higher in impurity concentration than the $n^-$ type semiconductor region 7b.

Over the sidewalls of the memory gate electrode MG and the control gate electrode CG (the sidewalls on the sides not adjacent to each other), sidewall insulation films (sidewalls or sidewall spacers) SW including an insulator such as silicon oxide or silicon nitride (silicon oxide film, silicon nitride film, or insulation film) are formed. Namely, over the sidewall (side surface) on the side of the memory gate electrode MG opposite to the side thereof adjacent to the control gate electrode CG via the insulation film 5, and over the sidewall (side surface) on the side of the control gate electrode CG opposite to the side thereof adjacent to the memory gate electrode MG via the insulation film 5, the sidewall insulation films SW are formed.

The $n^-$ type semiconductor region 7a of the source part is formed in self-alignment with the sidewall of the memory gate electrode MG. The $n^+$ type semiconductor region 8a is formed in self-alignment with the side surface of the sidewall insulation film SW over the sidewall of the memory gate electrode MG (the side surface on the side thereof opposite to the side in contact with the memory gate electrode MG). Accordingly, the low-concentration $n^-$ type semiconductor region 7a is formed under the sidewall insulation film SW over the sidewall of the memory gate electrode MG. The high-concentration $n^+$ type semiconductor region 8a is formed outside the low-concentration $n^-$ type semiconductor region 7a. Therefore, the low-concentration $n^-$ type semiconductor region 7a is formed in such a manner as to be adjacent to the channel region of the memory transistor. The high-concentration $n^+$ type semiconductor region 8a is formed in such a manner as to be in contact with the low-concentration $n^-$ type semiconductor region 7a, and to be spaced apart from the channel region of the memory transistor by the $n^-$ type semiconductor region 7a.

The $n^-$ type semiconductor region 7b of the drain part is formed in self-alignment with the sidewall of the control gate electrode CG. The $n^+$ type semiconductor region 8b is formed in self-alignment with the side surface of the sidewall insulation film SW over the sidewall of the control gate electrode CG (the side surface on the side thereof opposite to the side in contact with the control gate electrode CG). Accordingly, the low-concentration $n^-$ type semiconductor region 7b is formed under the sidewall insulation film SW over the sidewall of the control gate electrode CG. The high-concentration $n^+$ type semiconductor region 8b is formed outside the low-concentration $n^-$ type semiconductor region 7b. Therefore, the low-concentration $n^-$ type semiconductor region 7b is formed in such a manner as to be adjacent to the channel region of the control transistor. The high-concentration $n^+$ type semiconductor region 8b is formed in such a manner as to be in contact with the low-concentration $n^-$ type semiconductor region 7b, and to be spaced apart from the channel region of the control transistor by the $n^-$ type semiconductor region 7b.

Under the insulation film 5 under the memory gate electrode MG, the channel region of the memory transistor is formed. Under the insulation film 3 under the control gate electrode CG, the channel region of the control transistor is formed. In a channel formation region of the control transistor under the insulation film 3 under the control gate electrode CG, a semiconductor region (p type semiconductor region or n type semiconductor region) for adjustment of the threshold value of the control transistor is formed, if required. In a channel formation region of the memory transistor under the insulation film 5 under the memory gate electrode MG, a semiconductor region (p type semiconductor region or n type semiconductor region) for adjustment of the threshold value of the memory transistor is formed, if required.

The control gate electrode CG includes a conductor (conductor film), and preferably includes a silicon film 4n such as an n type polysilicon film (n type impurities-doped polysilicon film or doped polysilicon film). The silicon film 4n is an n type silicon film, and has a low resistivity by including n type impurities introduced therein. Specifically, the control gate electrode CG includes a patterned n type silicon film 4n.

The memory gate electrode MG includes a silicon film 6n. The silicon film 6n is an n type silicon film, and has a low resistivity by including n type impurities introduced therein.

The silicon film 6n is preferably an n type silicon film (an n type impurities-doped polysilicon film or doped polysilicon film). The memory gate electrode MG is formed in the following manner. As described later, the silicon film 6n formed in such a manner as to cover the control gate electrode CG over the semiconductor substrate 1 is anisotropically etched. Thus, over the sidewall of the control gate electrode CG, the silicon film 6n is left via the insulation film 5. Accordingly, the memory gate electrode MG is formed in a sidewall spacer form over the sidewall of the control gate electrode CG via the insulation film 5.

Over the top (top surface) of (the silicon film 6n forming) the memory gate electrode MG, the top (top surface) of (the silicon film 4n forming) the control gate electrode CG, and the top surfaces (surfaces) of the $n^+$ type semiconductor regions 8a and 8b, metal silicide layers (metal silicide films) 11 are formed, respectively, by a salicide (Self Aligned Silicide) technology, or the like. The metal silicide layer 11 includes, for example, a cobalt silicide layer or a nickel silicide layer. The metal silicide layer 11 can lower the diffusion resistance and the contact resistance. Further, from the viewpoint of minimizing a short circuit between the memory gate electrode MG and the control gate electrode CG, over one or both of the tops of the memory gate electrode MG and the control gate electrode CG, the metal silicide layer 11 may be not formed.

Further, as shown in FIGS. 1, 4, and 5, over the same semiconductor substrate 1 as the semiconductor substrate 1 in which the memory cell MC of the nonvolatile memory is formed, a capacitive element C1 is formed. The capacitive element C1 in the capacitor formation region 1B will be specifically described.

As shown in FIG. 1, in the entire capacitor formation region 1B, the element isolation region 2 is formed in the semiconductor substrate 1. As shown in FIGS. 1, 4, and 5, over a portion of the semiconductor substrate 1 in the capacitor formation region 1B, namely, over the element isolation region 2, a lower electrode (first electrode) LE of the capacitive element C1 is formed. The lower electrode LE in the capacitor formation region 1B is formed of a conductor film at the same layer as the control gate electrode CG in the memory cell region 1A. Namely, the control gate electrode CG and the lower electrode LE are both formed of the silicon film 4n (patterned silicon film 4n). The silicon film 4n forming the control gate electrode CG and the lower electrode LE has a low resistivity by including n type impurities introduced therein. Over the main surface of the semiconductor substrate 1 including the memory cell region 1A and the capacitor formation region 1B, the silicon film 4n is formed. Then, the silicon film 4n is patterned using a photolithography method, a dry etching method, or the like. As a result, in the memory cell region 1A, the control gate electrode CG is formed. In the capacitor formation region 1B, the lower electrode LE is formed.

Over the lower electrode LE, an upper electrode (second electrode) UE is formed via a capacitive insulation film DE. The capacitive insulation film DE is formed of the insulation film at the same layer as the insulation film 5 in the memory cell region 1A. Namely, the capacitive insulation film DE of the capacitive element C1 is formed of the insulation film 5 at the same layer as the gate insulation film of the memory transistor of the memory cell MC. In other words, the capacitive insulation film DE of the capacitive element C1 and the gate insulation film of the memory transistor of the memory cell MC are both formed of the insulation film 5. For this reason, the capacitive insulation film DE of the capacitive element C1 includes a lamination film (i.e., the insulation film 5) having the silicon oxide film 5a, the silicon nitride film 5b over the silicon oxide film 5a, the silicon oxide film 5c over the silicon nitride film 5b, and the insulation film 5d over the silicon oxide film 5c.

The capacitive insulation film DE and the upper electrode UE are patterned as a lamination pattern, which is formed in such a manner as to cover at least a part of the lower electrode LE. Of the insulation film 5 forming the capacitive insulation film DE, the uppermost-layer insulation film 5d is in contact with the upper electrode UE. Further, in a region in which the lower electrode LE is covered with the lamination pattern of the capacitive insulation film DE and the upper electrode UE, the lowermost-layer silicon oxide film 5a of the insulation film 5 forming the capacitive insulation film DE is in contact with the lower electrode LE.

Further, the upper electrode UE in the capacitor formation region 1B is formed of a conductor film at the same layer as the memory gate electrode MG in the memory cell region 1A. Namely, the memory gate electrode MG and the upper electrode UE are both formed of the silicon film 6n. The silicon film 6n forming the memory gate electrode MG and the upper electrode UE has a low resistivity by including n type impurities introduced therein.

The memory gate electrode MG and the upper electrode UE are formed in the following manner. Over the main surface of the semiconductor substrate 1 including the memory cell region 1A and the capacitor formation region 1B, the silicon film 6n is formed in such a manner as to cover the control gate electrode CG and the lower electrode LE. Then, the silicon film 6n is anisotropically etched. The memory gate electrode MG is formed in the following manner. For the anisotropic etching, over the sidewall of the control gate electrode CG, the silicon film 6n is left in a sidewall spacer form via the insulation film 5. For this reason, the memory gate electrode MG is formed of the silicon film 6n left in a sidewall spacer form. On the other hand, the upper electrode UE is formed in the following manner. Before the anisotropic etching, over the silicon film 6n, a resist pattern (corresponding to a photoresist pattern RP1 described later) is formed. Under the resist pattern, the silicon film 6n is left. For this reason, the upper electrode UE is formed of the patterned silicon film 6n.

The lower electrode LE, the capacitive insulation film DE, and the upper electrode UE form the capacitive element (PIP type capacitive element) C1. The lower electrode LE functions as one electrode (first electrode) of the capacitive element C1. The upper electrode UE functions as the other electrode (second electrode) of the capacitive element C1. The capacitive insulation film DE functions as a dielectric film of the capacitive element C1. The sidewall insulation films SW are formed over the side surfaces of the upper electrode UE, and also over the side surfaces of the lower electrode LE in a region not covered with the lamination pattern of the capacitive insulation film DE and the upper electrode UE.

Incidentally, the lamination pattern of the capacitive insulation film DE and the upper electrode UE does not cover the entire surface of the lower electrode LE. In a different cross section from that of FIG. 1, a portion of the lower electrode LE is not covered with the lamination pattern of the capacitive insulation film DE and the upper electrode UE. This is in order to allow coupling between a portion of the lower electrode LE in a region not covered with the lamination pattern of the capacitive insulation film DE and the upper electrode UE and a plug PG described below.

The capacitive element C1 is a so-called PIP (Polysilicon Insulator Polysilicon) type capacitive element. Herein, the PIP type capacitive element is a capacitive element (polysilicon capacitive element) including two layers of polysilicon layers (herein, the lower electrode LE and the upper electrode UE), and an insulation film (herein, the capacitive insulation film DE) interposed therebetween.

Over the semiconductor substrate 1, an insulation film 12 is formed as an interlayer insulation film in such a manner as to cover the control gate electrode CG, the memory gate electrode MG, the lower electrode LE, the upper electrode UE, and the sidewall insulation films SW. The insulation film 12 includes a single film of a silicon oxide film, a lamination film of a silicon nitride film and a silicon oxide film formed thicker than the silicon nitride film over the silicon nitride film, or the like. As described later, in the insulation film 12, contact holes CNT are formed. In each contact hole CNT, a plug PG is embedded. Over a portion of the insulation film 12 including the plug PG embedded therein, a wire M1, and the like are formed, but are not shown in FIG. 1.

Figures 6, 7:
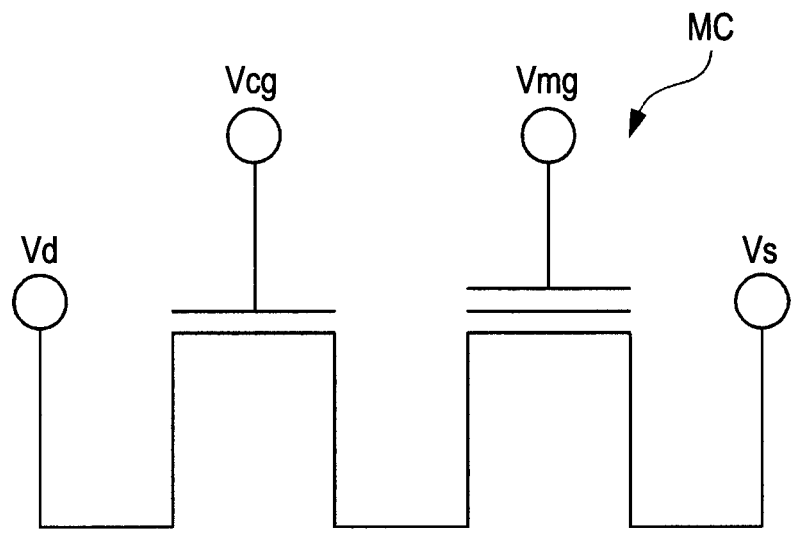
FIG. 6 is an equivalent circuit diagram of a memory cell.
FIG. 7 is a table showing one example of the conditions for application of voltages to respective sites of a selection memory cell for "write", "erase", and "read"

FIG. 6 is an equivalent circuit diagram of the memory cell MC. FIG. 7 is a table showing one example of the conditions for applying voltages to respective sites of a selection memory cell at the times of "write", "erase", and "read" of the present embodiment. In the table of FIG. 7, there are shown the voltage Vmg to be applied to the memory gate electrode MG, the voltage Vs to be applied to the source region (semiconductor region MS), the voltage Vcg to be applied to the control gate electrode CG, the voltage Vd to be applied to the drain region (semiconductor region MD), and the voltage Vb to be applied to the p type well PW of the memory cell (selection memory cell) as shown in FIGS. 1 and 2 at respective times of "write", "erase", and "read". Incidentally, the data shown in the table of FIG. 7 is one preferable example of the conditions for application of voltages, is not exclusive, and if required, may be variously changed. Further, in the present embodiment, injection of electrons into the silicon nitride film 5b which is the charge accumulation layer (charge accumulation part) in the insulation film 5 of the memory transistor is defined as "write", and injection of holes (positive holes) is defined as "erase".

For the write method, hot electron write called so-called SSI (Source Side Injection) method can be used. For example, the voltages as shown in the row of "write" of FIG. 7 are applied to respective sites of the selection memory cell for performing write. Thus, electrons are injected into the silicon nitride film 5b in the insulation film 5 of the selection memory cell. Hot electrons occur in the channel region (between source and drain) under between two gate electrodes (the memory gate electrode MG and the control gate electrode CG). The hot electrons are injected into the silicon nitride film 5b which is the charge accumulation layer (charge accumulation part) in the insulation film 5 under the memory gate electrode MG. The injected hot electrons (electrons) are trapped at the trap level in the silicon nitride film 5b in the insulation film 5. As a result, the threshold voltage of the memory transistor is increased.

For the erase method, a BTBT (Band-To-Band Tunneling) phenomenon hot hole injection erase method can be used. Namely, holes (positive holes) generated by BTBT (Band-To-Band Tunneling) phenomenon are injected into the charge accumulation part (the silicon nitride film 5b in the insulation film 5), thereby to perform erase. For example, the voltages as shown in the row of "erase" of FIG. 7 are applied to respective sites of the selection memory cell for performing erase. Thus, holes (positive holes) are generated by the BTBT (Band-To-Band Tunneling) phenomenon to accelerate the electric field. Thus, holes are injected into the silicon nitride film 5b in the insulation film 5 of the selection memory cell. As a result, the threshold voltage of the memory transistor is reduced.

For read, for example, the voltages as shown in the row of "read" of FIG. 7 are applied to respective sites of the selection memory cell for performing read. The voltage Vmg to be applied to the memory gate electrode MG for read is set at a value (0 V for FIG. 7) between the threshold voltage of the memory transistor in the write state and the threshold voltage of the memory transistor in the erase state. This enables discrimination between the write state and the erase state.

Then, a description will be given to a method for manufacturing a semiconductor device of the present embodiment.

Figure 8:
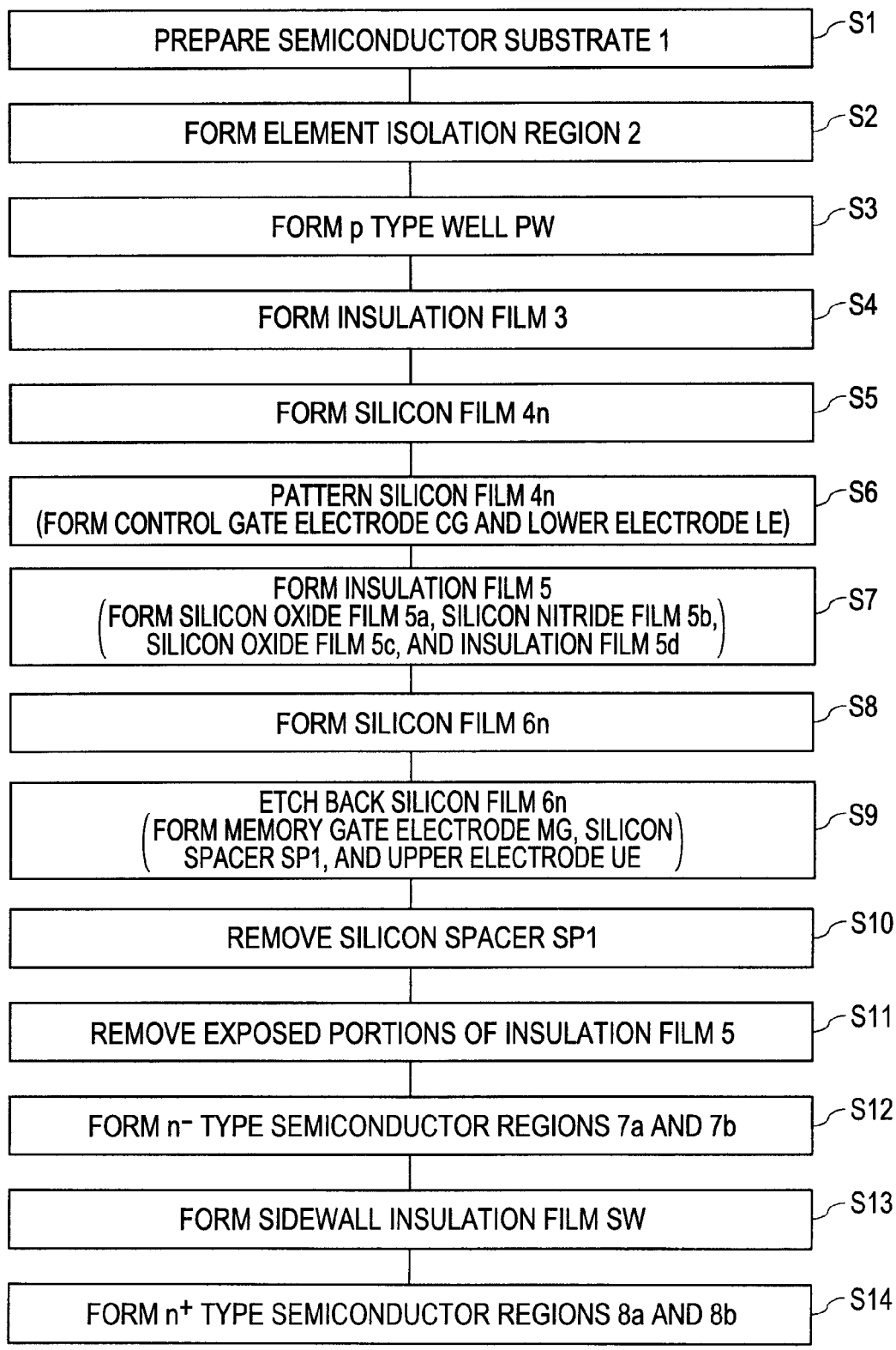
FIG. 8 is a process flowchart showing a part of manufacturing steps of the semiconductor device which is one embodiment of the present invention.

FIG. 8 is a process flowchart showing a part of manufacturing steps of the semiconductor device of the present embodiment. FIGS. 9 to 23 are each an essential part cross-sectional view of the semiconductor device during a manufacturing step of the present embodiment.

Figure 9:
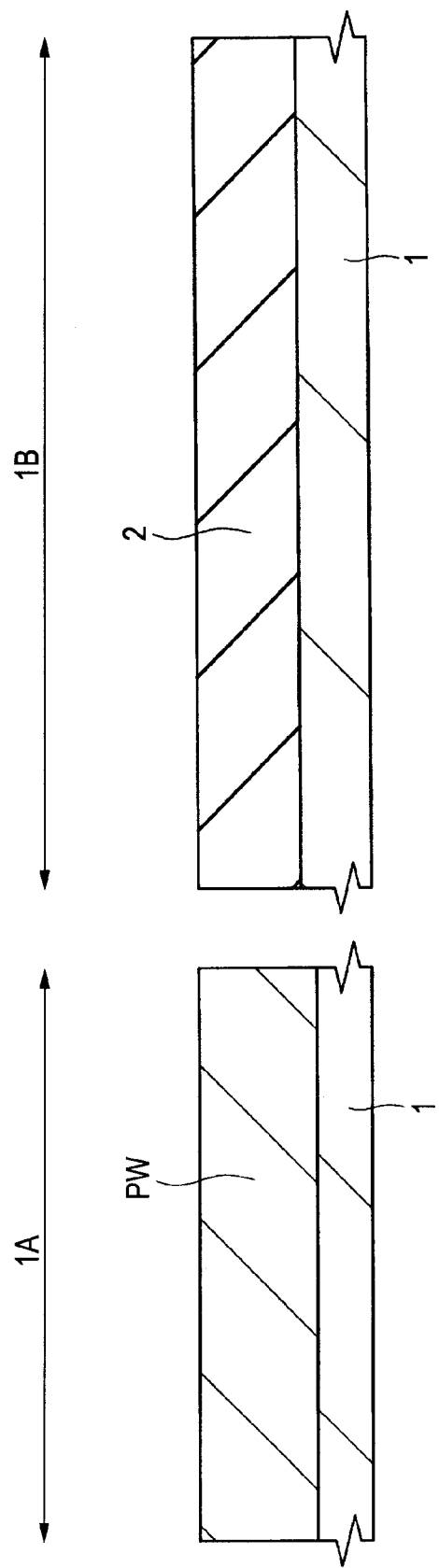
FIG. 9 is an essential part cross-sectional view of the semiconductor device during a manufacturing step of one embodiment of the present invention.

As shown in FIG. 9, first, a semiconductor substrate (semiconductor wafer) 1 including p type single-crystal silicon having a specific resistance of, for example, about 1 to 10 Ωcm, or the like is prepared (provided) (Step S1 of FIG. 8). Then, in the main surface of the semiconductor substrate 1, an element isolation region (element isolation insulation region) 2 defining (bordering) the active region is formed (Step S2 of FIG. 8). The element isolation region 2 includes an insulator such as silicon oxide, and can be formed by, for example, the STI (Shallow Trench Isolation) method or the LOCOS (Local Oxidization of Silicon) method. For example, in the main surface of the semiconductor substrate 1, grooves for element isolation are formed. Then, in the grooves for element isolation, an insulation film including, for example, silicon oxide is embedded. As a result, the element isolation region 2 can be formed. In the capacitor formation region 1B, in the entire main surface of the semiconductor substrate 1, the element isolation region 2 is formed.

Then, in the memory cell region 1A of the semiconductor substrate 1, a p type well PW is formed (Step S3 of FIG. 8). The p type well PW can be formed by ion-implanting p type impurities such as boron (B) into the semiconductor substrate 1, or by other methods. The p type well PW is formed from the main surface to a prescribed depth of the semiconductor substrate 1.

Then, in order to adjust the threshold voltage of the control transistor to be formed later in the memory cell region 1A, if required, the surface part (surface layer part) of the p type well PW of the memory cell region 1A is subjected to channel dope ion implantation.

Figure 10:
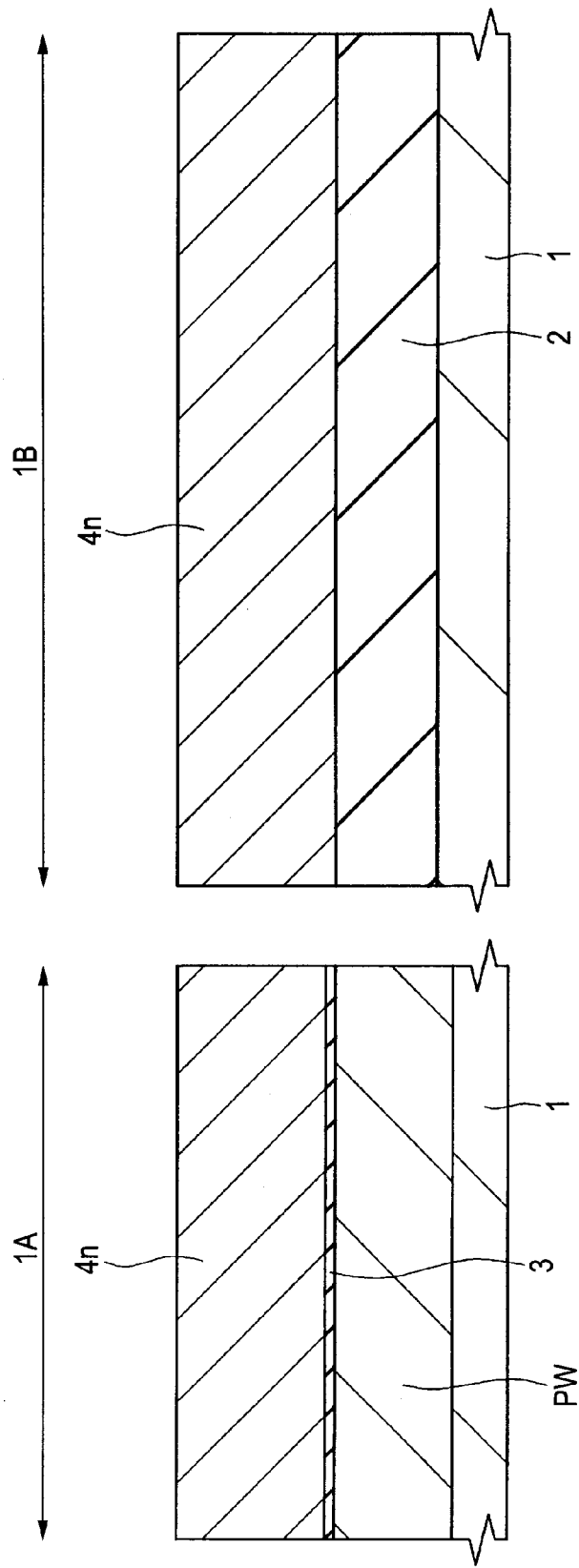
FIG. 10 is an essential part cross-sectional view of the semiconductor device during a manufacturing step following that of FIG. 9.

Then, by dilute hydrofluoric acid cleaning or the like, the surface of the semiconductor substrate 1 (p type well PW) is cleaned. Then, as shown in FIG. 10, over the main surface of the semiconductor substrate 1 (the surface of the p type well PW), the insulation film 3 for the gate insulation film is formed (Step S4 of FIG. 8). The insulation film 3 can be formed of, for example, a thin silicon oxide film or silicon oxynitride film. The film thickness (formed film thickness) of the insulation film 3 can be set at, for example, about 2 to 3 nm. When the insulation film 3 is formed with a thermal oxidation method, the insulation film 3 is not formed over the element isolation region 2.

Then, over the entire main surface of the semiconductor substrate 1, namely, over the insulation film 3 in the memory cell region 1A, and over the element isolation region 2 in the capacitor formation region 1B, as a conductive film (conductor film) both for forming the control gate electrode CG and for forming the lower electrode LE, the silicon film 4n is formed (deposited) (Step S5 of FIG. 8).

The silicon film 4n includes a polysilicon film, and can be formed by using a CVD (Chemical Vapor Deposition) method, or the like. The film thickness (deposited film thickness) of the silicon film 4n can be set at, for example, about 100 to 200 nm. The following procedure is also acceptable: during deposition, the silicon film 4n is formed as an amorphous silicon film; then, the subsequent heat treatment can make the amorphous silicon film into a polysilicon film.

The silicon film 4n has a low resistance by including n type impurities introduced therein. The introduction of n type impurities into the silicon film 4n may be performed during deposition of the silicon film 4n, or after deposition thereof. When n type impurities are introduced during deposition of the silicon film, by allowing the gas for depositing the silicon film 4n to contain a doping gas (gas for adding n type impurities), it is possible to deposit the n type impurities-introduced silicon film 4n. On the other hand, when n type impurities are introduced after deposition of the silicon film, impurities are not introduced intentionally. After deposition of the silicon film, n type impurities are introduced into the silicon film with an ion implantation method or the like. As a result, it is possible to form the n type impurities-introduced silicon film 4n. In any case, in the memory cell region 1A and the capacitor formation region 1B, the n type impurities-introduced silicon film 4n is formed.

Then, the silicon film 4n in the memory cell region 1A and the capacitor formation region 1B is patterned by etching (Step S6 of FIG. 8). The patterning step of Step S6 can be carried out, for example, in the following manner.

Namely, over the silicon film 4n, using a photolithography method, a photoresist pattern (although not shown herein, the photoresist pattern is formed in the control gate electrode CG forming region in the memory cell region 1A and in the lower electrode LE forming region in the capacitor formation region 1B) is formed. Using the photoresist pattern as an etching mask, the silicon film 4n is etched (dry etched) to be patterned. Then, the photoresist pattern is removed.

Figure 11:
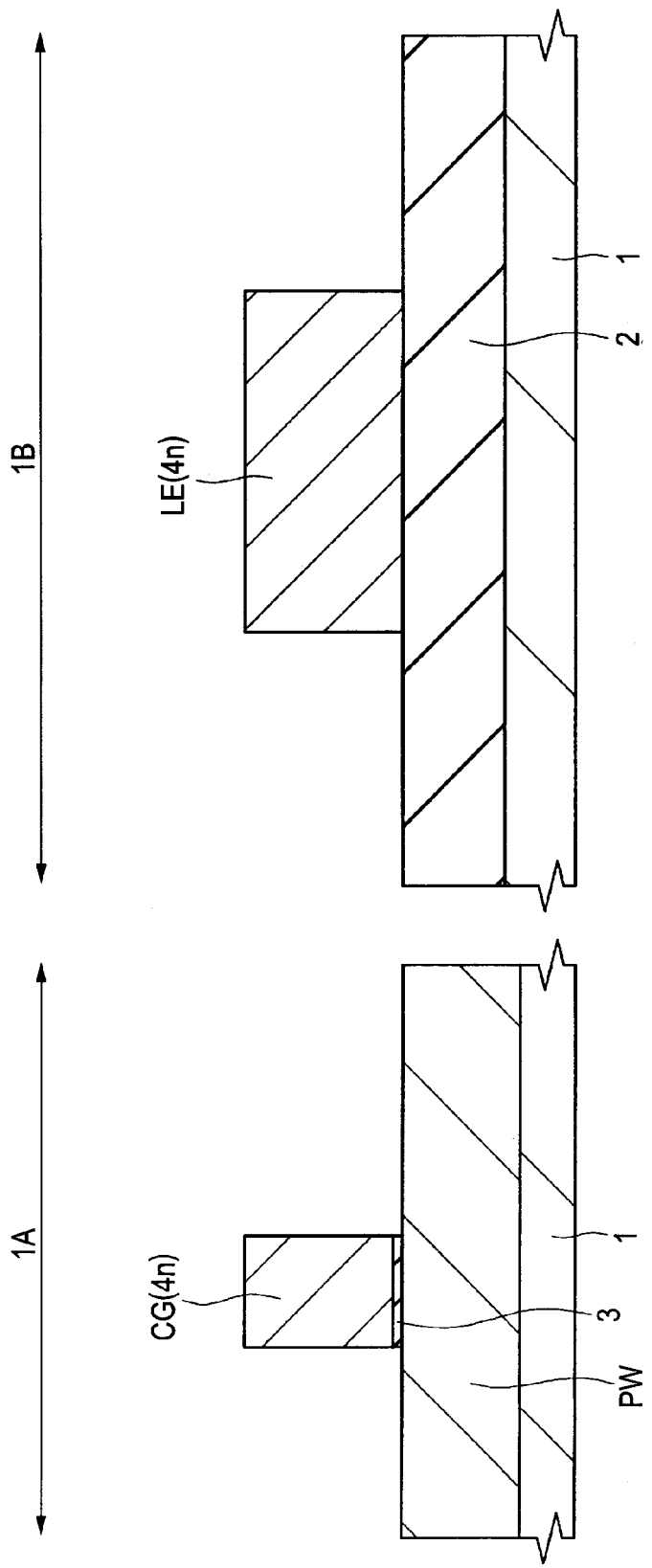
FIG. 11 is an essential part cross-sectional view of the semiconductor device during a manufacturing step following that of FIG. 10.

Thus, at Step S6, the silicon film 4n is patterned. As a result, as shown in FIG. 11, in the memory cell region 1A, the control gate electrode CG including the patterned silicon film 4n is formed. In the capacitor formation region 1B, the lower electrode LE including the patterned silicon film 4n is formed. The control gate electrode CG in the memory cell region 1A and the lower electrode LE in the capacitor formation region 1B include the same-layer silicon film 4n, but are separated from each other. Further, in the memory cell region 1A, a portion of the insulation film 3 left under the control gate electrode CG becomes the gate insulation film of the control transistor. Therefore, the control gate electrode CG including the silicon film 4n is formed over the semiconductor substrate 1 (p type well PW) via the insulation film 3 as the gate insulation film.

In the memory cell region 1A, portions of the insulation film 3 other than the portion thereof covered with the control gate electrode CG (i.e., portions of the insulation film 3 other than the portion thereof serving as the gate insulation film) may be removed by dry etching performed at the patterning step of Step S6, or performing wet etching after the dry etching.

Then, in order to adjust the threshold voltage of the memory transistor to be formed later in the memory cell region 1A, if required, the surface part (surface layer part) of the p type well PW in the memory cell region 1A is subjected to channel dope ion implantation.

Figure 12:
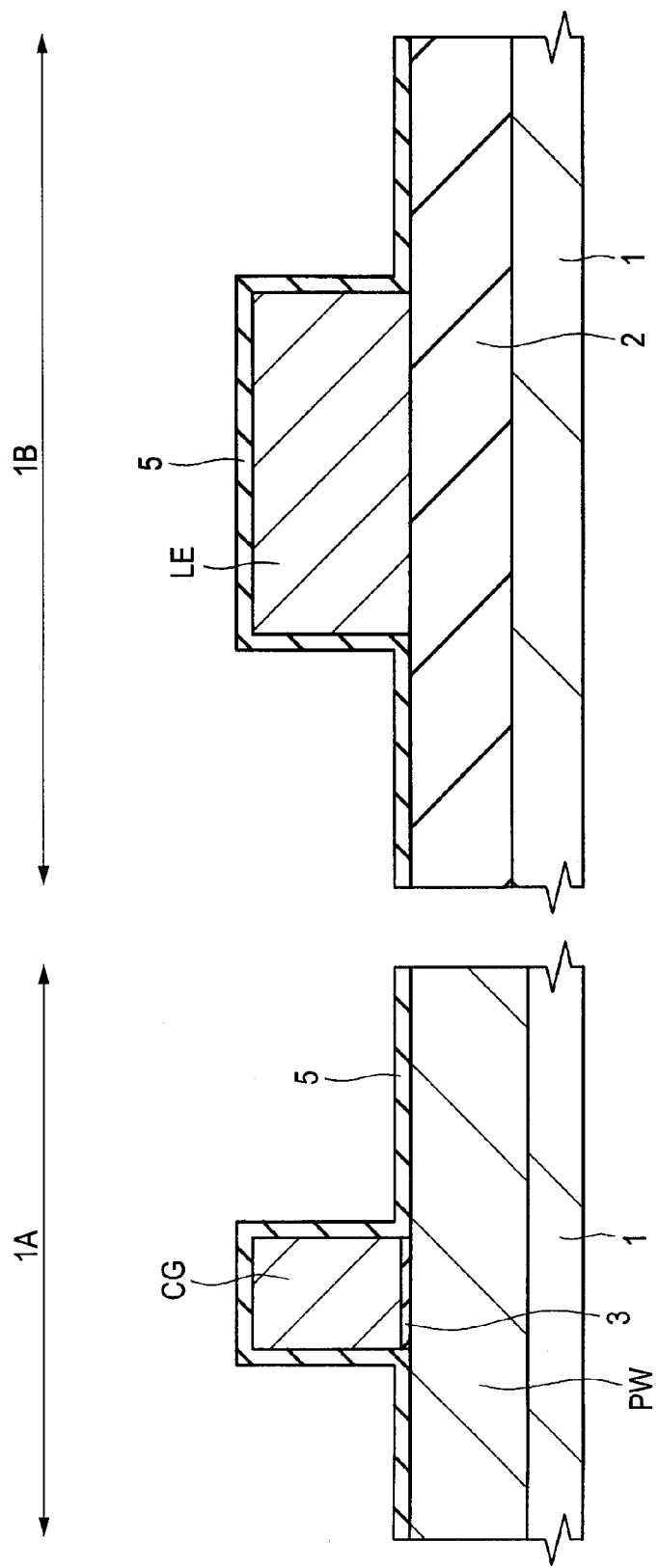
FIG. 12 is an essential part cross-sectional view of the semiconductor device during a manufacturing step following that of FIG. 11.
Figure 13:
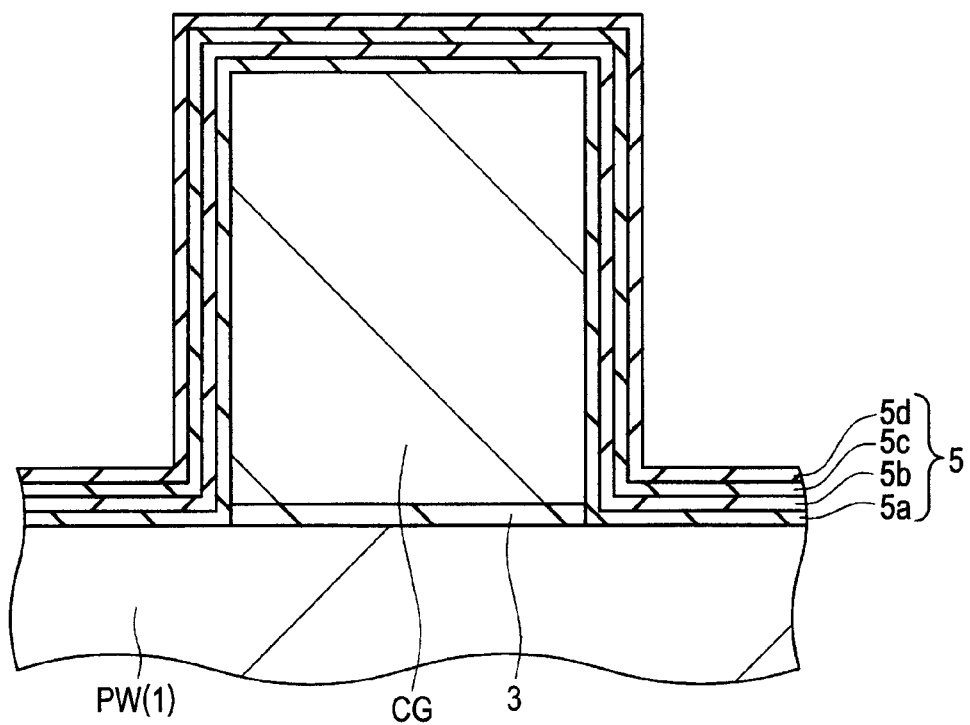
FIG. 13 is a partially enlarged cross-sectional view of a portion of FIG. 12 on an enlarged scale.
Figure 14:
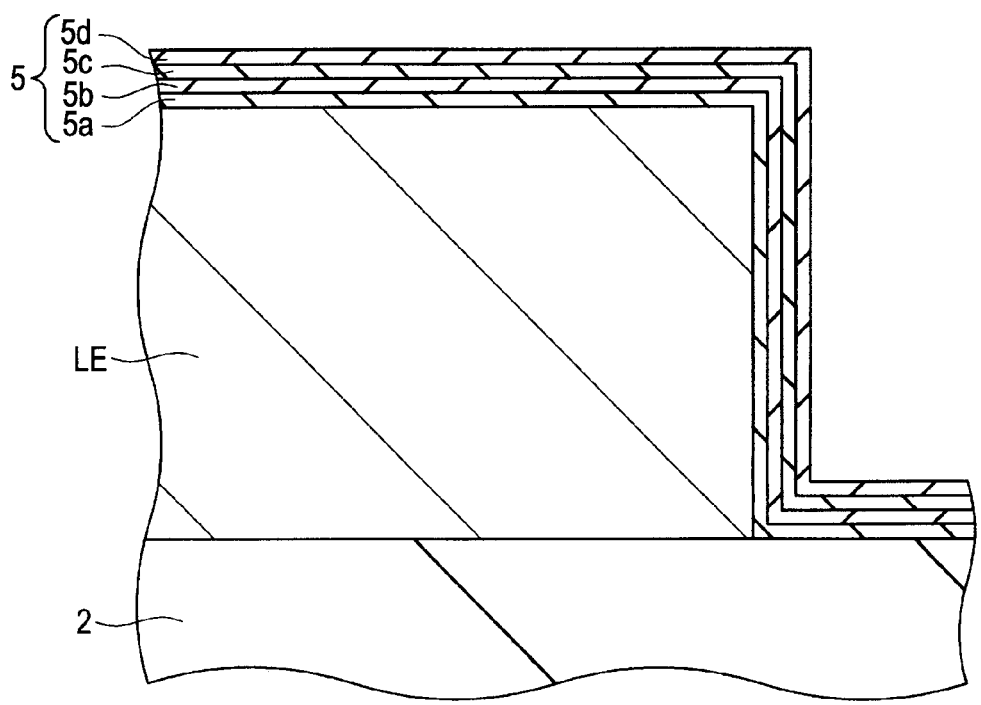
FIG. 14 is a partially enlarged cross-sectional view of a portion of FIG. 12 on an enlarged scale.

Then, a cleaning treatment is performed to subject the main surface of the semiconductor substrate 1 to a cleaning treatment. Then, as shown in FIG. 12, over the main surface of the semiconductor substrate 1, the surface (the top surface and the side surfaces) of the control gate electrode CG, and the surface (the top surface and the side surfaces) of the lower electrode LE, there is formed the insulation film 5 both for the gate insulation film of the memory transistor and for the capacitive insulation film of the capacitive element (Step S7 of FIG. 8). Incidentally, FIGS. 13 and 14 are partially enlarged cross-sectional views of a part of FIG. 12 on an enlarged scale. FIG. 13 shows a part of the memory cell region 1A on an enlarged scale. FIG. 14 shows a part of the capacitor formation region 1B on an enlarged scale.

The insulation film 5 is, as described above, an insulation film having, in the inside thereof, the charge accumulation part (charge accumulation layer), and includes a lamination film of the silicon oxide film 5a, the silicon nitride film 5b, the silicon oxide film 5c, and the insulation film 5d, sequentially formed from the bottom as insulation films. For ease of understanding of the drawing, in FIG. 12, the lamination film of the silicon oxide film 5a, the silicon nitride film 5b, the silicon oxide film 5c, and the insulation film 5d is shown simply as the insulation film 5. Therefore, in actuality, as shown in FIGS. 13 and 14, the insulation film 5 includes a lamination film of the silicon oxide film (oxide film) 5a, the silicon nitride film (nitride film) 5b over the silicon oxide film 5a, the silicon oxide film (oxide film) 5c over the silicon nitride film 5b, and the insulation film 5d over the silicon oxide film 5c. In Step S7, as shown in FIG. 12, the insulation film 5 is formed over the main surface (surface) of the semiconductor substrate 1 (including the p type well PW and the element isolation region 2), the surface (the side surfaces and the top surface) of the control gate electrode CG, and the surface (the side surfaces and the top surface) of the lower electrode LE (however, the insulation film 5 is not formed over the bottom of the control gate electrode CG and the bottom of the lower electrode LE). Further, in terms of the deposition step, in general, the insulation film 5 is also formed over the element isolation region 2. However, over the element isolation region 2, the insulation film 5 does not have to be formed.

Of the insulation film 5, the silicon oxide films 5a and 5c can be formed by, for example, an oxidation treatment (thermal oxidation treatment) or a CVD method, or a combination thereof. For the oxidation treatment (thermal oxidation treatment) in this step, ISSG (In Situ Steam Generation) oxidation may also be used. Of the insulation film 5, the silicon nitride film 5b can be formed by, for example, a CVD method. Of the insulation film 5, the insulation film 5d can be formed using a sputtering method, an ALD (Atomic Layer Deposition) method, a CVD method, or the like.

Further, in the present embodiment, as an insulation film (charge accumulation layer) having a trap level, the silicon nitride film 5b is formed. However, in terms of the reliability and the like, a silicon nitride film is preferable, but the silicon nitride film is not exclusive. A high-k film having a higher dielectric constant than that of a silicon nitride film such as an aluminum oxide film (alumina), a hafnium oxide film, or a tantalum oxide film can also be used as a charge accumulation layer (charge accumulation part). Further, the charge accumulation layer (charge accumulation part) can also be formed of silicon nanodots.

For example, first, over the surface of the semiconductor substrate 1 (p type well PW), over the surface (the side surfaces and the top surface) of the control gate electrode CG, and over the surface (the side surfaces and the top surface) of the lower electrode LE, the silicon oxide film 5a is formed by a thermal oxidation method (preferably ISSG oxidation). Then, over the silicon oxide film 5a, the silicon nitride film 5b is deposited by a CVD method. Further, over the silicon nitride film 5b, the silicon oxide film 5c is formed by a CVD method or thermal oxidation, or both thereof. Then, over the silicon oxide film 5c, the insulation film 5d is formed by a sputtering method, an ALD method, or a CVD method. As a result, it is possible to form the insulation film 5 including a lamination film of the silicon oxide film 5a, the silicon nitride film 5b, the silicon oxide film 5c, and the insulation film 5d.

The thickness of the silicon oxide film 5a can be preferably set at about 2 to 5 nm. The thickness of the silicon nitride film 5b can be preferably set at about 5 to 15 nm. The thickness of the silicon oxide film 5c can be preferably set at about 4 to 10 nm. The thickness of the insulation film 5d can be preferably set at about 0.5 to 2 nm.

The insulation film 5 formed in the memory cell region 1A functions as the gate insulation film of the memory gate electrode MG formed later, and has a charge holding (charge accumulation) function. Whereas, the insulation film 5 formed in the capacitor formation region 1B functions as the capacitive insulation film (dielectric film) of the capacitive element C1.

The insulation film 5 is required to have a charge holding function, and hence has a structure in which the charge accumulation layer (herein, the silicon nitride film 5b) is interposed between charge blocking layers (herein, the silicon oxide films 5a and 5c). As compared with the potential barrier height of the charge accumulation layer (herein, the silicon nitride film 5b), the potential barrier height of the charge blocking layers (herein, the silicon oxide films 5a and 5c) is higher. Then, in the present embodiment, the insulation film 5 has the following structure: the charge accumulation layer (herein, the silicon nitride film 5b) is interposed between charge blocking layers (herein, the silicon oxide films 5a and 5c); to this structure, the insulation film 5d capable of causing Fermi level pinning, and having a high dielectric constant is further added as the uppermost layer.

Then, as shown in FIG. 15, over the entire main surface of the semiconductor substrate 1, namely, over the insulation film 5, in the memory cell region 1A, in such a manner as to cover the control gate electrode CG, and in the capacitor formation region 1B, in such a manner as to cover the lower electrode LE, a silicon film 6n is formed (deposited) (Step S8 of FIG. 8). The silicon film 6n is a conductor film both for forming the memory gate electrode MG and for forming the upper electrode UE. Incidentally, also in FIG. 15, and subsequent FIGS. 16 to 23, as with FIG. 12, for ease of understanding of the drawings, the lamination film of the silicon oxide film 5a, the silicon nitride film 5b, the silicon oxide film 5c, and the insulation film 5d is shown simply as the insulation film 5.

The silicon film 6n includes a polysilicon film, and can be formed by using a CVD method or the like. The film thickness (deposited film thickness) of the n type silicon film 6n can be set at, for example, about 30 to 150 nm. The following procedure is also possible: during deposition, the silicon film 6n is formed as an amorphous silicon film; then, the subsequent heat treatment makes the amorphous silicon film into a polysilicon film.

The silicon film 6n has a low resistance by including n type impurities introduced therein. The introduction of n type impurities into the silicon film 6n can be performed by ion implantation after deposition of the silicon film 6n. However, it is more preferable that n type impurities are introduced into the silicon film 6n during deposition of the silicon film 6n. When n type impurities are introduced during deposition of the silicon film 6n, by allowing the gas for depositing the silicon film 6n to contain a doping gas (gas for adding n type impurities), it is possible to deposit the n type impurities-introduced silicon film 6n. In any case, in the memory cell region 1A and the capacitor formation region 1B, the n type impurities-introduced silicon film 6n is formed.

Then, using a photolithography method, over the silicon film 6n in the upper electrode UE forming region in the capacitor formation region 1B, a photoresist pattern RP1 is formed.

Figure 16:
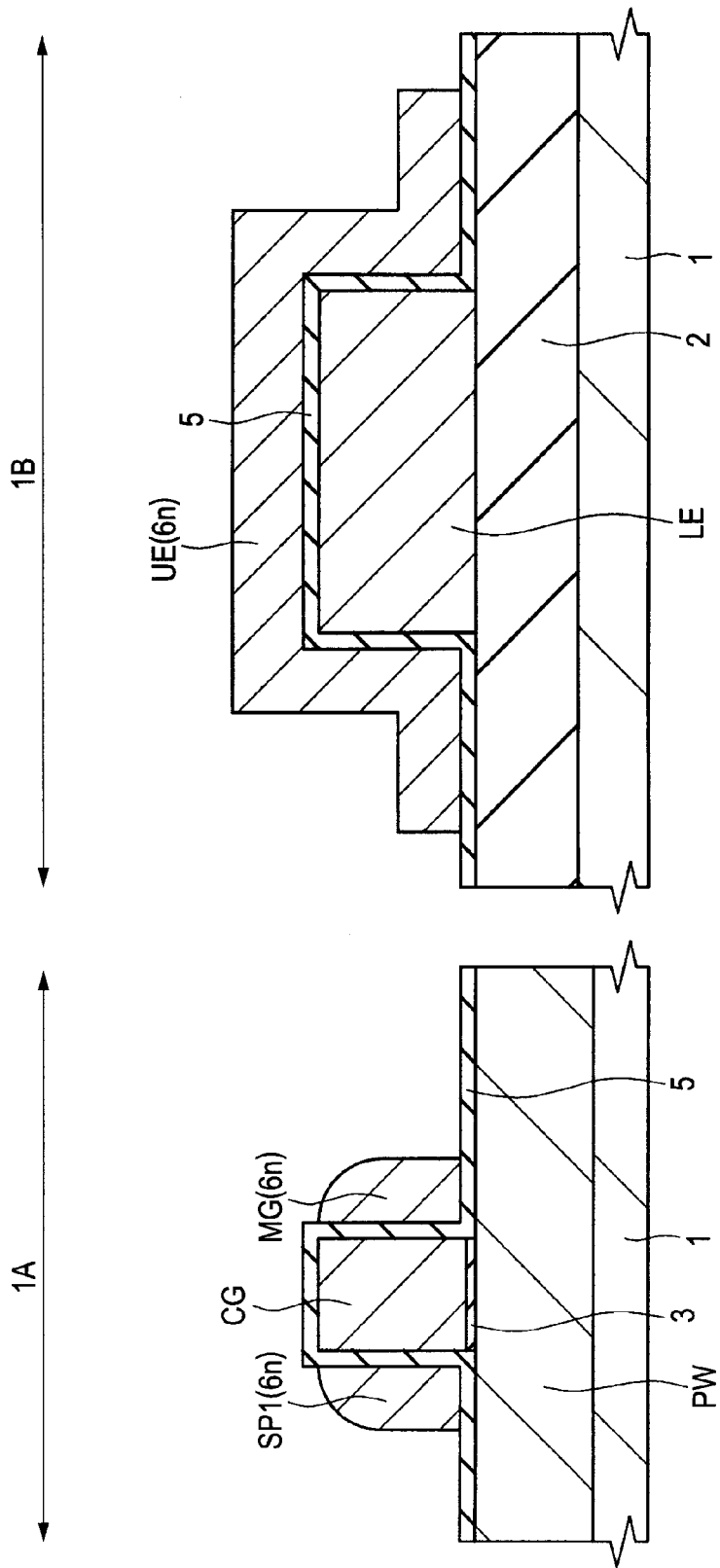
FIG. 16 is an essential part cross-sectional view of the semiconductor device during a manufacturing step following that of FIG. 15.

Then, by an anisotropic etching technology, the silicon film 6n is etched back (etched, dry etched, or anisotropically etched) (step S9 of FIG. 8). After the etching back step of Step S9, the photoresist pattern RP1 is removed. FIG. 16 shows this stage.

In the etching back step of Step S9, the silicon film 6n is anisotropically etched (etched back) by the deposited film thickness of the silicon film 6n. As a result, over both the sidewalls of the control gate electrode CG (via the insulation film 5), the silicon film 6n is left in a sidewall spacer form, and portions of the silicon film 6n are left under the photoresist pattern RP1. Whereas, portions of the silicon film 6n in other regions are removed. As a result, as shown in FIG. 16, in the memory cell region 1A, a portion of the silicon film 6n left in a sidewall spacer form via the insulation film 5 over one sidewall of opposite sidewalls of the control gate electrode CG, forms the memory gate electrode MG. Whereas, a portion of the silicon film 6n left in a sidewall spacer form via the insulation film 5 over the other sidewall forms a silicon spacer SP1. The silicon spacer SP1 can also be regarded as a sidewall spacer including a conductor, i.e., a conductor spacer. The memory gate electrode MG and the silicon spacer PS1 are formed over the sidewalls on the mutually opposing sides of the control gate electrode CG, respectively, and have an almost symmetric structure with the control gate electrode CG sandwiched therebetween. Further, in the capacitor formation region 1B, a portion of the silicon film 6n left without being etched under the photoresist pattern RP1 functioning as an etching mask, forms the upper electrode UE.

Further, although not shown, in the forming region of a contact hole to be coupled with the memory gate electrode MG later, the etching back step of Step S9 is performed with this region previously covered with a photoresist pattern (a photoresist pattern at the same layer as the photoresist pattern RP1). As a result, the silicon film 6n is left without being etched.

At the stage of performing the etching back step of Step S9, portions of the insulation film 5 in a region not covered with the memory gate electrode MG, the silicon spacer SP1, and the upper electrode UE are exposed. The portion of the insulation film 5 under the memory gate electrode MG in the memory cell region 1A becomes the gate insulation film of the memory transistor. The deposited film thickness of the silicon film 6n determines the memory gate length (gate length of the memory gate electrode MG). Therefore, by adjusting the deposited film thickness of the silicon film 6n deposited in Step S8, it is possible to adjust the memory gate length.

Figure 17:
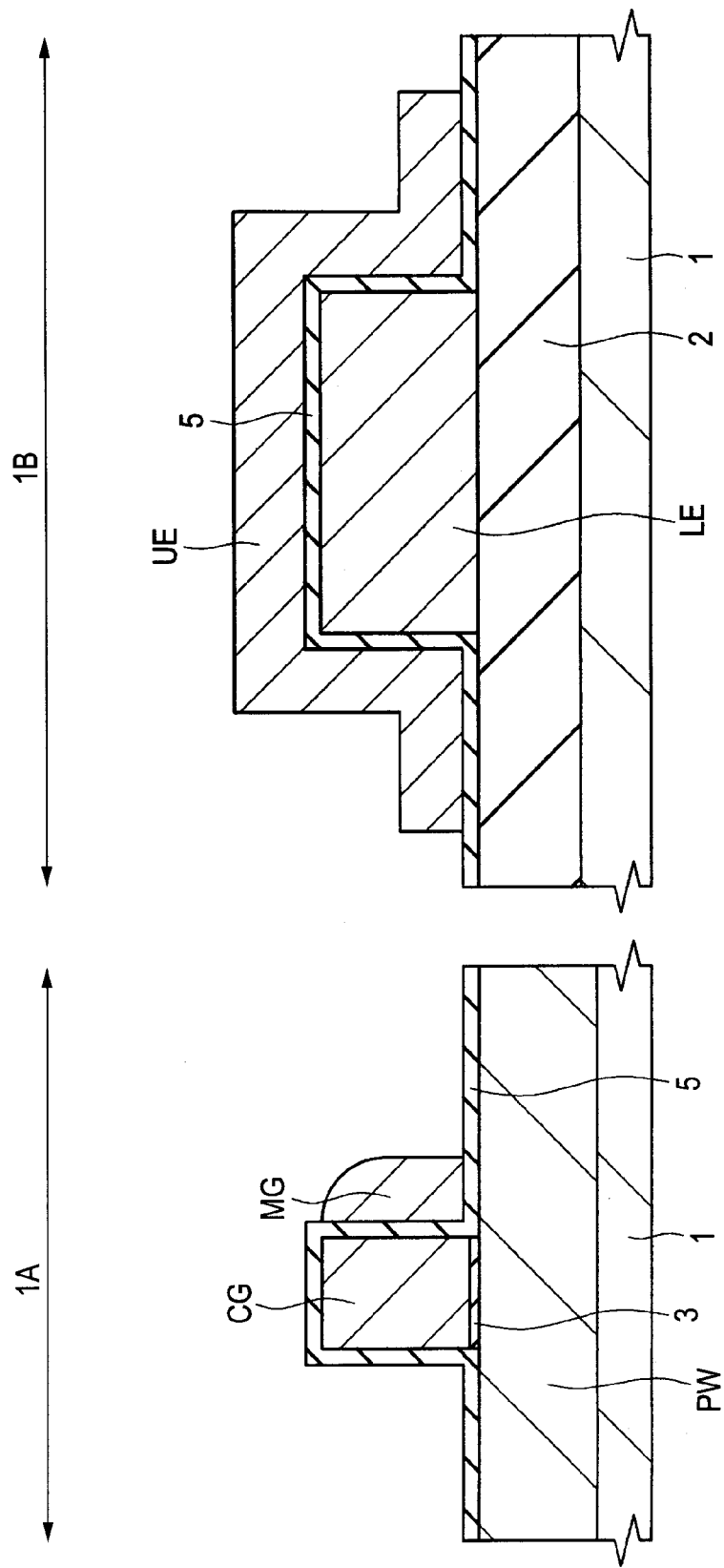
FIG. 17 is an essential part cross-sectional view of the semiconductor device during a manufacturing step following that of FIG. 16.

Then, by using the photolithography technology, such a photoresist pattern (not shown) that the memory gate electrode MG and the upper electrode UE are covered, and that the polysilicon spacer SP1 is exposed is formed over the semiconductor substrate 1. Then, by dry etching using the photoresist pattern as an etching mask, the silicon spacer SP1 is removed (Step S10 of FIG. 8). Then, the photoresist pattern is removed. By the etching step of Step S10, as shown in FIG. 17, the silicon spacer SP1 is removed. However, the memory gate electrode MG and the upper electrode UE have been covered with the photoresist pattern, and hence have been left without being etched.

Figure 18:
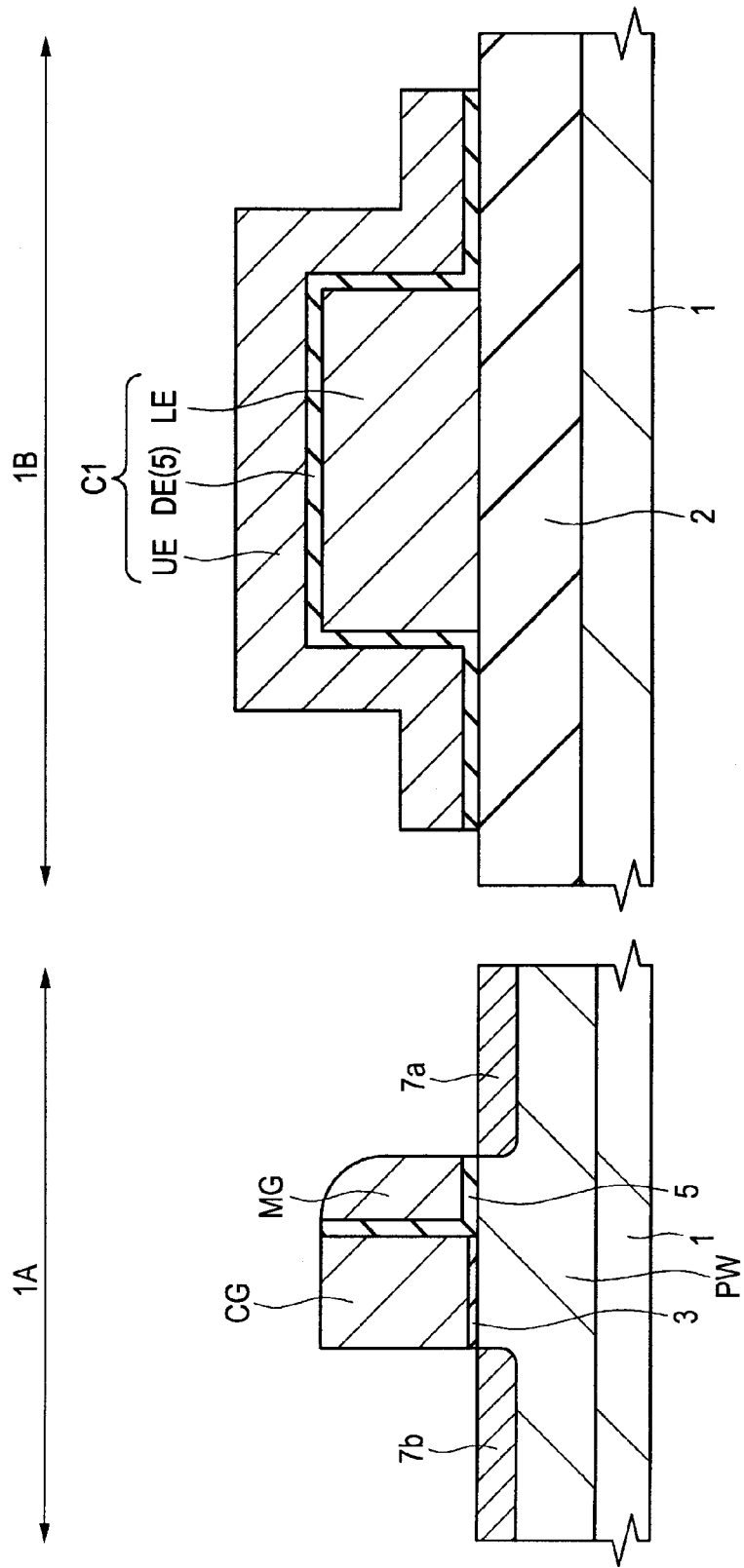
FIG. 18 is an essential part cross-sectional view of the semiconductor device during a manufacturing step following that of FIG. 17.

Then, as shown in FIG. 18, the exposed portions of the insulation film 5 not covered with the memory gate electrode MG and the upper electrode UE are removed by etching (e.g., wet etching) (Step S11 of FIG. 8). At this step, in the memory cell region 1A, the portion of the insulation film 5 situated under the memory gate electrode MG, and between the memory gate electrode MG and the control gate electrode CG is not removed, and is left. In the capacitor formation region 1B, the portion of the insulation film 5 situated under the upper electrode UE is not removed, and is left. The portions of the insulation film 5 in other regions are removed. In the capacitor formation region 1B, the portion of the insulation film 5 left under the upper electrode UE becomes a capacitive insulation film DE of the capacitive element C1.

Then, using the ion implantation method, or the like, n type impurities such as arsenic (As) or phosphorus (P) are introduced (doped) into the semiconductor substrate 1 (p type well PW) using the control gate electrode CG and the memory gate electrode MG as ion implantation inhibiting masks. As a result, n$^-$ type semiconductor regions (impurity diffusion layers) 7a and 7b are formed (Step S12 of FIG. 8).

At this step, the n$^-$ type semiconductor region 7a is formed in self-alignment with the sidewall of the memory gate electrode MG (the sidewall on the side thereof opposite to the side adjacent to the control gate electrode CG via the insulation film 5) in the memory cell region 1A. The n$^-$ type semiconductor region 7b is formed in self-alignment with the sidewall of the control gate electrode CG (the side wall on the side thereof opposite to the side adjacent to the memory gate electrode MG via the insulation film 5) in the memory cell region 1A. The n$^-$ type semiconductor region 7a and the n$^-$ type semiconductor region 7b can each function as a part of source/drain region of the memory cell formed in the memory cell region 1A. The n$^-$ type semiconductor region 7a and the n$^-$ type semiconductor region 7b can be formed by the same ion implantation step, but can also be formed by different ion implantation steps.

Figure 19:
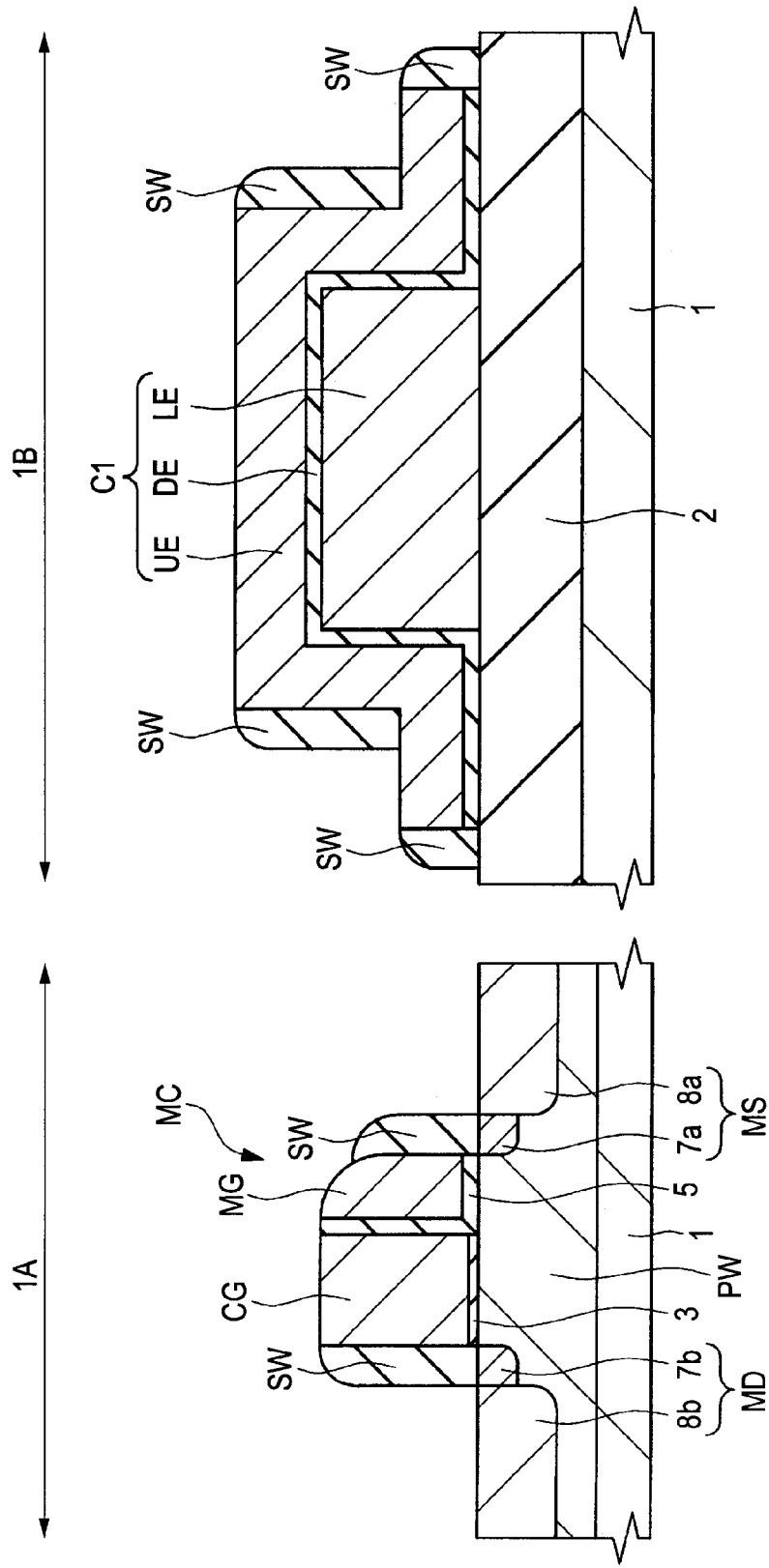
FIG. 19 is an essential part cross-sectional view of the semiconductor device during a manufacturing step following that of FIG. 18.

Then, as shown in FIG. 19, over the sidewalls of the control gate electrode CG and the memory gate electrode MG (the sidewalls on the sides opposite to the sides adjacent to each other via the insulation film 5), the sidewall insulation films (sidewalls or sidewall spacers) SW including an insulator such as silicon oxide are formed (Step S13 of FIG. 8). For example, over the entire main surface of the semiconductor substrate 1, an insulation film such as a silicon oxide film is deposited. The insulation film is anisotropically etched (etched back). Thus, the insulation film is selectively left over the sidewalls of the control gate electrode CG and the memory gate electrode MG. As a result, the sidewall insulation films SW can be formed. As shown in FIG. 19, the sidewall insulation films SW can also be formed over the sidewalls (side surfaces) of the upper electrode UE.

Then, using the ion implantation method or the like, n type impurities such as arsenic (As) or phosphorus (P) are introduced (doped) into the semiconductor substrate 1 (p type well PW) using the control gate electrode CG and the memory gate electrode MG, and the sidewall insulation films SW over the sidewalls thereof as ion implantation inhibiting masks. As a result, n$^+$ type semiconductor regions (impurity diffusion layers) 8a and 8b with a high impurity concentration are formed (Step S14 of FIG. 8).

At this step, the n$^+$ type semiconductor region 8a is formed in self-alignment with the sidewall insulation film SW over the sidewall of the memory gate electrode MG in the memory cell region 1A. The n$^+$ type semiconductor region 8b is formed in self-alignment with the sidewall insulation film SW over the sidewall of the control gate electrode CG in the memory cell region 1A. As a result, a LDD (lightly doped drain) structure is formed. The n$^+$ type semiconductor region 8a and the n$^+$ type semiconductor region 8b can be formed by the same ion implantation step, but can also be formed by different ion implantation steps.

Thus, the n$^-$ type semiconductor region 7a, and the n$^+$ type semiconductor region 8a having a higher impurity concentration than that of the region 7a form the n type semiconductor region MS functioning as the source region of the memory transistor. The n$^-$ type semiconductor region 7b, and the n$^+$ type semiconductor region 8b having a higher impurity concentration than that of the region 7b form the n type semiconductor region MD functioning as the drain region of the selection transistor.

Thus, in the memory cell region 1A, the memory cell MC of a nonvolatile memory is formed.

Then, if required, etching (wet etching using, for example, dilute hydrofluoric acid) is performed. Thus, the top surfaces (surfaces of) the n$^+$ type semiconductor regions 8a and 8b, the top surface of the control gate electrode CG, and the top surface of the memory gate electrode MG (the portion thereof not covered with the sidewall insulation film SW), and the top surface of the upper electrode UE (the portion thereof not covered with the sidewall insulation film SW) are purified (exposed). Etching at this step can be light etching of such a degree as to remove the natural oxide film.

Figure 20:
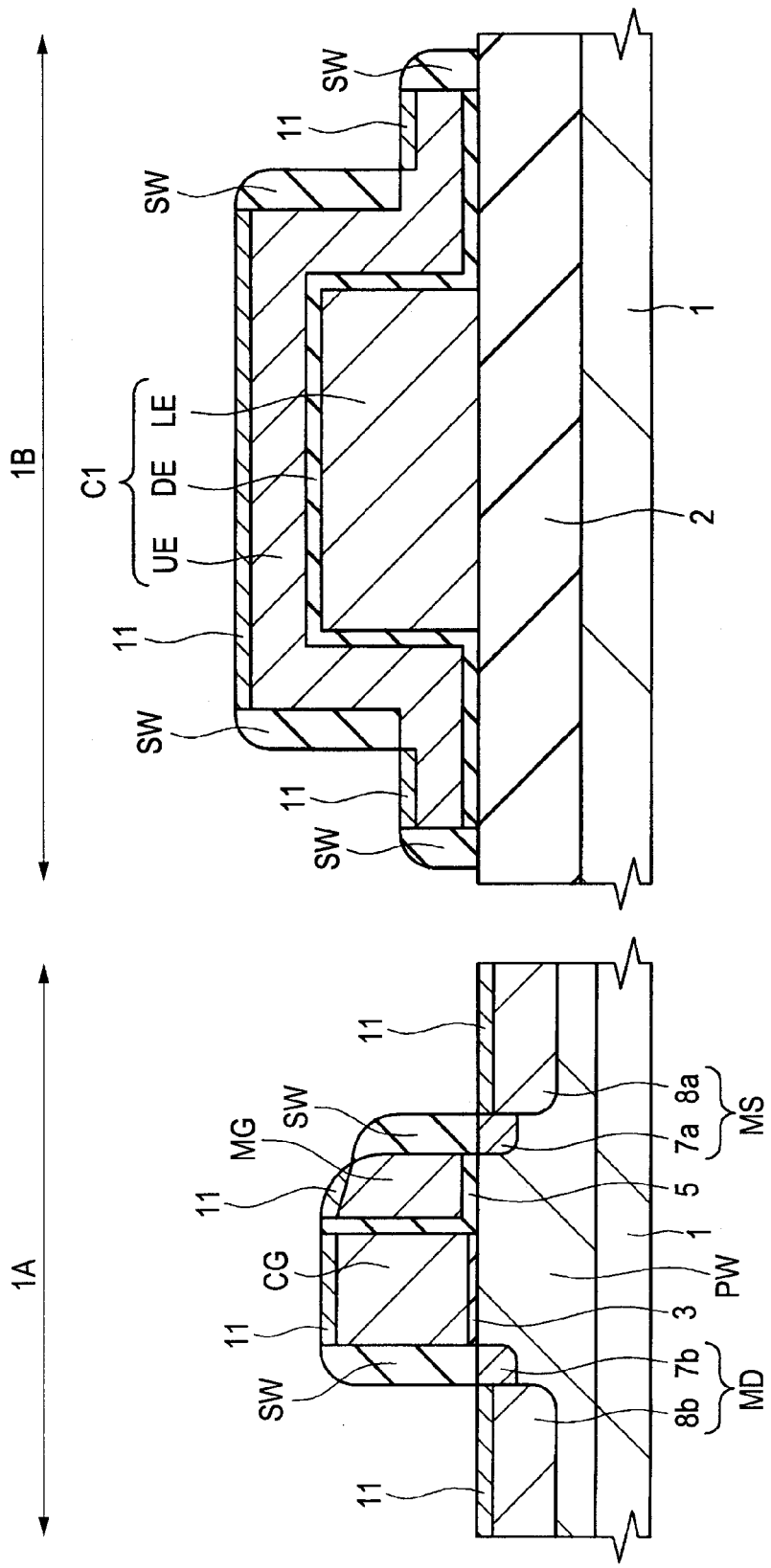
FIG. 20 is an essential part cross-sectional view of the semiconductor device during a manufacturing step following that of FIG. 19.

Then, using a salicide technology, as shown in FIG. 20, at the tops (the top surfaces, surfaces, or top layer parts) of the control gate electrode CG, the memory gate electrode MG, the n$^+$ type semiconductor regions 8a and 8b, and the upper electrode UE, metal silicide layers (metal silicide films) 11 are formed, respectively. By forming the metal silicide layers 11, it is possible to lower the diffusion resistance and the contact resistance, and the like. The metal silicide layers 11 can be formed in the following manner.

First, over the entire main surface of the semiconductor substrate 1 including over the top surfaces (surfaces of) the control gate electrode CG, the memory gate electrode MG, the upper electrode UE, and the n$^+$ type semiconductor regions 8a and 8b, a metal film (not shown) is formed (deposited) in such a manner as to cover the control gate electrode CG, the memory gate electrode MG, the upper electrode UE, and the sidewall insulation films SW. The metal film includes, for example, a cobalt (Co) film or a nickel (Ni) film, and can be formed by using a sputtering method or the like. Then, the semiconductor substrate 1 is subjected to a heat treatment. Accordingly, the top layer portions (surface layer portions) of the control gate electrode CG, the memory gate electrode MG, the upper electrode UE, and the n$^+$ type semiconductor regions 8a and 8b are allowed to react with the metal film. As a result, at the tops (the top surfaces, surfaces, or top layer parts) of the control gate electrode CG, the memory gate electrode MG, the upper electrode UE, and the n$^+$ type semiconductor regions 8a and 8b, metal silicide layers 11 are formed, respectively. The metal silicide layer 11 can be, for example, a cobalt silicide layer (when the metal film is a cobalt film) or a nickel silicide layer (when the metal film is a nickel film). Then, the unreacted portions of the metal film are removed. FIG. 20 shows a cross-sectional view at this stage. Further, although not shown in the cross-sectional view of FIG. 20, in a region of the top surface of the lower electrode LE not covered with the lamination pattern of the upper electrode UE and the capacitive insulation film DE, the metal silicide layer 11 can be formed.

Figure 21:
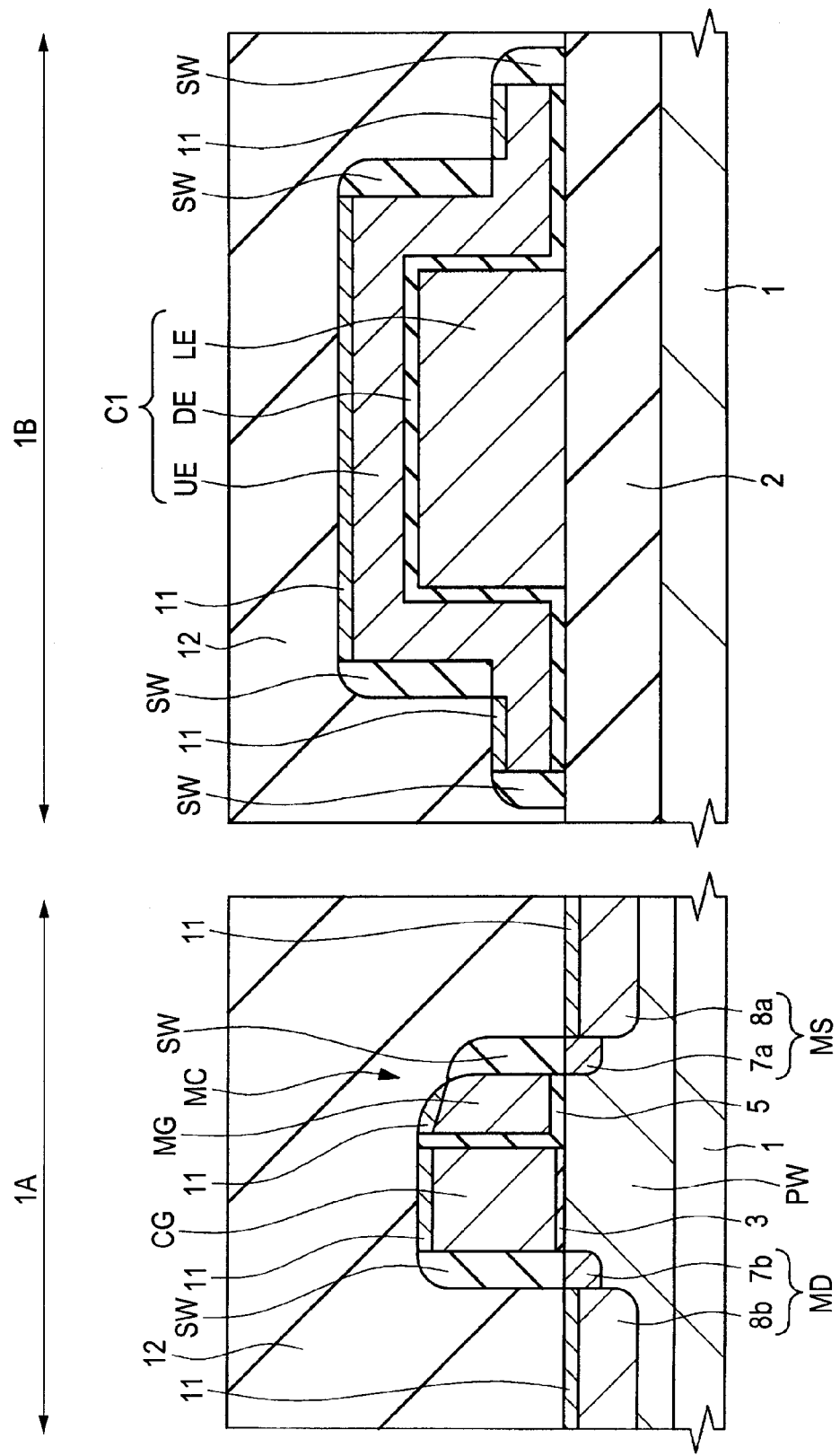
FIG. 21 is an essential part cross-sectional view of the semiconductor device during a manufacturing step following that of FIG. 20.

Then, as shown in FIG. 21, over the entire main surface of the semiconductor substrate 1, an insulation film (interlayer insulation film) 12 is formed (deposited) as an interlayer insulation film in such a manner as to cover the control gate electrode CG, the memory gate electrode MG, the lower electrode LE, the upper electrode UE, and the sidewall insulation films SW. The insulation film 12 includes a single film of a silicon oxide film, a lamination film of a silicon nitride film and a silicon oxide film formed thicker than the silicon nitride film over the silicon nitride film, or the like, and can be formed using, for example, a CVD method. After formation of the insulation film 12, using a CMP (Chemical Mechanical Polishing) method, or the like, the top surface of the insulation film 12 is planarized.

Figure 22:
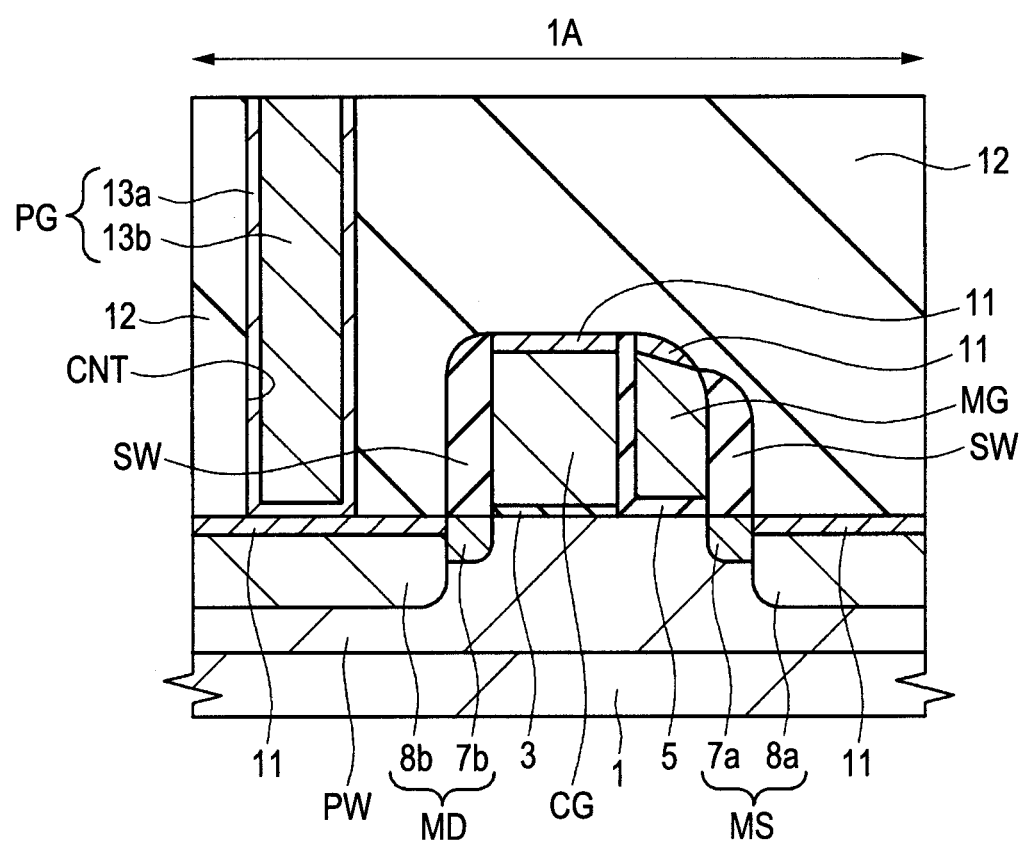
FIG. 22 is an essential part cross-sectional view of the semiconductor device during a manufacturing step following that of FIG. 21.

Then, using a photolithography method, with a photoresist pattern (not shown) formed over the insulation film 12 as an etching mask, the insulation film 12 is dry etched. As a result, as shown in FIG. 22, in the insulation film 12, a contact hole (opening or through hole) CNT is formed. Incidentally, in FIG. 22 and FIG. 23 described later, the memory cell region 1A is shown, but the capacitor formation region 1B is not shown.

Then, in each contact hole CNT, a conductive plug PG including tungsten (W) or the like is formed as a conductor part (conductor part for coupling).

In order to form the plug PG, the following procedure is performed. For example, over the insulation film 12 including the inside (over the bottom and the sidewall) of the contact hole CNT, a barrier conductor film 13a is formed. The barrier conductor film 13a can be, for example, a titanium film, a titanium nitride film, or a lamination film thereof. Then, over the barrier conductor film 13a, a main conductor film 13b including a tungsten film or the like is formed in such a manner as to fill the contact hole CNT. The unnecessary portions of the main conductor film 13b and the barrier conductor film 13a over the insulation film 12 are removed by a CMP method, an etching back method, or the like. As a result, the plug PG can be formed.

The contact holes CNT and the plugs PG embedded therein are formed in the tops of the n$^+$ type semiconductor regions 8a and 8b, the control gate electrode CG, the memory gate electrode MG, the lower electrode LE, and the upper electrode UE, and the like. At the bottoms of the contact holes CNT, there are exposed portions of the main surface of the semiconductor substrate 1 such as portions of (the metal silicide layers 11 over the surfaces of) the n$^+$ type semiconductor regions 8a and 8b, a portion of (the metal silicide layer 11 over the surface of) the control gate electrode CG, a portion of (the metal silicide layer 11 over the surface of) the memory gate electrode MG, a portion of (the metal silicide layer 11 over the surface of) the lower electrode LE, and a portion of (the metal silicide layer 11 over the surface of) the upper electrode UE. Incidentally, in FIG. 22, there is shown a cross section in which a portion of (the metal silicide layer 11 over the surface of) the n$^+$ type semiconductor region 8b is exposed at the bottom of the contact hole CNT, and is electrically coupled with the plug PG filling the contact hole CNT.

Then, over the insulation film 12 including the plug PG embedded therein, a wire (wiring layer) M1 is formed. The case where the wire M1 is formed using a damascene technology (herein, a single damascene technology) will be described.

Figure 23:
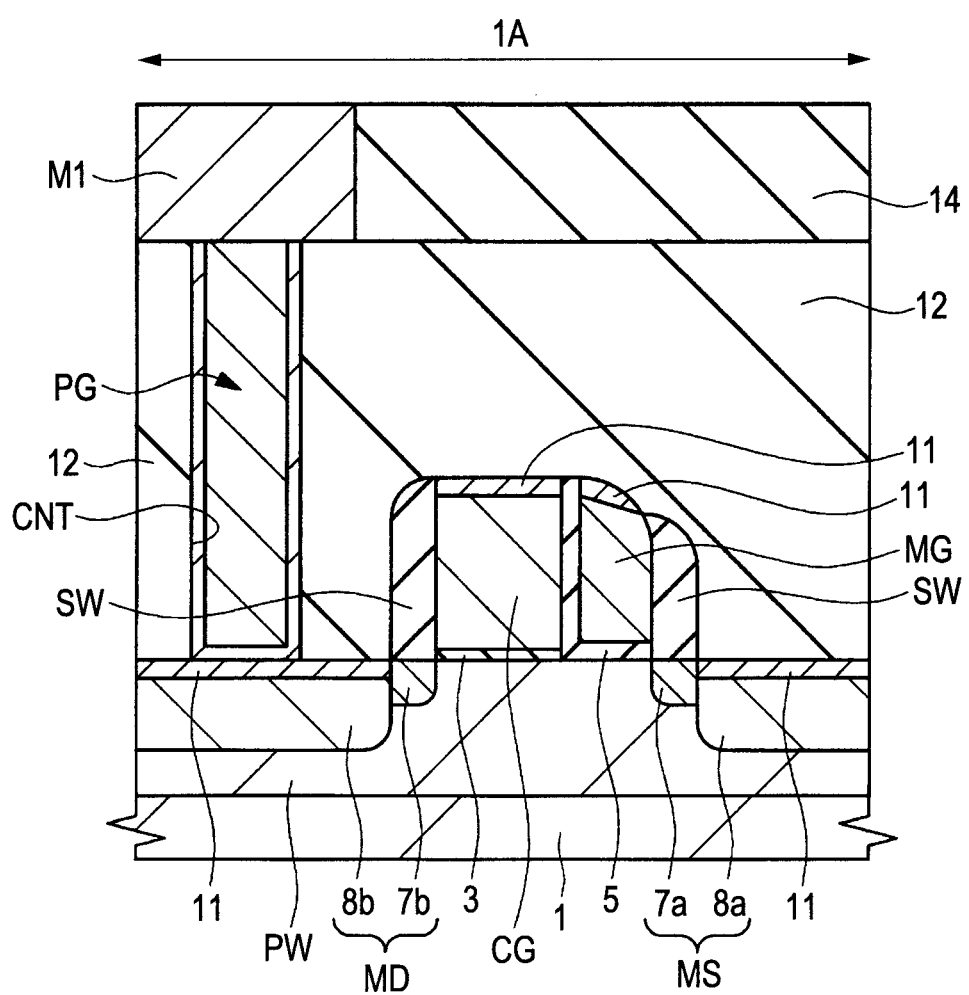
FIG. 23 is an essential part cross-sectional view of the semiconductor device during a manufacturing step following that of FIG. 22.

First, as shown in FIG. 23, over the insulation film 12 including the plug PG embedded therein, an insulation film (interlayer insulation film) 14 is formed. Then, in the insulation film 14, using a photolithography technology and a dry etching technology, a wire groove (groove in which the wire M1 is embedded in the insulation film 14) is formed. Then, over the main surface of the semiconductor substrate 1 (i.e., over the insulation film 14 including over the bottoms and the sidewalls of the wire grooves), a barrier conductor film (e.g., a titanium nitride film, a tantalum film, or a tantalum nitride film) is formed. Subsequently, by a CVD method, a sputtering method, or the like, over the barrier conductor film, a seed layer of copper is formed. Further, using an electrolytic plating method or the like, a copper plating film is formed over the seed layer. Thus, the copper plating film fills the inside of each wire groove. Then, portions of the copper plating film, the seed layer, and the barrier metal film in regions except for the insides of the wire grooves are removed by a CMP method. As a result, the first-layer wire M1 including copper as a main conductive material is formed. The wire M1 has been embedded in the wire groove of the insulation film 14. Incidentally, for simplification of the drawing, in FIG. 23, the copper plating film, the seed layer, and the barrier conductor film forming the wire M1 are shown in an integral form.

The wires M1 are electrically coupled via the plugs PG to the source region (semiconductor region MS) of the memory transistor, the drain region (semiconductor region MD) of the control transistor, the control gate electrode CG, the memory gate electrode MG, the upper electrode UE, the lower electrode LE, or the like. Incidentally, in FIG. 23, as one example of the wire M1, there is shown the wire M1 electrically coupled to the drain region (semiconductor region MD) of the control transistor via the plug PG.

Then, by a dual damascene method or the like, second- and more-layer wires are formed. However, herein, they are not shown, and a description thereon will be omitted. Further, the wires M1 and upper-layer wires are not limited to damascene wires (embedded wires), and can also be formed by patterning the conductor film for wiring. For example, the wires may be tungsten wires or aluminum wires.

Then, the features and effects of the present embodiment will be described in more details.

Figure 24:
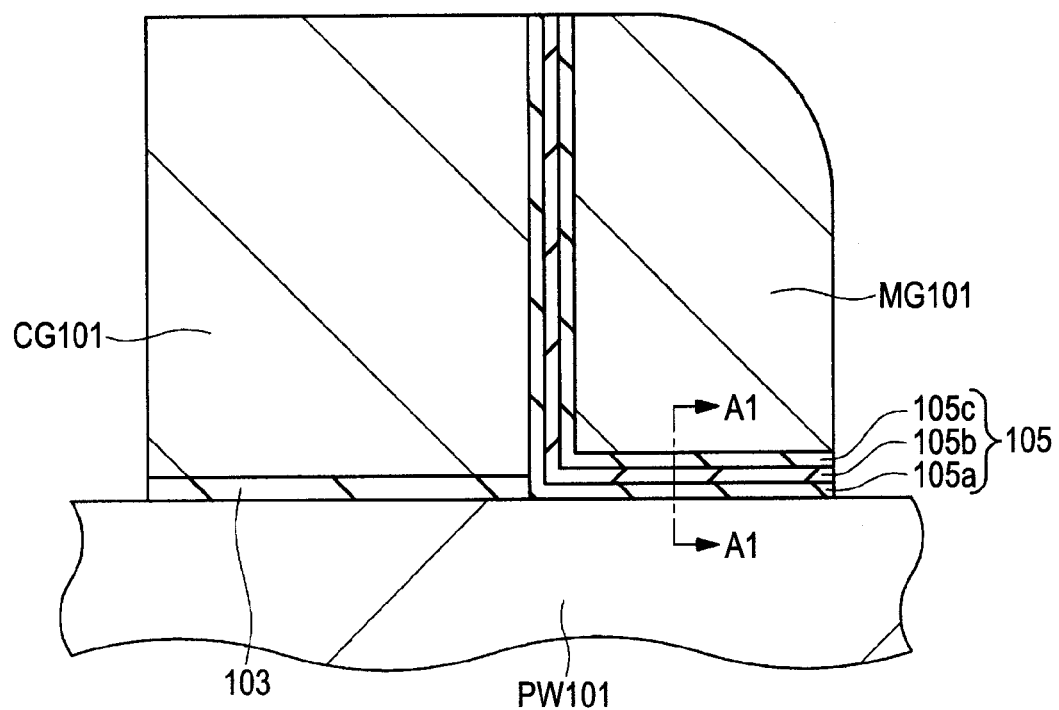
FIG. 24 is an essential part cross-sectional view of a semiconductor device of a first comparative example.

First, a semiconductor device of a first comparative example will be described. FIG. 24 is an essential part cross-sectional view of the semiconductor device of the first comparative example, and corresponds to FIG. 2 of the present embodiment.

The semiconductor device of the first comparative example shown in FIG. 24 is a semiconductor device having a memory cell of a nonvolatile memory. Over the top of a p type well PW101 of the semiconductor substrate, a control gate electrode CG101 and a memory gate electrode MG101 forming the nonvolatile memory cell are formed in such a manner as to be adjacent to each other. Then, between the control gate electrode CG101 and the p type well PW101, an insulation film 103 as the gate insulation film is formed. Whereas, between the memory gate electrode MG101 and the p type well PW101, and between the control gate electrode CG101 and the memory gate electrode MG101, an insulation film 105 including a lamination film of a silicon oxide film 105a, a silicon nitride film 105b, and a silicon oxide film 105c is formed. The control gate electrode CG101 and the memory gate electrode MG101 each include an n type silicon film.

The semiconductor device of such a structure of the first comparative example has the following problems.

For write, electrons are injected into the silicon nitride film 105b in the insulation film 105. In the memory cell in the write state, electrons are accumulated (held) in the silicon nitride film 105b. On the other hand, for erase, holes (positive holes) are injected into the silicon nitride film 105b in the insulation film 105. In the memory cell in the erase state, holes are accumulated (held) in the silicon nitride film 105b.

During injection of electrons into the silicon nitride film 105b by the write operation, the film quality of the insulation film 105 is not deteriorated. For this reason, a large number of electrons can be injected to be accumulated in the silicon nitride film 105b. Accordingly, even when after the write operation, some electrons are extracted from the insulation film 105, the data (write state) is kept. Even when the state is left as it is for a long time, a problem is less likely to occur. However, with injection of holes into the silicon nitride film 105b by the erase operation, the film quality of the insulation film 105 is largely deteriorated. For this reason, the amount of holes to be injected into the silicon nitride film 105b is set smaller than the amount of electrons injected for write. Accordingly, when after the erase operation, holes are extracted from the insulation film 105, a possibility increases that the data (erase state) may be eliminated.

Figure 25:
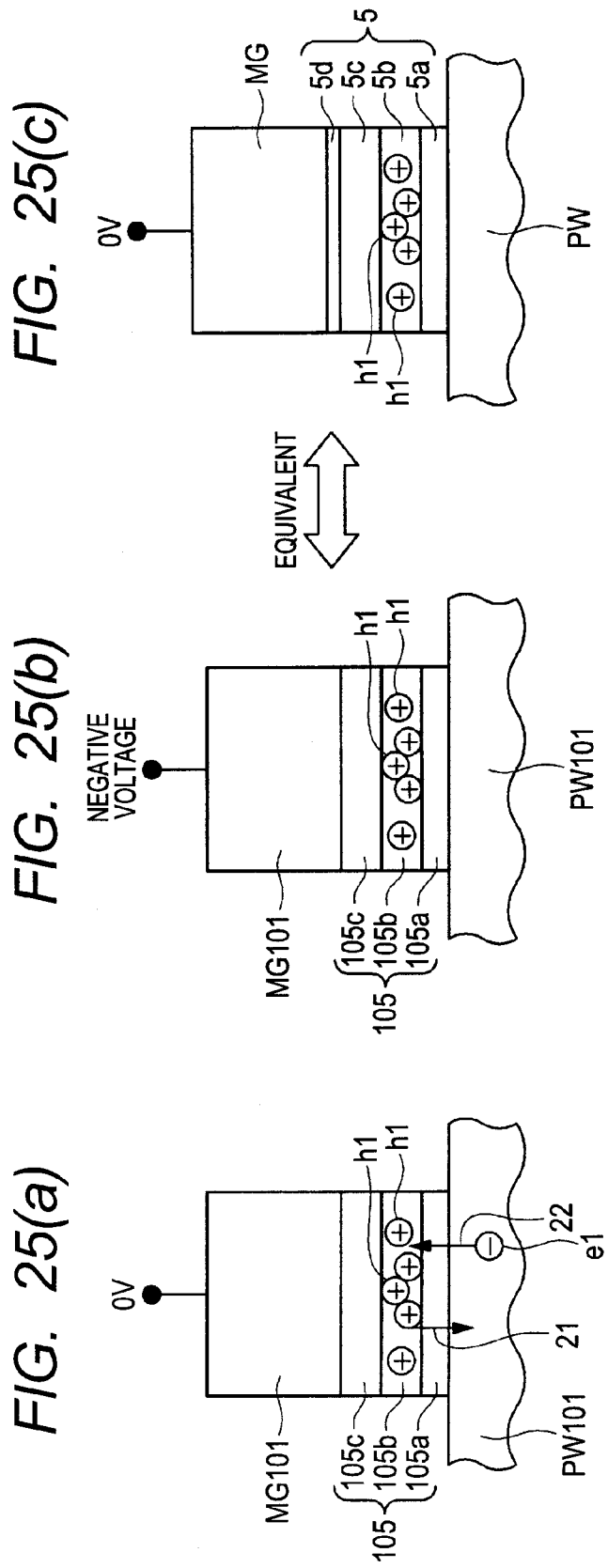
FIGS. 25A to 25C are each an illustrative view for illustrating the problem and the effect.

FIGS. 25A to 25C are each an illustrative view for illustrating the problems and the effects.

FIGS. 25A and 25B schematically show the memory gate electrode MG101, and the insulation film 105 and the p type well PW101 situated thereunder of the memory cell in the semiconductor device of the first comparative example shown in FIG. 24. The control gate electrode CG101 is not shown (the portion situated between the control gate electrode CG101 and the memory gate electrode MG101 of the insulation film 105 is also not shown). Whereas, FIG. 25C schematically shows the memory gate electrode MG, and the insulation film 5 and the p type well PW situated thereunder of the memory cell in the semiconductor device of the present embodiment. The control gate electrode CG is not shown (the portion situated between the control gate electrode CG and the memory gate electrode MG of the insulation film 5 is also not shown). All (the memory transistors of) the memory cells shown in FIGS. 25A, 25B, and 25C correspond to the erase state.

In FIG. 25A, the (memory transistor of) the memory cell is in the erase state. The holes (positive holes) h1 are accumulated (held) in the silicon nitride film 105b in the insulation film 105. However, in the period during which 0 V (zero volt) is supplied to the memory gate electrode MG101 in the wait state or the like, there may occur a phenomenon that holes (positive holes) h1 accumulated (held) in the silicon nitride film 105b are unnecessarily extracted toward the semiconductor substrate (p type well PW101) (this phenomenon is schematically indicated with an arrow 21 in FIG. 25A). Further, there may also occur a phenomenon that electrons e1 are unnecessarily injected from the semiconductor substrate (p type well PW101) side into the silicon nitride film 105b (this phenomenon is schematically indicated with an arrow 22 in FIG. 25A). When these phenomena occur, the threshold value (threshold voltage) of the memory transistor increases. As a result, the data (erase state) is eliminated. For this reason, it is desirable that these phenomena are inhibited or prevented.

In order to inhibit or prevent the phenomena (the phenomena schematically indicated with the arrows 21 and 22), first, it is conceivable that the film thicknesses of the silicon oxide film 105a and the silicon oxide film 105c are increased. However, when these film thicknesses are set large, the total film thickness of the insulation film 105 formed between the control gate electrode CG101 and the memory gate electrode MG101 increases. Accordingly, reduction of the read current (the current value flowing between source and drain for read) of the nonvolatile memory, reduction of the write speed, or the like is caused. As a result, the performances of the semiconductor device having a nonvolatile memory are degraded (this will be described later by reference to FIG. 28). Namely, by increasing the film thicknesses of the silicon oxide film 105a and the silicon oxide film 105c, it is possible to improve the data holding characteristic of the nonvolatile memory. However, the performances other than the data holding characteristics of the semiconductor device having a nonvolatile memory are degraded.

In order to inhibit or prevent the phenomena (the phenomena schematically indicated with the arrows 21 and 22), further, as shown in FIG. 25B, it is conceivable that the memory gate electrode MG101 is applied with some negative voltage (however, the absolute value of the negative voltage is smaller than the absolute value of the voltage to be applied to the memory gate electrode MG101 during the erase operation). The some negative voltage to be applied to the memory gate electrode MG101 can be set at, for example, about −0.5 V.

The memory gate electrode MG101 is applied with some negative voltage (e.g., about −0.5 V) (the state of FIG. 25B). As a result, the negative voltage of the memory gate electrode MG101 acts so as to inhibit the phenomenon that the holes h1 accumulated (held) in the silicon nitride film 105b are extracted toward the semiconductor substrate (p type well PW101) (the phenomenon schematically indicated with the arrow 21 in FIG. 25A). Alternatively, the negative voltage of the memory gate electrode MG101 (e.g., about −0.5 V) acts so as to inhibit the phenomenon that the electrons e1 are injected from the semiconductor substrate (p type well PW101) side into the silicon nitride film 105b (the phenomenon schematically indicated with the arrow 22 in FIG. 25A). For this reason, when some negative voltage is applied to the memory gate electrode MG101 of the memory cell in the wait state in which any operation of write, erase, and read is not performed, the data (erase state) can be inhibited or prevented from being eliminated by the phenomena (the phenomena schematically indicated with the arrows 21 and 22). As a result, it is possible to improve the data holding characteristic of the nonvolatile memory.

However, the negative voltage is thus applied to the memory gate electrode MG101 of the memory cell in the wait state in which any operation of write, erase, and read is not performed. This complicates the circuit configuration of the semiconductor device having a nonvolatile memory, or causes an increase in power consumption.

Under such circumstances, in the present embodiment, the insulation film 5d capable of causing Fermi level pinning is set as the uppermost layer of the insulation film 5. Thus, the insulation film 5d is brought in contact with the memory gate electrode MG. This solves the problems caused by the phenomena (the phenomena schematically indicated with the arrows 21 and 22). This will be described based on the band structure.

Figure 26:
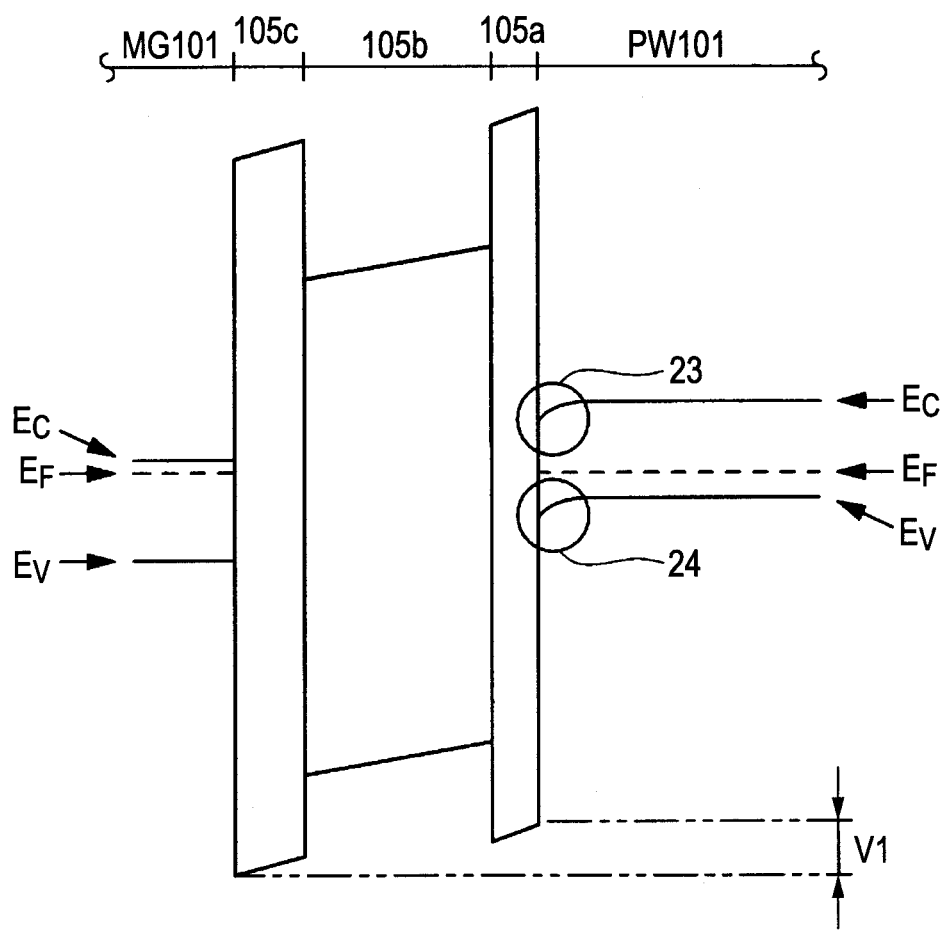
FIG. 26 is an illustrative view (energy band view) showing an energy band structure in the semiconductor device of the first comparative example of FIG. 24.
Figure 27:
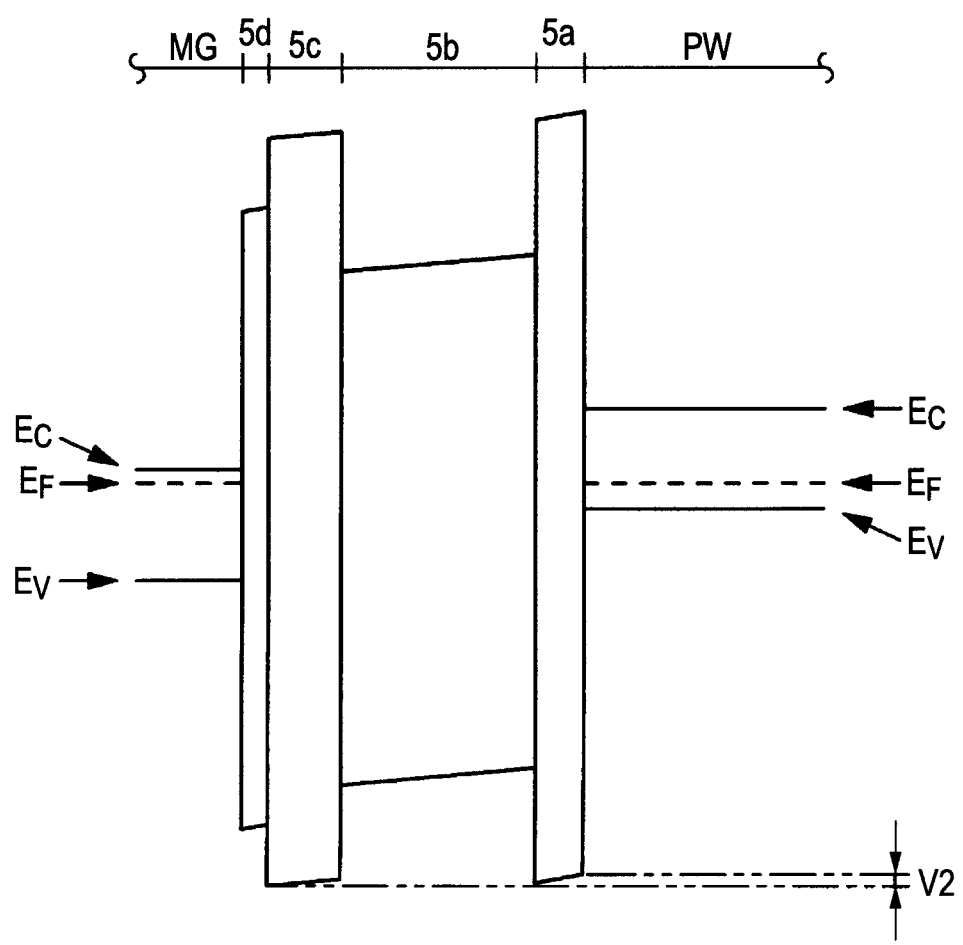
FIG. 27 is an illustrative view (energy band view) showing an energy band structure in the semiconductor device which is one embodiment of the present invention.

FIG. 26 is an illustrative view (energy band diagram) showing the energy band structure at the position along line A1-A1 (line A1-A1 is shown in FIG. 24) in the semiconductor device of the first comparative example of FIG. 24. FIG. 27 is an illustrative view (energy band diagram) showing the energy band structure at the position along line A2-A2 (line A2-A2 is shown in FIG. 3) in the semiconductor device of the present embodiment. The position of line A1-A1 of FIG. 24 roughly corresponds to line A2-A2 of FIG. 3. Incidentally, in FIGS. 26 and 27, the vertical axis (vertical direction) corresponds to the energy, and the horizontal axis (horizontal direction) corresponds to the position along line A1-A1 (in the case of FIG. 26) or line A2-A2 (in the case of FIG. 27). In FIGS. 26 and 27, the conduction band end $E_C$ and the valence band end $E_V$ are indicated with solid lines, and the Fermi level $E_F$ is indicated with a dotted line.

In the semiconductor device of the first comparative example of FIG. 24, the memory gate electrode MG101 including the n type silicon film is formed in contact with the silicon oxide film 105c. Accordingly, the band structure is as shown in FIG. 26.

In contrast, in the present embodiment, over the silicon oxide film 5c, the insulation film 5d is formed. Thus, the memory gate electrode MG including the n type silicon film 6n is formed in contact with the insulation film 5d. The insulation film 5d is the insulation film capable of causing Fermi level pinning. Therefore, at the interface between the insulation film 5d and the memory gate electrode MG, Fermi level pinning is caused. In the present embodiment, at the interface between the insulation film 5d and the memory gate electrode MG, Fermi level pinning occurs. Accordingly, as compared with the case where there is no insulation film 5d (the first comparative example of FIG. 24 corresponds thereto), the Fermi level $E_F$ can be pinned at a lower position (a lower energy position).

For this reason, the Fermi level $E_F$ of the memory gate electrode MG in the vicinity of the interface between the insulation film 5d and the memory gate electrode MG shown in the FIG. 27 is situated at a lower position (a lower energy position) than the Fermi level $E_F$ of the memory gate electrode MG101 in the vicinity of the interface between the silicon oxide film 105c and the memory gate electrode MG101 shown in FIG. 26.

In FIG. 26 (corresponding to the case of the first comparative example), circled regions 23 and 24 (corresponding to the region in the vicinity of the interface between the silicon oxide film 105a and the p type well PW101), the band of the semiconductor substrate (p type well PW101) is bent. In contrast, in FIG. 27 (corresponding to the case of the present embodiment), in the region in the vicinity of the interface between the silicon oxide film 5a and the p type well PW, the band of the semiconductor substrate (p type well PW) is not bent largely, and is nearly flat. This is due to the following reason. As compared with the case of FIG. 26 (corresponding to the first comparative example), in the case of FIG. 27 (corresponding to the present embodiment), Fermi level pinning due to the insulation film 5d is caused, resulting in reduction of the Fermi level $E_F$ of the memory gate electrode MG.

Fermi level pinning due to the insulation film 5d is caused, resulting in reduction of the Fermi level $E_F$ of the memory gate electrode MG. As a result, the potential difference between the memory gate electrode MG and the semiconductor substrate 1 (p type well PW) is reduced as much as the reduction of the Fermi level $E_F$ of the memory gate electrode MG. Namely, as compared with the potential difference between the memory gate electrode MG101 and the semiconductor substrate (p type well PW101) (roughly corresponding to the potential difference V1 of FIG. 26) in FIG. 26 (corresponding to the case of the first comparative example), the potential difference between the memory gate electrode MG and the semiconductor substrate 1 (p type well PW) (roughly corresponding to the potential difference V2 of FIG. 27) in FIG. 27 (corresponding to the case of the present embodiment) is smaller (V2<V1).

In other words, it can be said as follows: as compared with the case of the first comparative example (the case where the insulation film 5d is not formed, i.e., the case where Fermi level pinning is not caused), in the case of the present embodiment (the case where the insulation film 5d is formed, i.e., the case where Fermi level pinning is caused), Fermi level pinning due to the insulation film 5d is caused, resulting in a smaller (absolute value) of the potential difference between the memory gate electrode MG and the semiconductor substrate 1 (p type well PW).

Further, this means the following. The energy band structure of FIG. 27 of the present embodiment (i.e., the energy band structure along line A2-A2 of FIG. 3) roughly corresponds to the energy band structure when in the semiconductor device of the first comparative example, the memory gate electrode MG101 is applied with a negative potential (the negative potential equivalent to the reduction of the Fermi level $E_F$ of the memory gate electrode MG caused by Fermi level pinning due to the insulation film 5d). In other words, this means the following. The energy band structure (the energy band structure along line A1-A1 or line A2-A2) roughly equal to that in the case where in the semiconductor device of the first comparative example, the memory gate electrode MG101 is applied with some negative potential (e.g., about –0.5 V) can be obtained with the semiconductor device of the present embodiment including the insulation film 5d provided therein. Therefore, the case where the memory gate electrode MG101 is applied with some negative potential in the semiconductor device of the first comparative example is equivalent in terms of the energy band structure to the case where the memory gate electrode MG is applied with 0 V (zero volt) in the semiconductor device of the present embodiment. For this reason, provision of the insulation film 5d as shown in FIG. 25C is roughly equivalent to application of a negative potential to the memory gate electrode MG101 without provision of the insulation film 5d as shown in FIG. 25B. Incidentally, in FIG. 25C, (the memory transistor of) the memory cell is in the erase state, in which holes (positive holes) h1 are accumulated (held) in the silicon nitride film 5b in the insulation film 5. The potential of the memory gate electrode MG is 0 V.

Thus, in the present embodiment, by the Fermi level pinning due to the insulation film 5d, it is possible to obtain an action of reducing (the absolute value of) the potential difference between the memory gate electrode MG and the semiconductor substrate 1 (p type well PW), or from another viewpoint, an action of providing the energy band structure roughly equal to that in the case where in the semiconductor device of the first comparative example, the memory gate electrode MG101 is applied with some negative potential (e.g., about –0.5 V). By this action, in the present embodiment, the following effects can be obtained.

Namely, it is possible to inhibit a phenomenon that holes h1 accumulated (held) in the silicon nitride film 5b are unnecessarily extracted toward the semiconductor substrate 1 (p type well PW) (the phenomenon schematically indicated with the arrow 21 in FIG. 25A). Further, it is possible to inhibit a phenomenon that electrons e1 are unnecessarily injected from the semiconductor substrate 1 (p type well PW) side into the silicon nitride film 5b (the phenomenon schematically indicated with the arrow 22 in FIG. 25A). As a result, it is possible to inhibit or prevent the data (erase state) from being eliminated by the phenomena (the phenomena schematically indicated with the arrows 21 and 22). This can improve the holding characteristic of the data of the nonvolatile memory, i.e., the stored information of the nonvolatile memory. Therefore, it is possible to improve the performances of the semiconductor device having a nonvolatile memory.

Further, in the present embodiment, Fermi level pinning due to the insulation film 5d controls the energy band structures of the memory gate electrode MG, the insulation film 5, and the p type well PW. As a result, it is possible to inhibit or prevent the data (erase state) from being eliminated by the phenomena (the phenomena schematically indicated with the arrows 21 and 22). For this reason, even when a negative potential is not applied to the memory gate electrode MG of the memory cell in the wait state in which any operation of write, erase, and read is not performed, the data (erase state) can be inhibited or prevented from being eliminated. Therefore, in the memory cell in the wait state in which any operation of write, erase, and read is not performed, the potential to be supplied to the memory gate electrode MG can be set at 0 V (zero volt). For this reason, it is possible to simplify the circuit configuration of the semiconductor device having a nonvolatile memory. Further, it is possible to reduce the power consumption.

Whereas, a comparison is made between the case where in the semiconductor device of the first comparative example, the memory gate electrode MG101 is applied with 0 V (zero volt), and the case where in the semiconductor device of the present embodiment, the memory gate electrode MG is applied with 0 V (zero volt). As a result, it is found as follows: the formation of the insulation film 5d causes Fermi level pinning; accordingly, the threshold value (threshold voltage) of the memory transistor is higher by the amount of shift caused by Fermi level pinning with the semiconductor device of the present embodiment. For this reason, in the present embodiment, the amount of electrons to be injected into the silicon nitride film 5b in the insulation film 5 for write can be reduced. Therefore, the write speed can also be improved.

Figure 28:
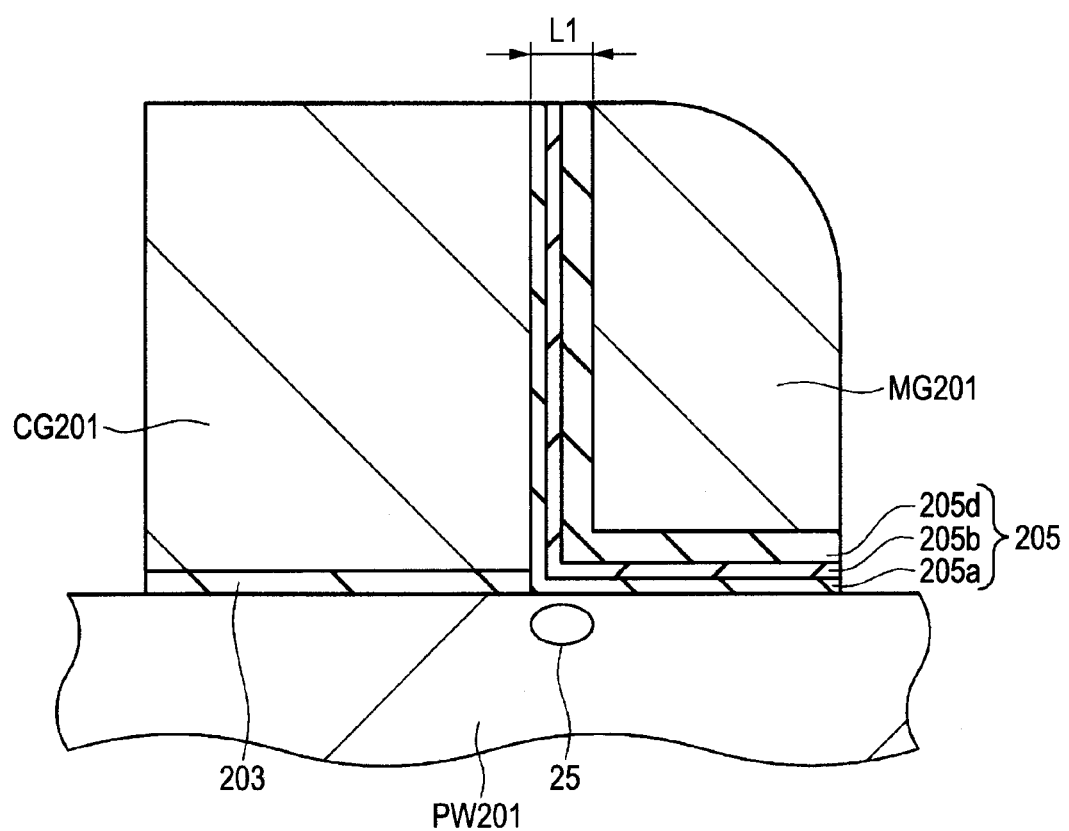
FIG. 28 is an essential part cross-sectional view of a semiconductor device of a second comparative example.

FIG. 28 is an essential part cross-sectional view of a semiconductor device of the second comparative example, and corresponds to FIG. 2 of the present embodiment, and FIG. 24 of the first comparative example.

The semiconductor device of the second comparative example shown in FIG. 28 is a semiconductor device having a memory cell of a nonvolatile memory. Over, the top of a p type well PW201 of a semiconductor substrate, a control gate electrode CG201 and a memory gate electrode MG201 forming the nonvolatile memory cell are formed in such a manner as to be adjacent to each other. Then, between the control gate electrode CG201 and the p type well PW201, an insulation film 203 as the gate insulation film is formed. Further, between the memory gate electrode MG201 and the p type well PW201, and between the control gate electrode CG201 and the memory gate electrode MG201, there is formed an insulation film 205 including a lamination film of a silicon oxide film 205a, a silicon nitride film 205b, and an insulation film 205d. The control gate electrode CG201 and the memory gate electrode MG201 each include an n type silicon film. The insulation film 205d is formed of the same material as that for the insulation film 5d of the present embodiment.

The semiconductor device of the second comparative example of such a structure has the following problem.

In the semiconductor device of the second comparative example shown in FIG. 28, the insulation film 205d formed of the same material as that for the insulation film 5d of the present embodiment is in contact with the memory gate electrode MG201. For this reason, occurrence of Fermi level pinning due to the insulation film 5d can inhibit the phenomena schematically indicated with the arrows 21 and 22.

However, in the semiconductor device of the second comparative example shown in FIG. 28, as charge blocking layers for preventing (blocking) the charges accumulated in the charge accumulation layer (herein, the silicon nitride film 205b) from being extracted from the charge accumulation layer, the silicon oxide film 205a and the insulation film 205d are used. Namely, for the charge blocking layer on the bottom side of the charge accumulation layer (herein, the silicon nitride film 205b), the silicon oxide film 205a is used. For the charge blocking layer on the top side of the charge accumulation layer (herein, the silicon nitride film 205b), the insulation film 205d is used.

In terms of the function and reliability as the charge blocking layer for preventing (blocking) the charges accumulated in the charge accumulation layer (in the present embodiment, the silicon nitride film 5b, in the case of the first comparative example, the silicon nitride film 105b, or in the case of the second comparative example, the silicon nitride film 205b) from being extracted from the charge accumulation layer, a silicon oxide film is superior to films of materials usable for the insulation films 5d and 205d (insulation films capable of causing Fermi level pinning). Namely, the insulation films 5d and 205d capable of causing Fermi level pinning are inferior to a silicon oxide film in terms of function and reliability as the charge blocking layer. For this reason, for the semiconductor device of the second comparative example shown in FIG. 28, as compared with the semiconductor device of the first comparative example shown in FIG. 24, and the semiconductor devices of the present embodiment shown in FIG. 2 and the like, the function of holding (confining) charges into the silicon nitride film 205b is so much the poorer for use of the insulation film 205d for the charge blocking layer.

In order to improve the charge blocking function of the insulation film 205d, it is effective that the film thickness of the insulation film 205d is increased. Further, the dielectric constant of the insulation film 205d (insulation film capable of causing Fermi level pinning) is higher than that of the silicon, oxide film 105c. For this reason, in order to equalize the electric fields to be applied to the silicon oxide film 105c and the insulation film 205d in the semiconductor device of the first comparative example of FIG. 24 and the semiconductor device of the second comparative example of FIG. 28, respectively, it is necessary to make the insulation film 205d thicker than the silicon oxide film 105c.

However, in the memory cell of a split gate type, the insulation film 205d is interposed not only between the memory gate electrode MG201 and the p type well PW201, but also between the memory gate electrode MG201 and the control gate electrode CG201. For this reason, when the film thickness of the insulation film 205d is set large, the length L1 between the memory gate electrode MG201 and the control gate electrode CG201 (the length L1 is shown in FIG. 28, and the film thickness of the insulation film 205 corresponds to the length L1) increases. In the p type well PW201, under the insulation film 205 interposed between the memory gate electrode MG201 and the control gate electrode CG201, there is formed a region 25 which is resistant to be applied with an electric field either by the memory gate electrode MG201 or the control gate electrode CG201, and in which a channel region is less likely to be formed. However, the dimension in the direction of gate length of the region 25 increases with an increase in the length L1 (corresponding to the film thickness of the insulation film 205). The region 25 becomes a resistance component. Therefore, an increase in the length L1 (corresponding to the film thickness of the insulation film 205) results in an increase in dimension in the direction of gate length of the region 25. This causes reduction of the read current (the current value flowing between source and drain during the read operation), or the reduction of the write speed of the memory cell of the nonvolatile memory. For this reason, in the memory cell of a split gate type, desirably, the length L1 between the memory gate electrode MG201 and the control gate electrode CG201 is set small, thereby to reduce the dimension in the direction of gate length of the region 25.

Thus, in the present embodiment, as the charge blocking layers for preventing (blocking) the charges accumulated in the charge accumulation layer (herein, the silicon nitride film 5b) from being extracted from the charge accumulation layer, the silicon oxide film 5a and the silicon oxide film 5c are used.

Namely, for the charge blocking layer on the bottom side of the charge accumulation layer (herein, the silicon nitride film 5b), the silicon oxide film 5a is used. For the charge blocking layer on the top side of the charge accumulation layer (herein, the silicon nitride film 5b), the silicon oxide film 5c is used.

In the present embodiment, the silicon oxide film 5c excellent in function and reliability as the charge blocking layer is used as the charge blocking layer on the top side of the charge accumulation layer (herein, the silicon nitride film 5b). For this reason, it is possible to improve the function and reliability as the charge blocking layer as compared with the case of the second comparative example. Thus, it is possible to improve the function of holding (confining) charges into the silicon nitride film 5b. Accordingly, it is possible to improve the data holding function of the nonvolatile memory.

Whereas, in the present embodiment, the silicon oxide film 5c is used as the charge blocking layer on the top side of the charge accumulation layer (herein, the silicon nitride film 5b). For this reason, the insulation film 5d is not required to have the function as the charge blocking layer. Namely, in the present embodiment, of the silicon oxide film 5c and the insulation film 5d interposed between the charge accumulation layer (herein, the silicon nitride film 5b) and the memory gate electrode MG, the silicon oxide film 5c is allowed to have the function as the charge blocking layer. For this reason, it is essential only that the insulation film 5d has a thickness capable of causing Fermi level pinning, and is not required to have the thickness required as the charge blocking layer. Therefore, the thickness of the insulation film 5d can be set small. On the other hand, the silicon oxide film 5c is allowed to function as the charge blocking layer. Therefore, the thickness demanded as the charge blocking layer is ensured.

Namely, in the present embodiment, the function as the charge blocking layer is imparted not to the insulation film 5d but to the silicon oxide film 5c. The insulation film 5d is allowed to have a function of causing Fermi level pinning. As one of main features, the thickness of the insulation film 5d is set small within the range capable of causing Fermi level pinning. For this reason, as shown in FIG. 5, in the present embodiment, the thickness t1 of the insulation film 5d is smaller than the thickness t2 of the silicon oxide film 5c (i.e., t1<t2). It is more preferable that the thickness t1 of the insulation film 5d is equal to or smaller than the half of the thickness t2 of the silicon oxide film 5c (i.e., t1≤t2×0.5).

Further, the insulation film 5d is preferably as thin as possible so long as it ensures the thickness capable of causing Fermi level pinning. From this viewpoint, the thickness t1 of the insulation film 5d is preferably 0.5 nm or more and 2 nm or less (i.e., 0.5 nm≤t1≤2 nm). On the other hand, in order for the silicon oxide film 5c to sufficiently ensure the function as the charge blocking layer, the thickness t2 of the silicon oxide film 5c is preferably 4 nm or more (i.e., t2≥4 nm).

Further, the total thickness t3 of the thickness of the silicon oxide film 5a, the thickness of the silicon nitride film 5b, and the thickness of the silicon oxide film 5c is determined in view of the function as the charge accumulation layer (herein, corresponding to the silicon nitride film 5b), the function as the charge blocking layers (herein, the silicon oxide films 5a and 5c), and the like. On the other hand, when the insulation film 5d ensures a thickness capable of causing Fermi level pinning, the insulation film 5d is preferably thin so as to allow minimization of the increase in the total thickness of the insulation film 5. From this viewpoint, the thickness t1 of the insulation film 5d is preferably 10% or less of the total thickness t3 of the thickness of the silicon oxide film 5a, the thickness of the silicon nitride film 5b, and the thickness of the silicon oxide film 5c (i.e., t1≤t3×0.1).

In the present embodiment, the silicon oxide film 5c functions as the charge blocking layer. Therefore, even when the insulation film 5d is made thin, no problem arises in the function of holding (confining) charges into the silicon nitride film 5b. Further, by making the insulation film 5d thin, it is possible to reduce the length L2 between the memory gate electrode MG and the control gate electrode CG adjacent to each other via the insulation film 5 (the length L2 is shown in FIG. 2, and the film thickness of the insulation film 5 corresponds to the length L2). As distinct from the present embodiment, if the insulation film 5d is thick, the length L2 is large, resulting in a large dimension in the direction of gate length of the region corresponding to the region 25. This causes, as described in connection with the second comparative example, reduction of the read current or reduction of the write speed of the memory cell of the nonvolatile memory. Herein, the region corresponding to the region 25 corresponds to a region which is situated under the insulation film 5 interposed between the memory gate electrode MG and the control gate electrode CG, and is resistant to be applied with an electric field either by the memory gate electrode MG or the control gate electrode. CG, and in which a channel region is less likely to be formed as shown in FIG. 28. In contrast, in the present embodiment, by making the insulation film 5d thin as described above, it is possible to reduce the length L2 between the memory gate electrode MG and the control gate electrode CG. This can reduce the dimension in the direction of gate length of the region corresponding to the region 25, resulting in an increase in read current or an improvement of the write speed of the memory cell of the nonvolatile memory. Therefore, it is possible to improve the performances of the semiconductor device having a nonvolatile memory.

Further, in the present embodiment, the insulation film 5d is an insulation film capable of causing Fermi level pinning, and has not only the feature of the small thickness t1 as described above, but also the feature of the high dielectric constant (relative dielectric constant). The reason for setting the dielectric constant (relative dielectric constant) of the insulation film 5d high will be described below.

Respective film thicknesses of the silicon oxide film 5a, the silicon nitride film 5b, and the silicon oxide film 5c are determined in view of the functions of respective films (for the silicon nitride film 5b, the function as the charge accumulation layer; and for the silicon oxide films 5a and 5c, the function as the charge blocking layers). For this reason, as distinct from the present embodiment, when the insulation film 5d with a low dielectric constant (e.g., comparable to that of the silicon oxide film) is added, as compared with the case where the insulation film 5d is not formed (corresponding to the first comparative example), the effective film thickness of the insulation film 5 interposed between the memory gate electrode MG and the semiconductor substrate 1 (p type well PW) increases by the increase in film thickness due to addition of the insulation film 5d. Herein, the effective film thickness of the insulation film 5 corresponds to the Equivalent Oxide Thickness: EOT. When the effective film thickness (equivalent oxide film thickness) of the insulation film 5 interposed between the memory gate electrode MG and the semiconductor substrate 1 increases, the electric field generated in the insulation film 5 interposed between the memory gate electrode MG and the semiconductor substrate 1 (p type well PW) during the write operation or during the erase operation is reduced. Accordingly, the write speed and the erase speed may be reduced. In order to prevent this, it is necessary to increase the operation voltage for the write operation or for the erase operation.

In contrast, in the present embodiment, the dielectric constant of the insulation film 5d is set high. As a result, even when the insulation film 5d is added, as compared with the case where the insulation film 5d is not formed (corresponding to the first comparative example), it is possible to inhibit the increase in the effective film thickness (equivalent oxide film thickness) of the insulation film 5 interposed between the memory gate electrode MG and the semiconductor substrate 1 (p type well PW). For this reason, even when the insulation film 5d is added, it is possible to inhibit or prevent the reduction of the electric field generated in the insulation film 5 interposed between the memory gate electrode MG and the semiconductor substrate 1 (p type well PW) during the write operation or during the erase operation. Accordingly, it is possible to prevent the reduction of the write speed or the erase speed. Therefore, it is possible to improve the performances of the semiconductor device having a nonvolatile memory. Further, it is possible to prevent the increase in operation voltage during the write operation or during the erase operation.

Incidentally, the electric field generated in the insulation film 5 interposed between the memory gate electrode MG and the substrate 1 (p type well PW) during the write operation or during the erase operation is defined by the effective film thickness (equivalent oxide film thickness) of the insulation film 5. Therefore, in order to prevent the reduction of the electric field, the effective film thickness (equivalent oxide film thickness) of the insulation film 5d is desirably set small. On the other hand, in order to solve the problem due to an increase in dimension in the direction of gate length of the region corresponding to the region 25, it is necessary to reduce the length L2 between the memory gate electrode MG and the control gate electrode CG. To that end, it is desirable to reduce not the effective film thickness (equivalent oxide film thickness) of the insulation film 5d but the physical thickness t1 of the insulation film 5d. Accordingly, in the present embodiment, the physical thickness t1 of the insulation film 5d is set small, and further, the dielectric constant of the insulation film 5d is set high. As a result, the effective film thickness (equivalent oxide film thickness) of the insulation film 5d is further reduced.

Thus, in the present embodiment, the insulation film 5d is required to be selected from both the viewpoints of capability of causing Fermi level pinning, and the high dielectric constant. From this viewpoint, the insulation film 5d is formed of a metal compound containing at least one of Hf (hafnium), Zr (zirconium), Al (aluminum), Ta (tantalum), and La (lanthanum). As a particularly preferable material film as the insulation film 5d, mention may be specifically made of a hafnium oxide film, a zirconium oxide film, an aluminum oxide film, a tantalum oxide film, or a lanthanum oxide film. By forming the insulation films 5d with the materials, it is possible to obtain the effect of the present embodiment.

Further, in the present embodiment, in the same semiconductor substrate 1, there are formed (merged) (the memory cell MC of) the nonvolatile memory and the capacitive element C1. Then, the insulation film 5 at the same layer as the insulation film 5 used as the gate insulation film of the memory transistor of the memory cell MC of the nonvolatile memory is used as the capacitive insulation film DE of the capacitive element C1. Namely, each insulation film 5 at the same layer formed in the same step is used as the gate insulation film of the memory transistor in the memory cell region 1A, and is used as the capacitive insulation film DE in the capacitor formation region 1B. Therefore, the insulation film 5 interposed between the memory gate electrode MG and the semiconductor substrate 1 (p type well PW), and between the control gate electrode CG and the memory gate electrode MG in the memory cell region 1A, and the capacitive insulation film DE (insulation film 5) interposed between the lower electrode LE and the upper electrode UE in the capacitor formation region 1B have the same layer structure. However, the insulation film 5 interposed between the memory gate electrode MG and the semiconductor substrate 1 (p type well PW), and between the control gate electrode CG and the memory gate electrode MG in the memory cell region 1A has been integral with the capacitive insulation film DE interposed between the lower electrode LE and the upper electrode UE in the capacitor formation region 1B at the stage of having formed the insulation film 5 at Step S7. However, in Step S11, the insulation films 5 are separated from each other. Accordingly, the insulation films 5 are spaced apart from each other in the manufactured semiconductor device.

The capacitance value of the capacitive element C1 is defined by the facing area between the lower electrode LE and the upper electrode UE via the capacitive insulation film DE, the thickness of the capacitive insulation film DE, and the dielectric constant of the capacitive insulation film DE. As distinct from the present embodiment, when the dielectric constant of the insulation film 5d is low (e.g., when the dielectric constant is comparable to that of the silicon oxide film), the insulation film 5d is added. As a result, as compared with the case where the insulation film 5d is not formed, the thickness of the capacitive insulation film DE increases, resulting in reduction of the capacitance value of the capacitive element C1. In order to ensure the capacitance value equal to that provided when the insulation film 5d is not formed, there arises a necessity of increasing the facing area between the lower electrode LE and the upper electrode UE via the capacitive insulation film DE. This causes an increase in area of the capacitor formation region 1B, and further, an increase in area of the semiconductor device.

In contrast, in the present embodiment, the dielectric constant of the insulation film 5d is set high. Therefore, even when the insulation film 5d is added, it is possible to inhibit the reduction of the capacitance value of the capacitive element C1 as compared with the case where the insulation film 5d is not formed. For this reason, it is possible to inhibit or prevent the increase in facing area between opposed portions of the lower electrode LE and the upper electrode UE with the capacitive insulation film DE interposed therebetween. This can inhibit or prevent the increase in area of the capacitor formation region 1B. Therefore, it is possible to inhibit or prevent the increase in area of the semiconductor device.

Further, the insulation film 5d is formed at the top (top layer part) of the insulation film 5. As a result, as compared with the case where the insulation film 5d is not formed, the physical film thickness increases. This enables the reduction of the defect density of the silicon oxide film 5c formed in contact with the insulation film 5d. As a result, it becomes possible to improve the reliability as the capacitive element. Therefore, it becomes possible to improve the reliability of the semiconductor device.

Whereas, for the gate insulation film of the memory transistor in the memory cell region 1A and the capacitive insulation film DE of the capacitive element C1 in the capacitor formation region 1B, the insulation films 5 at the same layer formed in the same step are used. As a result, it is possible to reduce the number of manufacturing steps of the semiconductor device having (the memory cell MC of) the nonvolatile memory and the capacitive element C1.

Further, in the present embodiment, it is important to reduce the physical thickness t1 of the insulation film 5d as described above. The reason why this is important is that there is adopted the structure in which the control gate electrode CG and the memory gate electrode MG are adjacent to each other via the insulation film 5 (a split gate type memory cell structure). In the case of this structure, under the insulation film 5 interposed between the memory gate electrode MG and the control gate electrode CG, there is formed a region which is resistant to be applied with an electric field either by the memory gate electrode MG or the control gate electrode CG, and in which a channel region is less likely to be formed (region corresponding to the region 25). For this reason, it is very important for improving the performances of the semiconductor device having a nonvolatile memory to reduce the dimension in the direction of gate length of the region. Accordingly, in the present embodiment, in the insulation film 5 formed between the memory gate electrode MG and the semiconductor substrate 1 (p type well PW), and between the control gate electrode CG and the memory gate electrode MG, for the physical thickness t2 of the silicon oxide film 5c, the necessary thickness as the charge blocking layer is ensured. On the other hand, the physical thickness t1 of the insulation film 5d for causing Fermi level pinning is reduced. Thus, it is possible to reduce the total physical thickness of the insulation film 5 while ensuring the functions of respective layers. As a result, it is possible to solve the problems due to the formation of the region corresponding to the region 25.

On the other hand, when the control gate electrode CG and the memory gate electrode MG are not adjacent to each other via the insulation film 5 as distinct from the present embodiment, i.e., when over the semiconductor substrate 1 (p type well PW), a gate electrode is disposed via the insulation film 5, but there is no other gate electrode adjacent to the gate electrode via the insulation film 5, the region corresponding to the region 25 itself is not formed. Accordingly, the problems themselves due to the increase in physical thickness of the insulation film 5d are not entailed. For this reason, it can be said that the necessity of reducing the physical thickness t1 of the insulation film 5d does not arise until there is adopted a structure in which the control gate electrode CG and the memory gate electrode MG are adjacent to each other via the insulation film 5 (split gate type memory cell structure).

Second Embodiment

The present embodiment is a modified example of the first embodiment. A description will be given to another nonvolatile memory to which the technology of the first embodiment is applicable.

Figure 29:
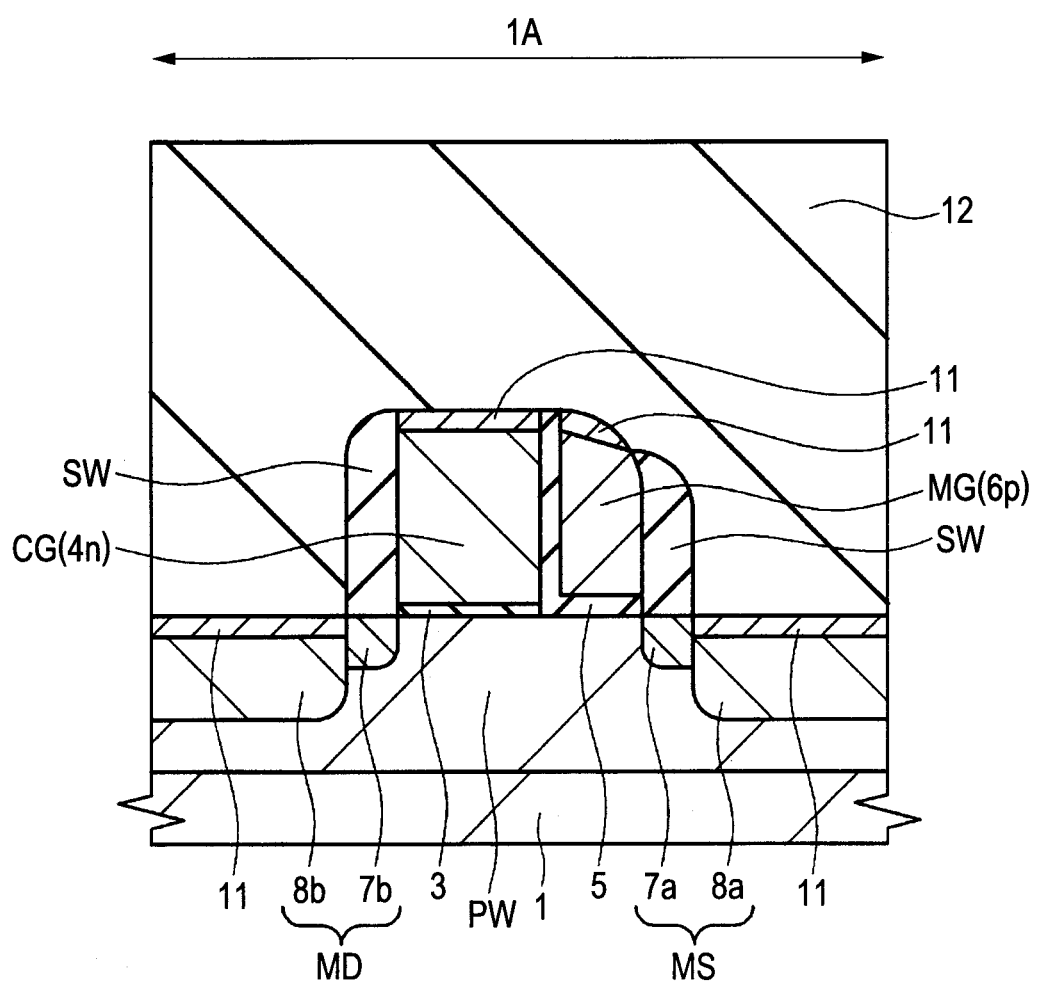
FIG. 29 is an essential part cross-sectional view of a first modified example of the semiconductor device of FIG. 1.

FIG. 29 is an essential part cross-sectional view of a semiconductor device of a first modified example, and corresponds to FIG. 1. However, the capacitor formation region 1B is not shown, and only the memory cell region 1A is shown.

In the semiconductor device of the first embodiment, the silicon film 6n forming the memory gate electrode MG was an n type silicon film. However, in the semiconductor device of the first modified example shown in FIG. 29, the memory gate electrode MG includes a p type silicon film 6p in place of the n type silicon film 6n. The silicon film 6p has a low resistivity by including p type impurities introduced therein, and is preferably a p type polysilicon film (p type impurities-introduced polysilicon film, or doped polysilicon film). Further, the manufacturing steps of the semiconductor device of the first modified example shown in FIG. 29 can be performed in the same manner as in the first embodiment, except that in Step S8, the p type silicon film 6p is formed in place of the n type silicon film 6n. Further, for the semiconductor device of the first modified example shown in FIG. 29, due to the formation of the p type silicon film 6p in place of the n type silicon film 6n, the upper electrode UE of the capacitive element C1 (not shown in FIG. 29) is formed of the p type silicon film 6p. Other configurations of the semiconductor device of the first modified example shown in FIG. 29 are the same as those of the semiconductor device of the first embodiment, and hence a description thereon is omitted.

Figure 30:
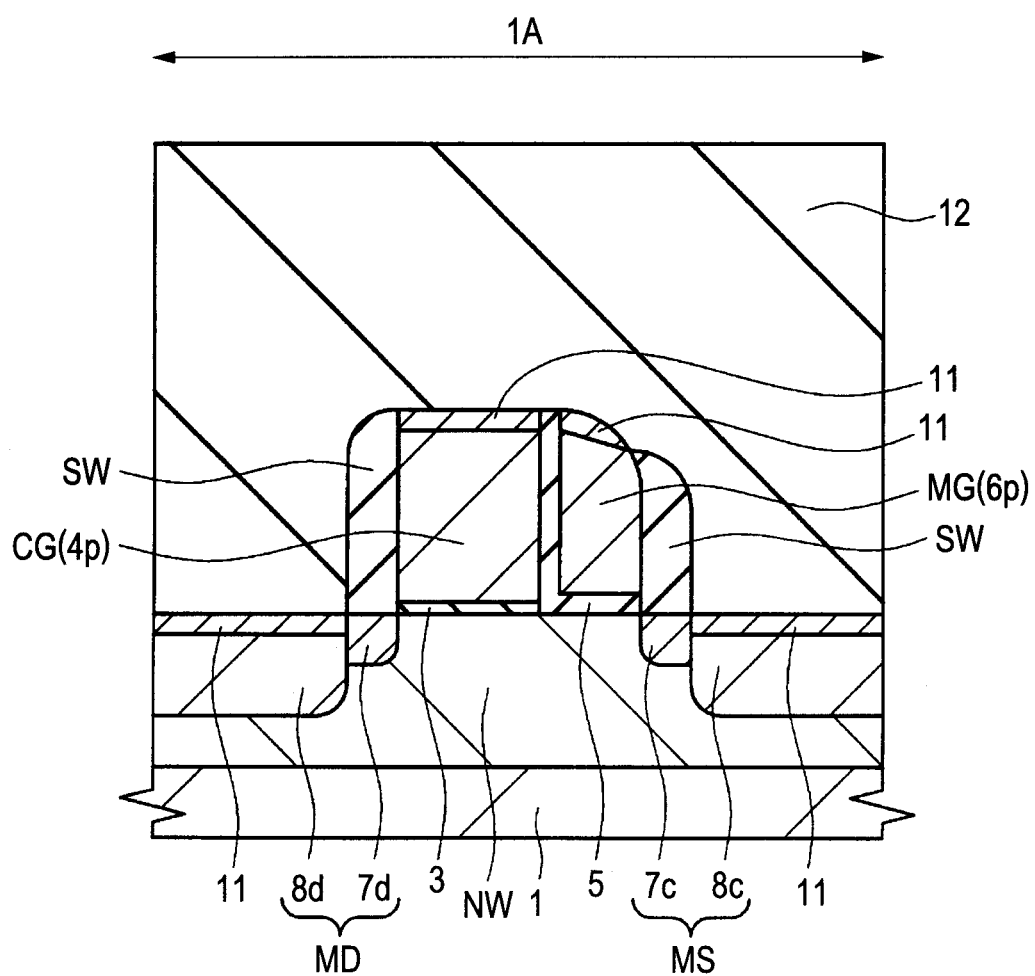
FIG. 30 is an essential part cross-sectional view of the second modified example of the semiconductor device of FIG. 1.

FIG. 30 is an essential part cross-sectional view of a semiconductor device of a second modified example, and corresponds to FIG. 1. However, the capacitor formation region 1B is not shown, and only the memory cell region 1A is shown.

In the semiconductor device of the first embodiment, the silicon film 6n forming the memory gate electrode MG was an n type silicon film. However, in the semiconductor device of the second modified example shown in FIG. 30, the memory gate electrode MG includes a p type silicon film 6p in place of the n type silicon film 6n. Further, in the semiconductor device of the first embodiment, the silicon film 4n forming the control gate electrode CG was an n type silicon film. However, in the semiconductor device of the second modified example shown in FIG. 30, the control gate electrode CG includes the p type silicon film 4p in place of the silicon film 4n. The silicon film 6p has a low resistivity by including p type impurities introduced therein, and is preferably a p type polysilicon film (p type impurities-introduced polysilicon film, or doped polysilicon film). Further, the silicon film 4p has a low resistivity by including p type impurities introduced therein, and is preferably a p type polysilicon film (p type impurities-introduced polysilicon film, or doped polysilicon film). Furthermore, the region which was the p type well PW in the semiconductor device of the first embodiment has been inverted in conductivity type to be an n type well NW in the semiconductor device of the second modified example shown in FIG. 30. Further, the regions where were the n⁻ type semiconductor region 7a, the n⁻ type semiconductor region 7b, the n⁺ type semiconductor region 8a, and the n⁺ type semiconductor region 8b in the semiconductor device of the first embodiment have been inverted in conductivity type to be a p⁻ type semiconductor region 7c, a p⁻ type semiconductor region 7d, a p⁺ type semiconductor region 8c, and a p⁺ type semiconductor region 8d, respectively, in the semiconductor device of the second modified example shown in FIG. 30.

Further, in the manufacturing steps of the semiconductor device of the second modified example shown in FIG. 30, in Step S3, an n type well NW is formed in place of the p type well PW; in Step S5, a p type silicon film 4p is formed in place of the n type silicon film 4n; and in Step S8, a p type silicon film 6p is formed in place of the n type silicon film 6n. Then, in Step S12, in place of the n⁻ type semiconductor regions 7a and 7b, p⁻ type semiconductor regions 7c and 7d are formed. In Step S14, in place of the n⁺ type semiconductor regions 8a and 8b, p⁺ type semiconductor regions 8c and 8d are formed. Other steps can be performed in the same manner as in the first embodiment.

Further, for the semiconductor device of the second modified example shown in FIG. 30, in place of the n type silicon films 4n and 6n, the p type silicon films 4p and 6p were formed, respectively. Accordingly, the lower electrode LE (not shown in FIG. 30) of the capacitive element C1 is formed of the p type silicon film 4p. The upper electrode UE (not shown in FIG. 30) is formed of the p type silicon film 6p. Other configurations of the semiconductor device of the second modified example shown in FIG. 30 are the same as those of the semiconductor device of the first embodiment, and hence a description thereon is omitted.

Therefore, in the semiconductor device of the first embodiment, the control transistor (MISFET having the control gate electrode CG) and the memory transistor (MISFET having the memory gate electrode MG) were both n channel type MISFETs. The control gate electrode CG and the memory gate electrode MG were both formed of n type silicon (more specifically, n type polysilicon). On the other hand, in the semiconductor device of the first modified example shown in FIG. 29, the control transistor (MISFET having the control gate electrode CG) and the memory transistor (MISFET having the memory gate electrode MG) are both n channel type MISFETs. The control gate electrode CG is formed of an n type silicon (more specifically, n type polysilicon). The memory gate electrode MG is formed of a p type silicon (more specifically, p type polysilicon). Further, in the semiconductor device of the second modified example shown in FIG. 30, the control transistor (MISFET having the control gate electrode CG) and the memory transistor (MISFET having the memory gate electrode MG) are both p channel type MISFETs. The control gate electrode CG and the memory gate electrode MG are both formed of p type silicon (more specifically, p type polysilicon). The configuration (lamination structure) of the insulation film 5 is the same as those of the semiconductor device of the first embodiment, the semiconductor device of the first modified example shown in FIG. 29, and the semiconductor device of the second modified example shown in FIG. 30.

Also in the case of the semiconductor device of the first modified example shown in FIG. 29, or in the case of the semiconductor device of the second modified example shown in FIG. 30, by applying the technology (particularly, the configuration of the insulation film 5) of the first embodiment, it is possible to obtain the effects as described in the first embodiment.

In the case of the semiconductor device of the first modified example shown in FIG. 29, the memory gate electrode MG is formed of the p type silicon film 6p. Accordingly, the insulation film 5d is in contact with the memory gate electrode MG formed of the p type silicon film 6p. Therefore, when Fermi level pinning is caused at the interface between the insulation film 5d and the memory gate electrode MG, Fermi level is pinned at a position slightly lower than that in the first embodiment. In this case, it is possible to obtain larger effects than the effects described in the first embodiment.

In the case of the semiconductor device of the second modified example shown in FIG. 30, the memory cell is formed of the p channel type MISFET, and is opposite in conductivity type to the semiconductor device of the first embodiment. Accordingly, the insulation film 5d is in contact with the memory gate electrode MG formed of the p type silicon film 6p. Therefore, when Fermi level pinning is caused at the interface between the insulation film 5d and the memory gate electrode MG, as compared with the case where there is no insulation film 5d (in this case, the silicon oxide film 5c is in contact with the memory gate electrode MG), Fermi level is pinned at a higher position (higher energy position). In this case, it is possible to obtain the effects provided upon inverting the polarity in the first embodiment. In other words, even when the voltage to be applied to the memory gate electrode MG is 0 V, it is possible to obtain an action capable of providing almost the same energy band structure as that obtained upon applying some positive potential (e.g., about 0.5 V). In still other words, it is possible to inhibit the phenomenon that the electrons accumulated (held) in the silicon nitride film 5b are unnecessarily extracted toward the semiconductor substrate. Further, it is possible to inhibit the phenomenon that the holes are unnecessarily injected from the semiconductor substrate into the silicon nitride film 5b. This can inhibit or prevent the data (write state) from being eliminated. Thus, it is possible to improve the holding characteristic of the data of the nonvolatile memory, i.e., the stored information of the nonvolatile memory. Therefore, it is possible to improve the performances of the semiconductor device having a nonvolatile memory.

Figure 31:
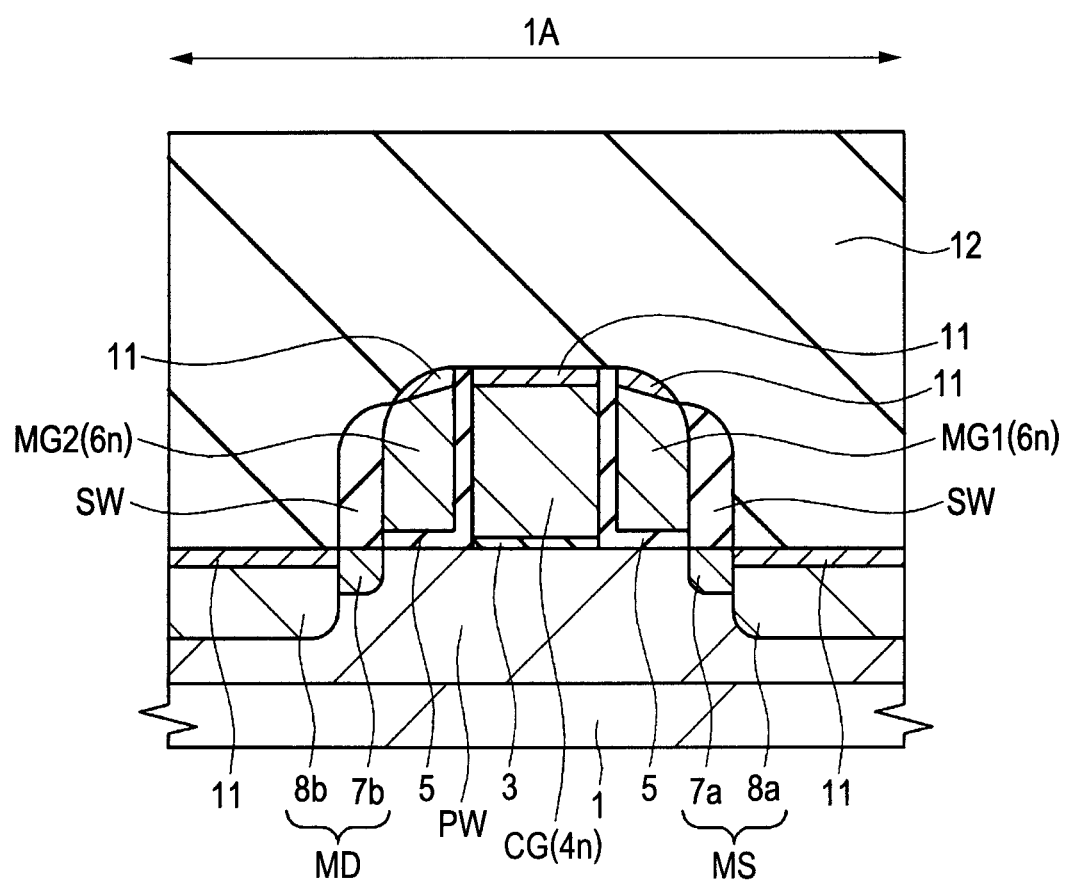
FIG. 31 is an essential part cross-sectional view of a third modified example of the semiconductor device of FIG. 1.

FIG. 31 is an essential part cross-sectional view of a semiconductor device of a third modified example, and corresponds to FIG. 1. However, the capacitor formation region 1B is not shown, but only the memory cell region 1A is shown.

In the semiconductor device of the first embodiment, over one sidewall of the control gate electrode CG, the memory gate electrode MG was formed via the insulation film 5. However, in the semiconductor device of the third modified example shown in FIG. 31, over both the sidewalls of the control gate electrode CG, the memory gate electrodes MG1 and MG2 are formed via the insulation film 5.

Namely, in the semiconductor device of the third modified example shown in FIG. 31, over one sidewall of the control gate electrode CG, the memory gate electrode MG1 is formed in a sidewall spacer form via the insulation film 5. Over the other sidewall of the control gate electrode CG, the memory gate electrode MG2 is formed in a sidewall spacer form via the insulation film 5. The memory gate electrode MG1 and the memory gate electrode MG2 are formed over the sidewalls on the mutually opposing sides of the control gate electrode CG, respectively, and have an almost symmetric structure with the control gate electrode CG sandwiched therebetween. The memory gate electrode MG1 is the same as the memory gate electrode MG in the semiconductor device of the first embodiment. Namely, in the semiconductor device of the third modified example shown in FIG. 31, the control gate electrode CG, the memory gate electrode MG1 (corresponding to the memory gate electrode MG of the first embodiment), the sidewall insulation film SW over the sidewall of the memory gate electrode MG1, the p type well PW, the $n^-$ type semiconductor region 7a, the $n^+$ type semiconductor region 8a, the metal silicide layer 11 over the control gate electrode CG, and the metal silicide layer 11 over the $n^+$ type semiconductor region 8a are the same as those in the semiconductor device of the first embodiment. Further, in the semiconductor device of the third modified example shown in FIG. 31, the insulation film 3 formed between the control gate electrode CG and the semiconductor substrate 1 (p type well PW), and the insulation film 5 formed between the memory gate electrode MG1 and the semiconductor substrate 1 (p type well PW), and between the memory gate electrode MG1 and the control gate electrode CG are also the same as those in the semiconductor device of the first embodiment.

However, in the semiconductor device of the third modified example shown in FIG. 31, as described above, over the sidewall of the control gate electrode CG (the sidewall on the side thereof opposite to the side on which the memory gate electrode MG1 is formed), the memory gate electrode MG2 is formed in a sidewall spacer form via the insulation film 5. Between the memory gate electrode MG2 and the semiconductor substrate 1 (p type well PW), and between the memory gate electrode MG2 and the control gate electrode CG, the insulation film 5 is formed. The insulation film 5 formed between the memory gate electrode MG2 and the semiconductor substrate 1 (p type well PW), and between the memory gate electrode MG2 and the control gate electrode CG, and the insulation film 5 formed between the memory gate electrode MG1 and the semiconductor substrate 1 (p type well PW), and between the memory gate electrode MG1 and the control gate electrode CG are the insulation films formed at the same layer in the same step (corresponding to Step S7).

The insulation films 5 have the same structure (layer structure), but are separated from each other.

The memory gate electrode MG1, the control gate electrode CG, and the memory gate electrode MG2 extend and are disposed side by side along the main surface of the semiconductor substrate 1 with the insulation films 5 interposed between the opposing side surfaces (sidewalls) thereof. The direction of extension of the memory gate electrode MG1, the control gate electrode CG, and the memory gate electrode MG2 is the direction perpendicular to the paper plane of FIG. 31. The memory gate electrodes MG1 and MG2, and the control gate electrode CG are formed over the top of the semiconductor substrate 1 (p type well PW) between the semiconductor region MD and the semiconductor region MS via the insulation films 3 and 5 (for the control gate electrode CG, via the insulation film 3, and for the memory gate electrodes MG1 and MG2, via the insulation films 5). On the side of the semiconductor region MS, the memory gate electrode MG1 is situated. On the side of the semiconductor region MD, the memory gate electrode MG2 is situated. At the center, the control gate electrode CG is situated. Over the sidewall of the memory gate electrode MG2 (the sidewall on the side opposite to the side thereof in contact with the control gate electrode CG), the sidewall insulation film SW is formed.

Further, in the semiconductor device of the third modified example shown in FIG. 31, the n⁻ type semiconductor region 7b forming the semiconductor region MD for drain is formed in self-alignment with the sidewall of the memory gate electrode MG2 (the side surface on the side opposite to the side thereof in contact with the control gate electrode CG). Whereas, the n⁺ type semiconductor region 8b forming the semiconductor region MD for drain is formed in self-alignment with the side surface of the sidewall insulation film SW over the sidewall of the memory gate electrode MG2 (the side surface on the side opposite to the side thereof in contact with the memory gate electrode MG2). Accordingly, the low-concentration n⁻ type semiconductor region 7b is formed under the sidewall insulation film SW over the sidewall of the memory gate electrode MG2. The high-concentration n⁺ type semiconductor region 8b is formed outside the low-concentration n⁻ type semiconductor region 7b. Therefore, the low-concentration n⁻ type semiconductor region 7b is formed in such a manner as to be adjacent to the channel region under the memory gate electrode MG2. The high-concentration n⁺ type semiconductor region 8b is formed in such a manner as to be in contact with the low-concentration n⁻ type semiconductor region 7b, and to be spaced apart from the channel region under the memory gate electrode MG2 by the n⁻ type semiconductor region 7b. Over the tops of the memory gate electrodes MG1 and MG2, and the n⁺ type semiconductor regions 8a and 8b, the metal silicide layers 11 are formed.

Other configurations of the semiconductor device of the third modified example shown in FIG. 31 are the same as those of the semiconductor device of the first embodiment, and hence, herein, a description thereon is omitted.

A description will be given to the manufacturing steps of the semiconductor device of the third modified example shown in FIG. 31. FIGS. 32 to 35 are each an essential part cross-sectional view of the semiconductor device during each manufacturing step of the third modified example shown in FIG. 31, and each show an essential part cross-sectional view of the memory cell region 1A. The manufacturing steps in the capacitor formation region 1B are the same as those in the first embodiment, and hence, herein, a description thereon is omitted. The manufacturing steps in the memory cell region 1A will be described.

Figure 32:
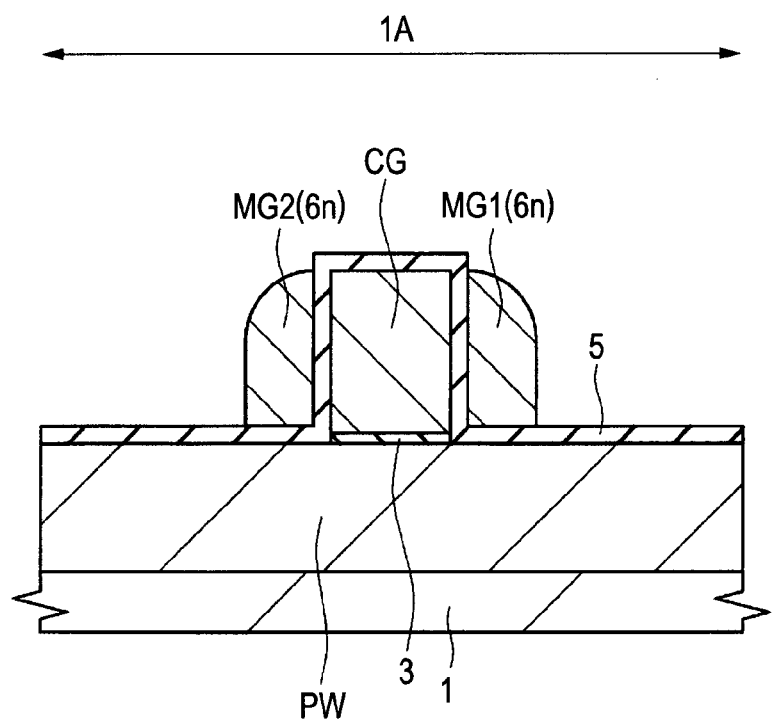
FIG. 32 is an essential part cross-sectional view of the semiconductor device during a manufacturing step of the third modified example of FIG. 31.

In the same manner as in the first embodiment, the steps up to Step S9 (etching back step of the silicon film 6n) are performed, resulting in a structure of FIG. 32 corresponding to FIG. 16. The memory gate electrode MG of the first embodiment corresponds to the memory gate electrode MG1 in FIG. 32. The silicon spacer SP1 of the first embodiment corresponds to the memory gate electrode MG2 in FIG. 32. Accordingly, when the semiconductor device of the third modified example shown in FIG. 31 is manufactured, in Step S10 (removing step of the silicon spacer SP1) performed in the first embodiment, using a photolithography technology, such a photoresist pattern (not shown) as to cover the memory cell region 1A and the upper electrode UE is formed over the semiconductor substrate 1. Then, by dry etching using the photoresist pattern as an etching mask, portions of the silicon spacer (not shown) left in the peripheral circuit part are removed. Thereafter, the photoresist pattern is removed. Namely, in the first embodiment, the silicon spacer SP1 was removed. However, when the semiconductor device of the third modified example shown in FIG. 31 is manufactured, the silicon spacer SP1 is not removed, and is left, and is used as the memory gate electrode MG2.

Figure 33:
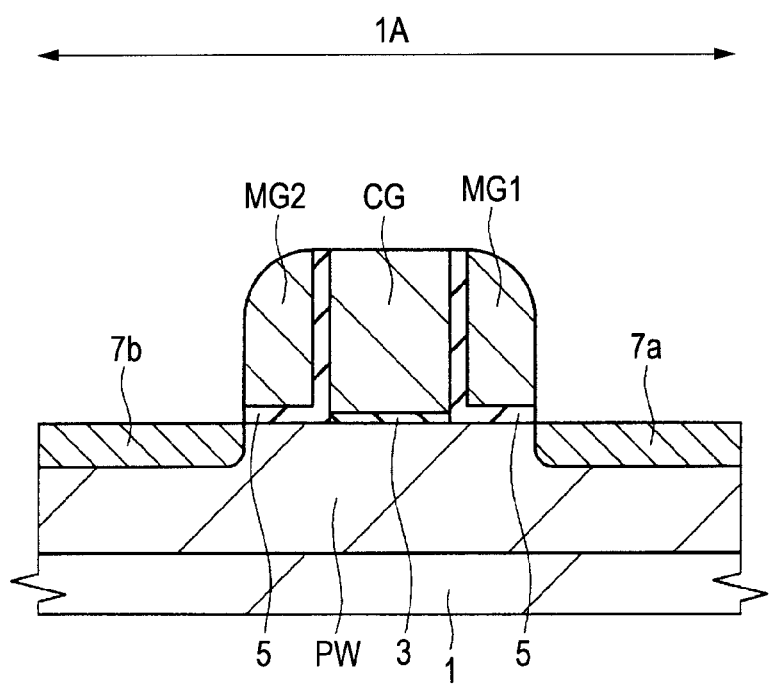
FIG. 33 is an essential part cross-sectional view of the semiconductor device during a manufacturing step following that of FIG. 32.

The step corresponding to Step S9 (etching back step of the silicon film 6n) is performed to form the memory gate electrodes MG1 and MG2. Then, the same step as Step S11 of the first embodiment is performed. As a result, as shown in FIG. 33, the exposed portions of the insulation film 5 not covered with the memory gate electrodes MG1 and MG2, and the upper electrode UE (not shown in FIG. 33) are removed by etching (e.g., wet etching). At this step, in the memory cell region 1A, a portion of the insulation film 5 situated under the memory gate electrode MG1, and between the memory gate electrode MG1 and the control gate electrode CG is not removed, and is left. Whereas, a portion of the insulation film 5 situated under the memory gate electrode MG2, and between the memory gate electrode MG2 and the control gate electrode CG is also not removed, and is left.

Then, the same step as Step S12 (ion implantation step of forming the n⁻ type semiconductor regions 7a and 7b) of the first embodiment is performed to form the n⁻ type semiconductor regions 7a and 7b. At this step, the n⁻ type semiconductor region 7a is formed in self-alignment with the sidewall of the memory gate electrode MG1 (sidewall on the side opposite to the side thereof adjacent to the control gate electrode CG via the insulation film 5) in the memory cell region 1A. The n⁻ type semiconductor region 7b is formed in self-alignment with the sidewall of the memory gate electrode MG2 (sidewall on the side opposite to the side thereof adjacent to the control gate electrode CG via the insulation film 5) in the memory cell region 1A.

Figure 34:
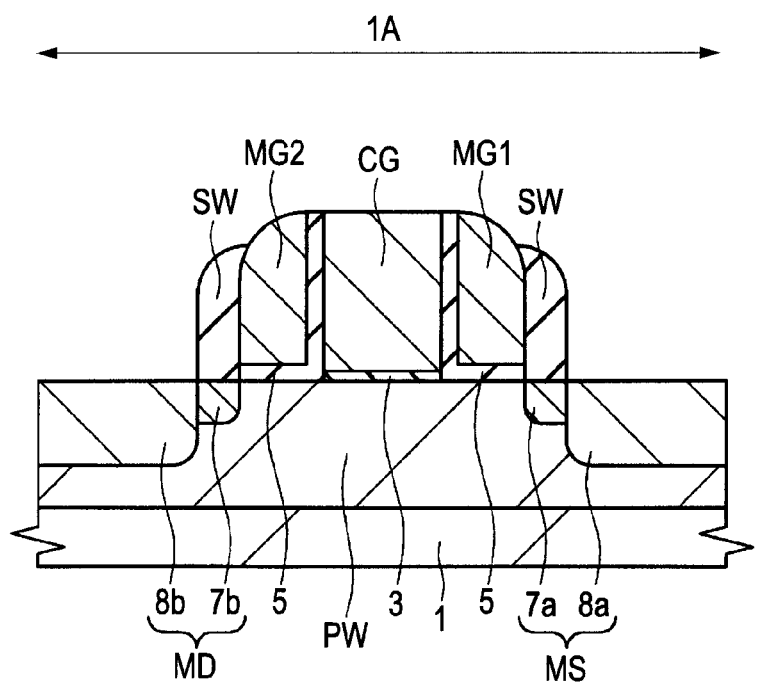
FIG. 34 is an essential part cross-sectional view of the semiconductor device during a manufacturing step following that of FIG. 33.

Then, the same step as Step S13 (the sidewall insulation film SW formation step) of the first embodiment is performed. As a result, as shown in FIG. 34, over the sidewalls of the memory gate electrodes MG1 and MG2 (sidewalls on the respective sides opposite to the sides thereof adjacent to the control gate electrode CG via the insulation film 5), the sidewall insulation film SW are formed.

Then, the same step as Step S14 (the ion implantation step of forming the n⁺ type semiconductor regions 8a and 8b) of the first embodiment is performed to form the n⁺ type semiconductor regions (impurity diffusion layers) 8a and 8b. At this step, in the memory cell region 1A, the n⁺ type semiconductor region 8a is formed in self-alignment with the sidewall insulation film SW over the sidewall of the memory gate electrode MG1. The n⁺ type semiconductor region 8b is formed in self-alignment with the sidewall insulation film SW over the sidewall of the memory gate electrode MG2.

Figure 35:
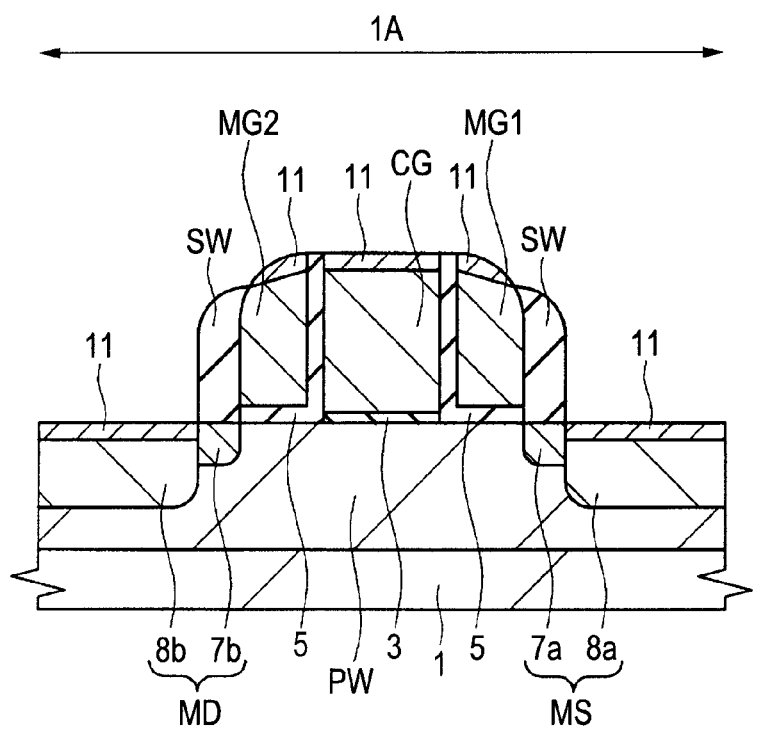
FIG. 35 is an essential part cross-sectional view of the semiconductor device during a manufacturing step following that of FIG. 34.

Then, in the same manner as in the first embodiment, as shown in FIG. 35, the metal silicide layers 11 are formed. The metal silicide layers 11 are formed at the tops (the top surfaces, surfaces, or top layer parts) of the control gate electrode CG, the memory gate electrodes MG1 and MG2, the n+ type semiconductor regions 8a and 8b, and the upper electrode UE (not shown in FIG. 35), respectively.

Then, in the same manner as in the first embodiment, the insulation film 12, the contact hole CNT, the plug PG, the insulation film 14, and the wire M1 are formed. However, these are not shown, and a detailed description thereon is omitted.

Also in the semiconductor device of the third modified example shown in FIG. 30, by applying the technology of the first embodiment (particularly, the configuration of the insulation film 5), it is possible to obtain the effects as described in the first embodiment.

Further, although not shown, a semiconductor device of a fourth modified example is a semiconductor device obtained in the following manner: over the control gate electrode CG of any of the semiconductor device of the present embodiment and the semiconductor devices of the first to third modified examples described in the present embodiment, a cap insulation film is further formed; and the memory gate electrodes MG (MG1 and MG2) are formed over the sidewalls of a lamination film of the control gate electrode CG and the cap insulation film. The insulation film 5 is situated under the memory gate electrodes MG (MG1 and MG2), and between the lamination film of the control gate electrode CG and the cap insulation film and the memory gate electrodes MG (MG1 and MG2). Also in the case of the semiconductor device of the fourth modified example, by applying the technology of the first embodiment (particularly, the configuration of the insulation film 5), it is possible to obtain the effects as described in the first embodiment. Further, also in the fourth modified example, the capacitive element C1 formed in the capacitor formation region 1B has the same configuration as that of the first embodiment, and the first to third modified examples. Over the lower electrode LE, an insulation film at the same layer as the cap insulation film is not formed, and is removed. This is for the following purpose: by removing the cap insulation film, the film thickness (of the insulation film) formed between the lower electrode LE and the upper electrode UE is reduced, which prevents the reduction of the capacitance.

The manufacturing steps of the semiconductor device of the fourth modified example are the same as the process flow of FIG. 8, except that, in the process flow of FIG. 8, between Step S5 and Step S6, a step of forming an insulation film to be the cap insulation film is added, that in Step S6, the insulation film to be the cap insulation film is also patterned simultaneously with the silicon film 4n, and that between Step S6 and Step S7, a step of removing the cap insulation film formed over the lower electrode LE is added. Therefore, a detailed description thereon is omitted.

Third Embodiment

In the first embodiment, the uppermost-layer insulation film 5d of the insulation film 5 was formed as an insulation film capable of causing Fermi level pinning, and an insulation film having a high dielectric constant; and further, the memory gate electrode MG was formed of the silicon film 6n. On the other hand, in the present embodiment, the insulation film 5 is formed of a lamination structure of a silicon oxide film 5a, a silicon nitride film 5b, and a silicon oxide film 5c; and the memory gate electrode MG is formed of a lamination film of a metal film 6mn and a silicon film 6n. Further, also in the present embodiment, the polarity is based on an n channel type MISFET as in the first embodiment.

Figure 36:
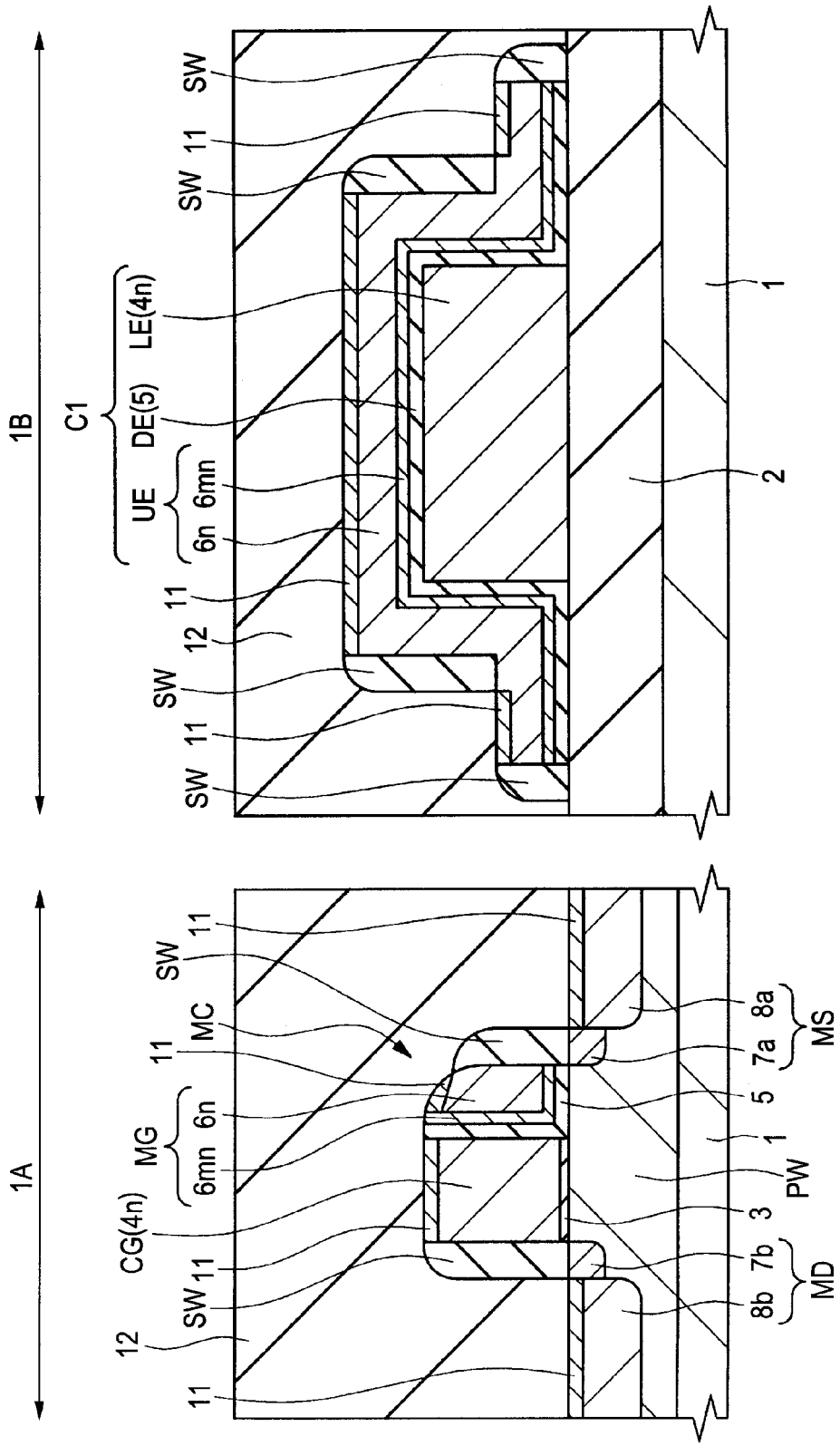
FIG. 36 is an essential part cross-sectional view of a semiconductor device which is another embodiment of the present invention.
Figure 37:
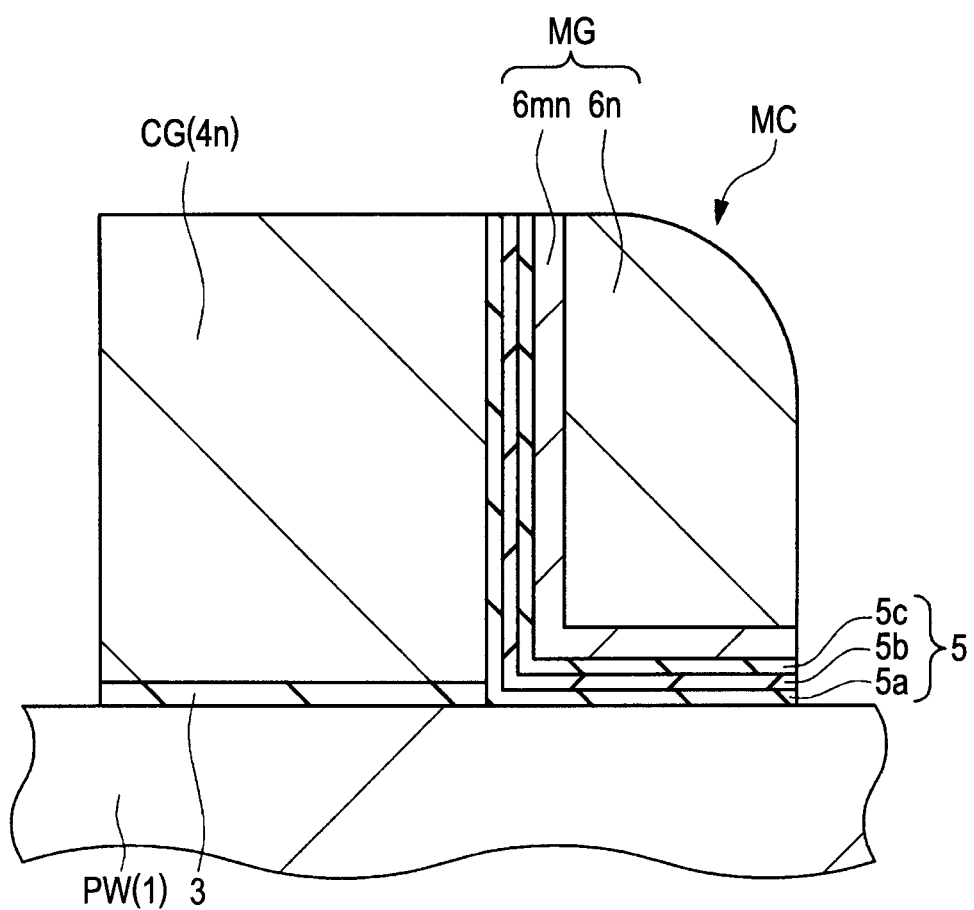
FIG. 37 is a partially enlarged cross-sectional view of a portion of FIG. 36 on an enlarged scale.
Figure 38:
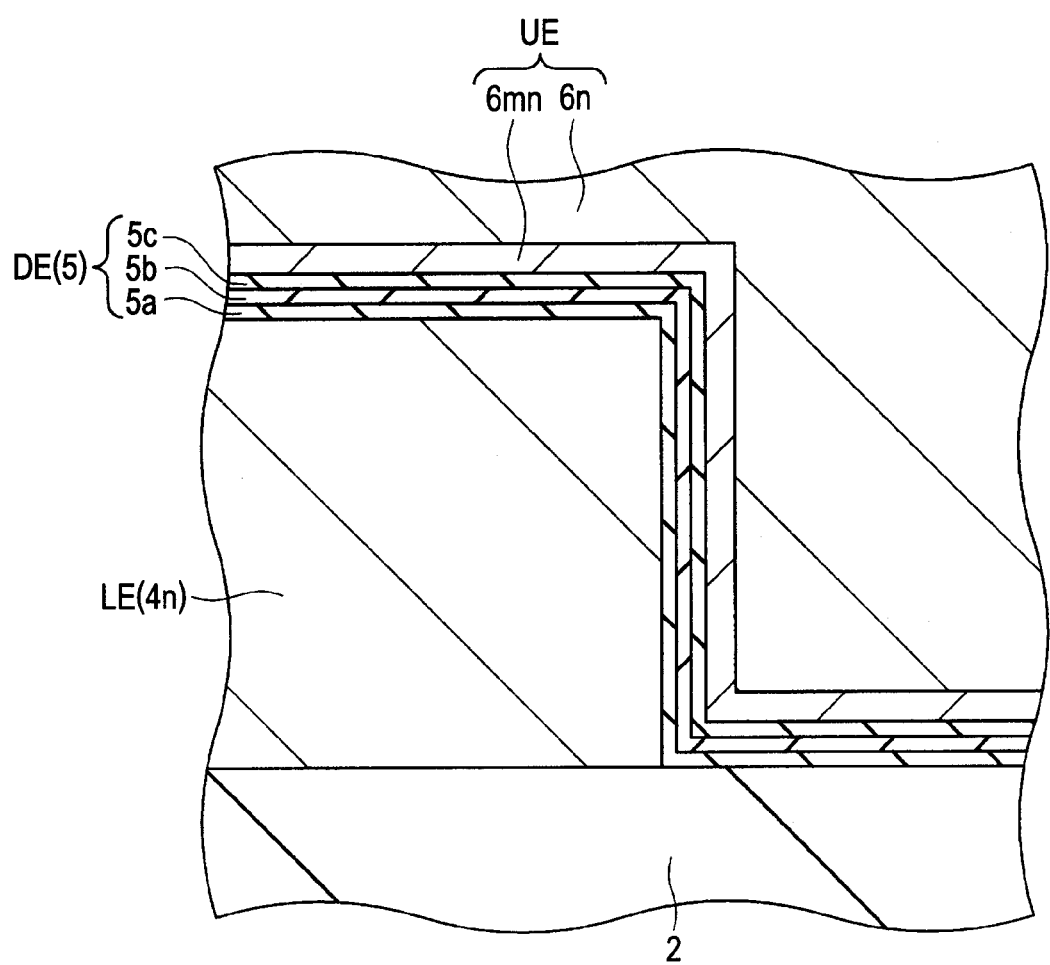
FIG. 38 is a partially enlarged cross-sectional view of a portion of FIG. 36 on an enlarged scale.

FIG. 36 is an essential part cross-sectional view of a semiconductor device of the present embodiment. FIG. 37 is a partially enlarged cross-sectional view (essential part cross-sectional view) of the memory cell MC in the semiconductor device of the present embodiment, and shows a part of FIG. 36 (a part of the memory cell region 1A) on an enlarged scale. FIG. 38 is a partially enlarged cross-sectional view (essential part cross-sectional view) of the capacitive element C1 in the semiconductor device of the present embodiment, and shows apart of FIG. 36 (a part of the capacitor formation region 1B) on an enlarged scale. Incidentally, FIGS. 36, 37, and 38 correspond to FIGS. 1, 2, and 4 of the first embodiment, respectively.

As shown in FIGS. 36 and 37, in the memory cell MC of the nonvolatile memory in the present embodiment, the insulation film 5 is formed in a lamination structure of the silicon oxide film 5a, the silicon nitride film 5b, and the silicon oxide film 5c. Specifically, the insulation film 5 in the present embodiment is formed of the silicon oxide film 5a, the silicon nitride film 5b over the silicon oxide film 5a, and the silicon oxide film 5c over the silicon nitride film 5b. Therefore, the insulation film 5 in the present embodiment is different in not having the insulation film 5d from the insulation film 5 in the first embodiment. Further, the memory gate electrode MG in the present embodiment is formed of a lamination film of the metal film 6mn (first metal film) and the n type silicon film 6n (first silicon film). The metal film 6mn is formed to extend from the sidewall of the control gate electrode CG over the semiconductor substrate via the insulation film 5. Namely, in the present embodiment, the memory gate electrode MG includes a lamination film of the metal film 6mn adjacent to the insulation film 5, and the n type silicon film 6n spaced apart from the insulation film 5 via the metal film 6mn. Therefore, the memory gate electrode MG in the present embodiment is different from the memory gate electrode MG in the first embodiment in that the silicon film 6n is not in contact with the insulation film 5, and in further having the metal film 6mn situated (interposed) between the silicon film 6n and the insulation film 5. As the main feature, the metal film 6mn has a large work function. More specifically, the work function of the metal film 6mn is 4.5 eV or more. For the metal film 6mn formed as the lower layer of the memory gate electrode MG, as a metal film having a work function of 4.5 eV or more, for example, titanium (Ti) or platinum (Pt) is used (i.e., the metal film 6mn is formed of Ti (titanium) or Pt (platinum)). As a result, the potential difference between the memory gate electrode MG and the semiconductor substrate 1 (p type well PW) is reduced. Other configurations of the memory cell MC of the present embodiment are the same as the configurations of the first embodiment, and hence a description thereon is omitted.

On the other hand, in the capacitive element C1, as shown in FIGS. 36 and 38, the capacitive insulation film DE is formed of the same layer as the insulation film 5 in the memory cell MC, i.e., in a lamination structure of the silicon oxide film 5a, the silicon nitride film 5b, and the silicon oxide film 5c; and the upper electrode UE is formed of the same layer as the memory gate electrode MG in the memory cell MC, i.e., in a lamination structure of the metal film 6mn and the silicon film 6n. Therefore, the capacitive insulation film DE in the present embodiment is different from the insulation film 5 in the first embodiment in not having the insulation film 5d. Whereas, the upper electrode UE in the present embodiment is different from the upper electrode UE in the first embodiment in that the silicon film 6*n* is not in contact with the capacitive insulation film DE, and in further having the metal film 6*mn* situated (interposed) between the silicon film 6*n* and the capacitive insulation film DE. In the capacitive insulation film DE, the silicon nitride film 5*b* is formed over the silicon oxide film 5*a*; and the silicon oxide film 5*c* is formed over the silicon nitride film 5*b*. Whereas, in the upper electrode UE, the silicon film 6*n* is formed over the metal film 6*mn*. By forming the metal film 6*mn* as the lower layer of the upper electrode UE of the capacitive element C1, it is possible to avoid a problem of depletion of the upper electrode UE. Therefore, it is possible to improve the precision as the capacitive element. Other configurations of the capacitive element C1 of the present embodiment are the same as the configurations of the first embodiment, and hence a description thereon is omitted.

The operation system of the memory cell MC, and the conditions for applying voltages in the present embodiment are also the same as those in the first embodiment, and hence a description thereon is omitted.

Figure 39:
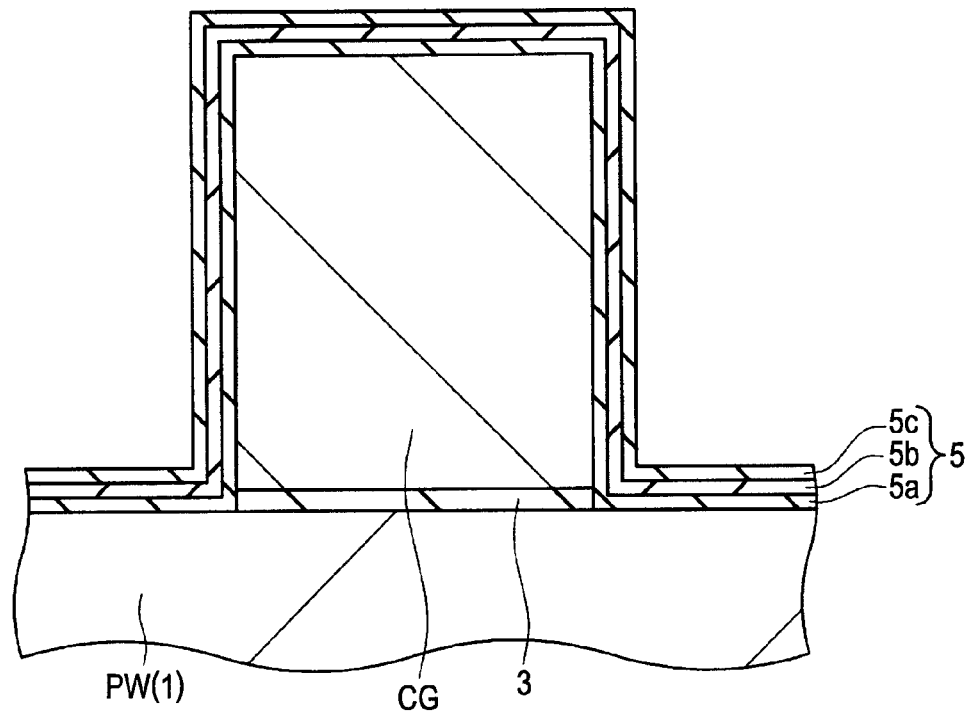
FIG. 39 is an essential part cross-sectional view of the semiconductor device during a manufacturing step of the other embodiment of the present invention.
Figure 40:
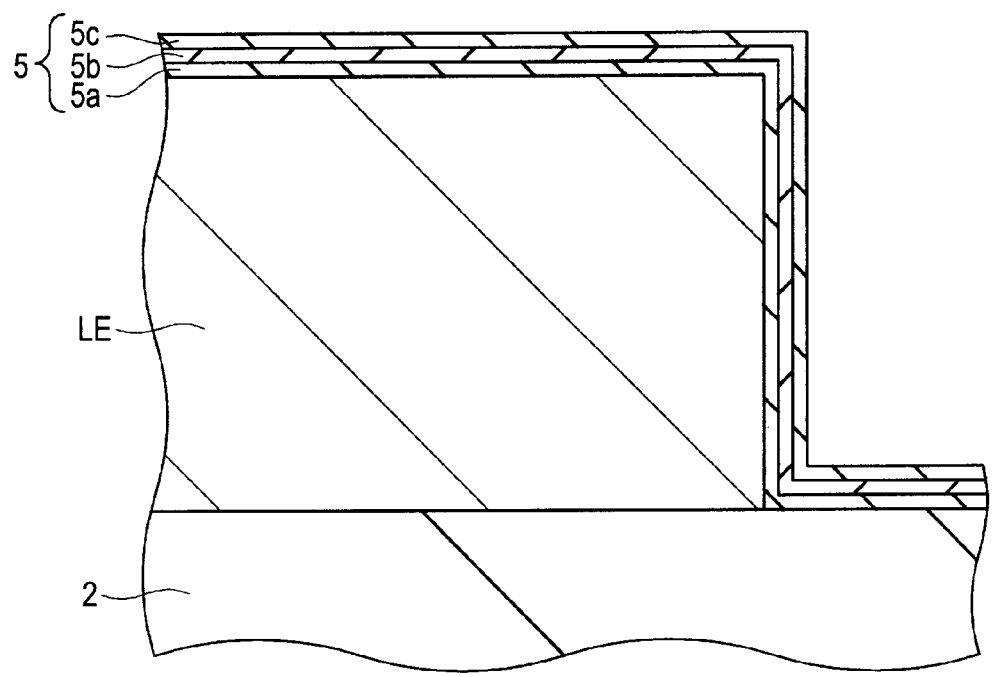
FIG. 40 is an essential part cross-sectional view during a manufacturing step of the same semiconductor device as that of FIG. 39.
Figure 41:
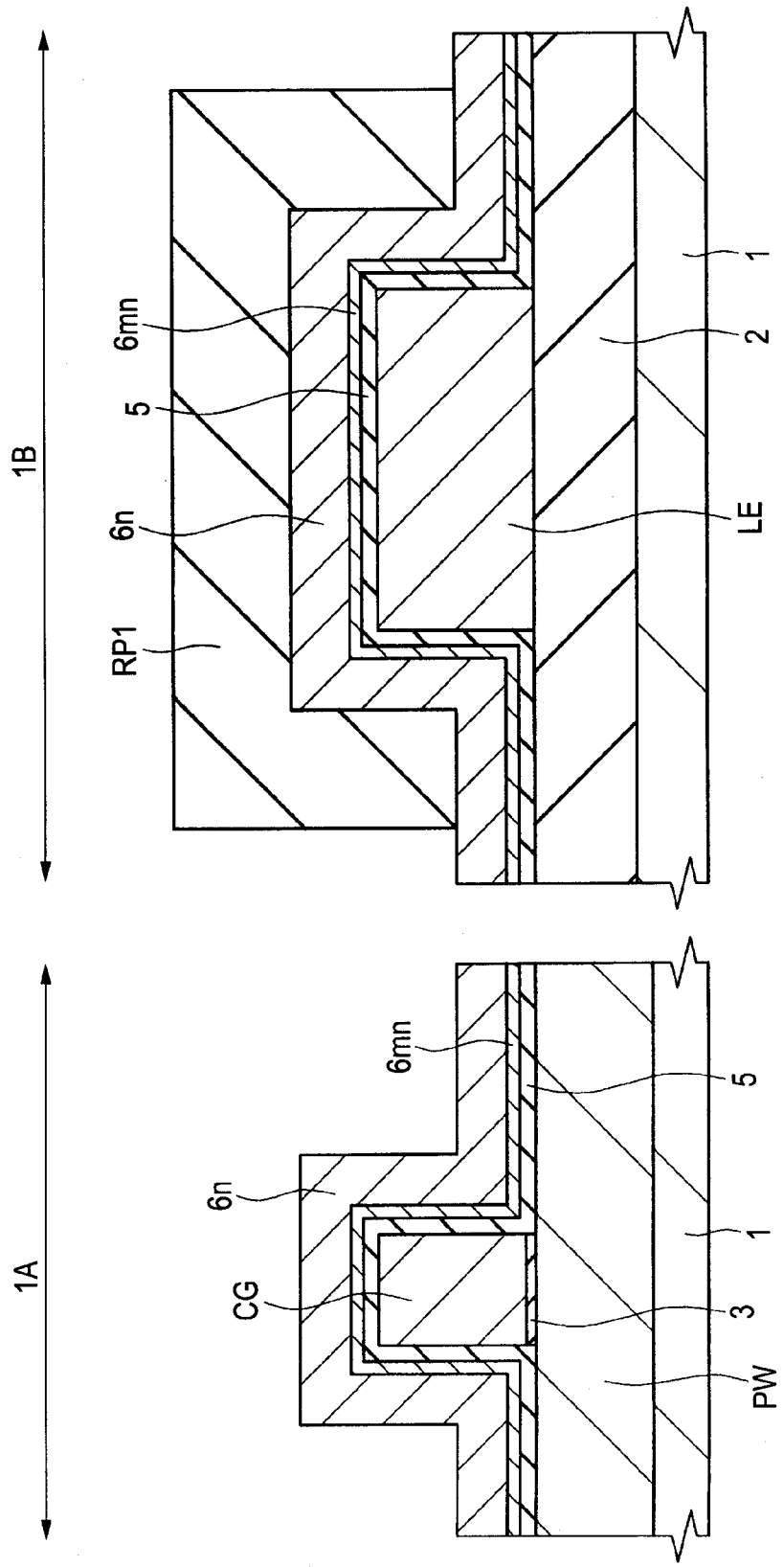
FIG. 41 is an essential part cross-sectional view of the semiconductor device during a manufacturing step following that of FIGS. 39 and 40.
Figure 42:
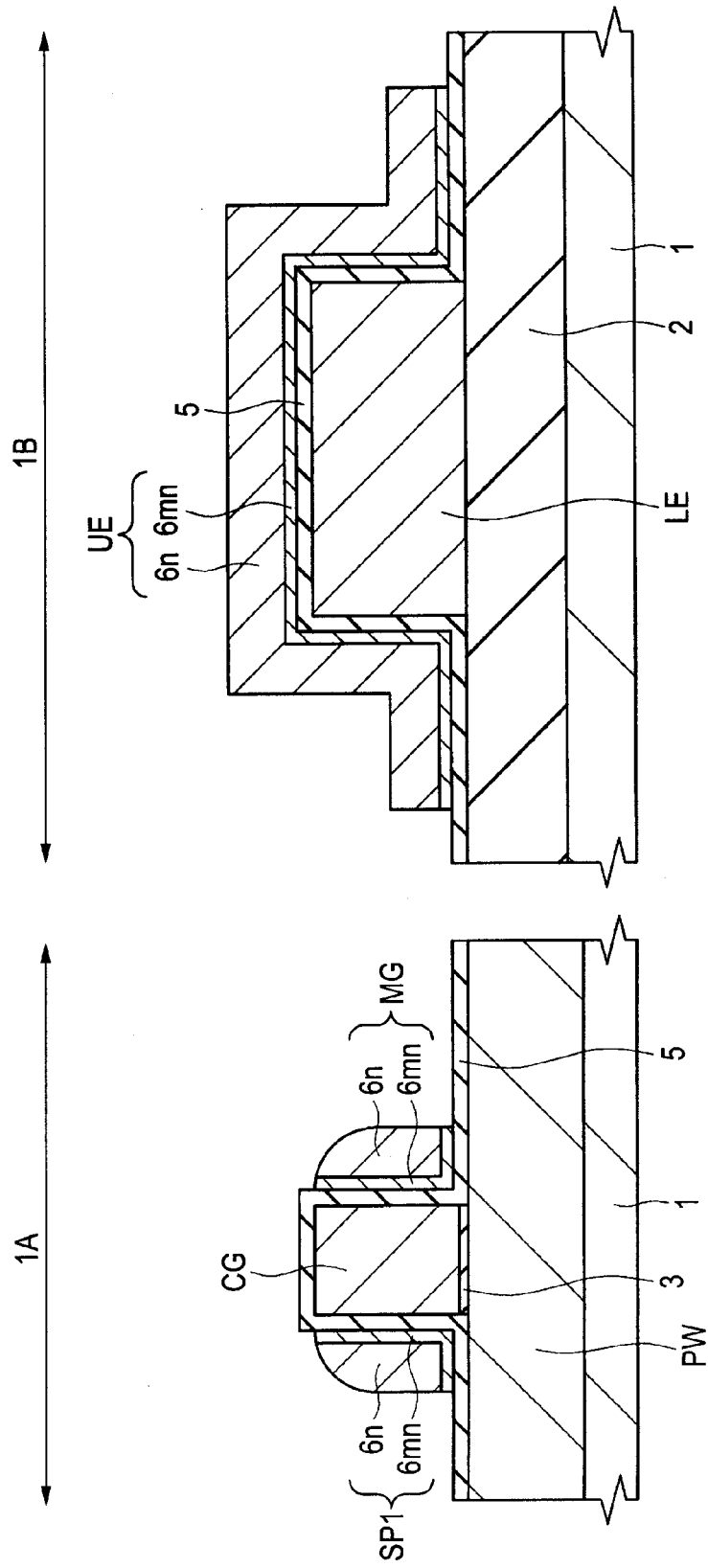
FIG. 42 is an essential part cross-sectional view of the semiconductor device during a manufacturing step following that of FIG. 41.
Figure 43:
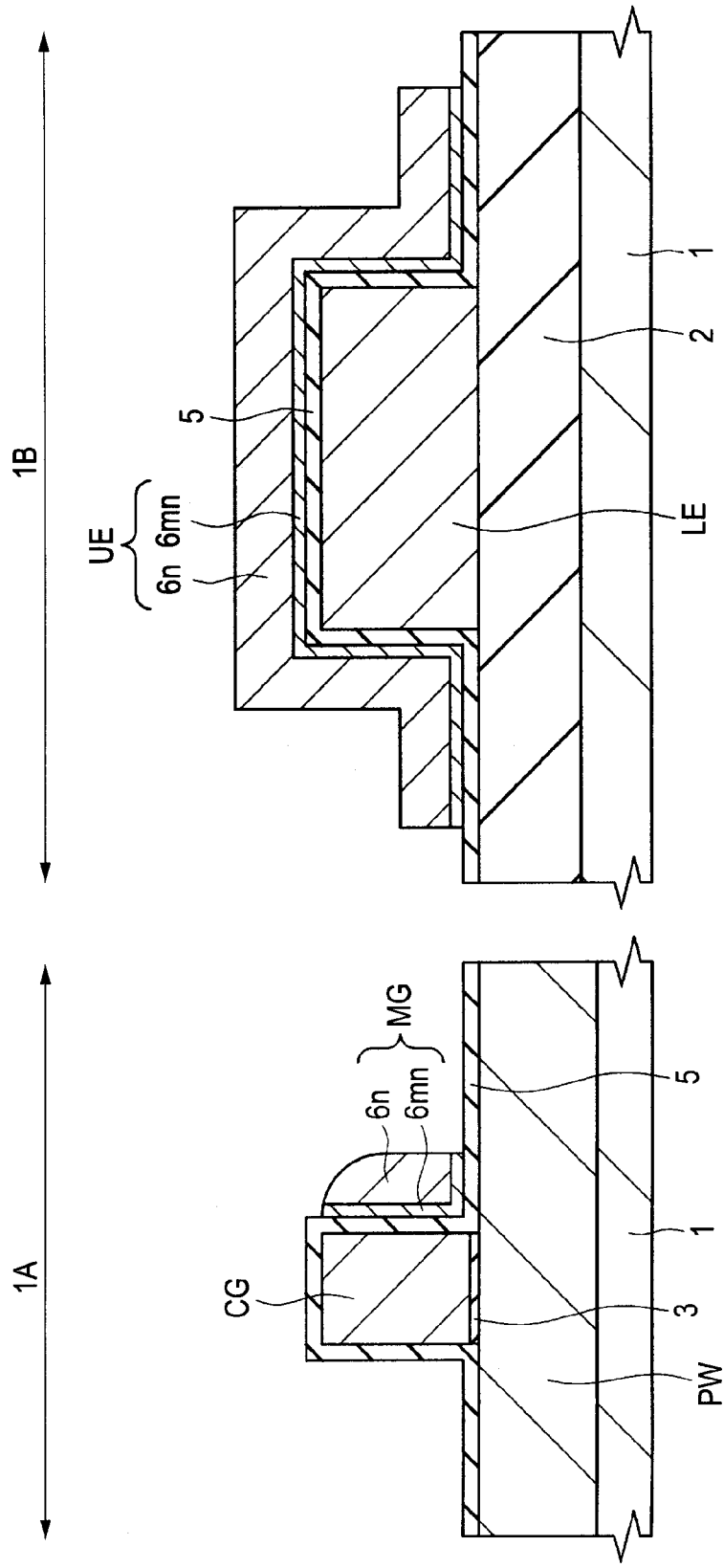
FIG. 43 is an essential part cross-sectional view of the semiconductor device during a manufacturing step following that of FIG. 42.

Then, a description will be given to a method for manufacturing a semiconductor device of the present embodiment. The manufacturing steps of the present embodiment will be described by reference to the process flow of FIG. 8. FIGS. 39 to 44 are each an essential part cross-sectional view of the semiconductor device in a manufacturing step of the present embodiment. Out of these, FIG. 39 corresponds to FIG. 13 of the first embodiment; FIG. 40 corresponds to FIG. 14 of the first embodiment; FIG. 41 corresponds to FIG. 15 of the first embodiment; FIG. 42 corresponds to FIG. 16 of the first embodiment; FIG. 43 corresponds to FIG. 17 of the first embodiment; and FIG. 44 corresponds to FIG. 18 of the first embodiment.

First, in the process flow of the FIG. 8, the manufacturing steps of Step S1 to Step S6 are the same as those in the first embodiment, and hence, herein, a description thereon is omitted.

In Step S6, as shown in FIG. 11, the silicon film 4*n* is patterned, thereby to form the control gate electrode CG and the lower electrode LE. Then, in Step S7, as shown in FIG. 12, over the main surface of the semiconductor substrate 1, over the surface (top surface and side surfaces) of the control gate electrode CG, and the surface (top surface and side surfaces) of the lower electrode LE, the insulation film 5 is formed. In Step S7 (insulation film 5 formation step), in the present embodiment, as shown in FIGS. 39 and 40, as the insulation film 5, there are formed the silicon oxide film 5*a*, the silicon nitride film 5*b*, and the silicon oxide film 5*c*. In the present embodiment, as distinct from the first embodiment, as the insulation film 5, the insulation film 5*d* is not formed. In the present embodiment, the formation methods, film thicknesses, and materials of respective insulation films (i.e., the silicon oxide film 5*a*, the silicon nitride film 5*b*, and the silicon oxide film 5*c*) formed as the insulation film 5 are the same as those in the first embodiment (the same except that the insulation film 5*d* is not formed). Therefore, herein, a description thereon is omitted.

Then, in Step S8, as shown in FIG. 41 corresponding to FIG. 15, over the entire main surface of the semiconductor substrate 1, namely, over the insulation film 5, in such a manner as to cover the control gate electrode CG in the memory cell region 1A, and to cover the lower electrode LE in the capacitor formation region 1B, the metal film 6*mn* and the silicon film 6*n* are sequentially formed. Namely, over the insulation film 5, the metal film 6*mn* is formed. Over the metal film 6*mn*, the silicon film 6*n* is formed. The metal film 6*mn* is formed of, as a metal film having a work function of 4.5 eV or more, for example, titanium (Ti) or platinum (Pt) (i.e., the metal film 6*mn* is, for example, a Ti film or a Pt film). The minimum film thickness to such a degree as to allow control of the work function can be set at, for example, about 10 nm. The silicon film 6*n* is an n type polysilicon film, and can be set to have a thickness of, for example, about 30 to 150 nm. The metal film 6*mn* is formed with a film thickness smaller than that of the silicon film 6*n*.

Therefore, in Step S7, in the first embodiment, a single film of the silicon film 6*n* was formed. In contrast, in the present embodiment, a lamination film of the metal film 6*mn* and the silicon film 6*n* is formed. The steps subsequent to this step (Step S7) are performed almost in the same manner as the manufacturing steps of the first embodiment, except that a lamination film of the metal film 6*mn* and the silicon film 6*n* is used in place of the silicon film 6*n* in the first embodiment.

Then, as with the first embodiment, as shown in FIG. 41 corresponding to FIG. 15, using a photolithography method, over the silicon film 6*n* in the upper electrode UE forming region in the capacitor formation region 1B, a photoresist pattern RP1 is formed.

Then, in Step S9, as shown in FIG. 42 corresponding to FIG. 16, by an anisotropic etching technology, the silicon film 6*n* and the metal film 6*mn* are etched back (etched, dry etched, or anisotropically etched). In the etching back step of Step S9, over both the sidewalls of the control gate electrode CG (via the insulation film 5), the lamination film of the silicon film 6*n* and the metal film 6*mn* is left each in a sidewall spacer form, resulting in the memory gate electrode MG and the silicon spacer SP1. Under the photoresist pattern RP1 (not shown in FIG. 42), a portion of the lamination film of the silicon film 6*n* and the metal film 6*mn* is left, resulting in the upper electrode UE. Portions of the silicon film 6*n* and the metal film 6*mn* in other regions are removed. At this step, in order that (the memory gate electrode MG and the silicon spacer SP1 including) the lamination film of the metal film 6*mn* and the silicon film 6*n* (are) is formed in a sidewall spacer form with precision, the metal film 6*mn* is preferably formed at least thinner than the silicon film 6*n*. However, as described above, the metal film 6*mn* is required to have a minimum film thickness to such a degree as to allow control of the work function. Therefore, in the present embodiment, the foregoing film thickness is adopted. In each of the memory gate electrode MG and the silicon spacer SP1, the metal film 6*mn* is formed to extend from the sidewall of the control gate electrode CG over the semiconductor substrate via the insulation film 5. After the etching back step of Step S9, the photoresist pattern RP1 is removed, and in FIG. 42, this stage is shown.

In the first embodiment, each of the memory gate electrode MG and the silicon spacer SP1 was formed of the silicon film 6*n* left in a sidewall spacer form. However, in the present embodiment, each of the memory gate electrode MG and the silicon spacer SP1 is formed of a lamination film of the metal film 6*mn* and the silicon film 6*n* left in a sidewall spacer form. The present embodiment is different in this respect from the first embodiment. Further, in the first embodiment, the upper electrode UE was formed of the silicon film 6*n*. However, in the present embodiment, the upper electrode UE is formed of a lamination film of the metal film 6*mn* and the silicon film 6*n*. The present embodiment is different from the first embodiment in this respect.

Then, as with the first embodiment, in Step S10, as shown in FIG. 43 corresponding to FIG. 17, by dry etching using a photolithography technology, the memory gate electrode MG and the upper electrode UE including the lamination film of the metal film 6*mn* and the silicon film 6*n* are left; and the sidewall spacer SP1 including the lamination film of the metal film 6*mn* and the silicon film 6*n* and formed on the opposite side of the memory gate electrode MG is removed.

Figure 44:
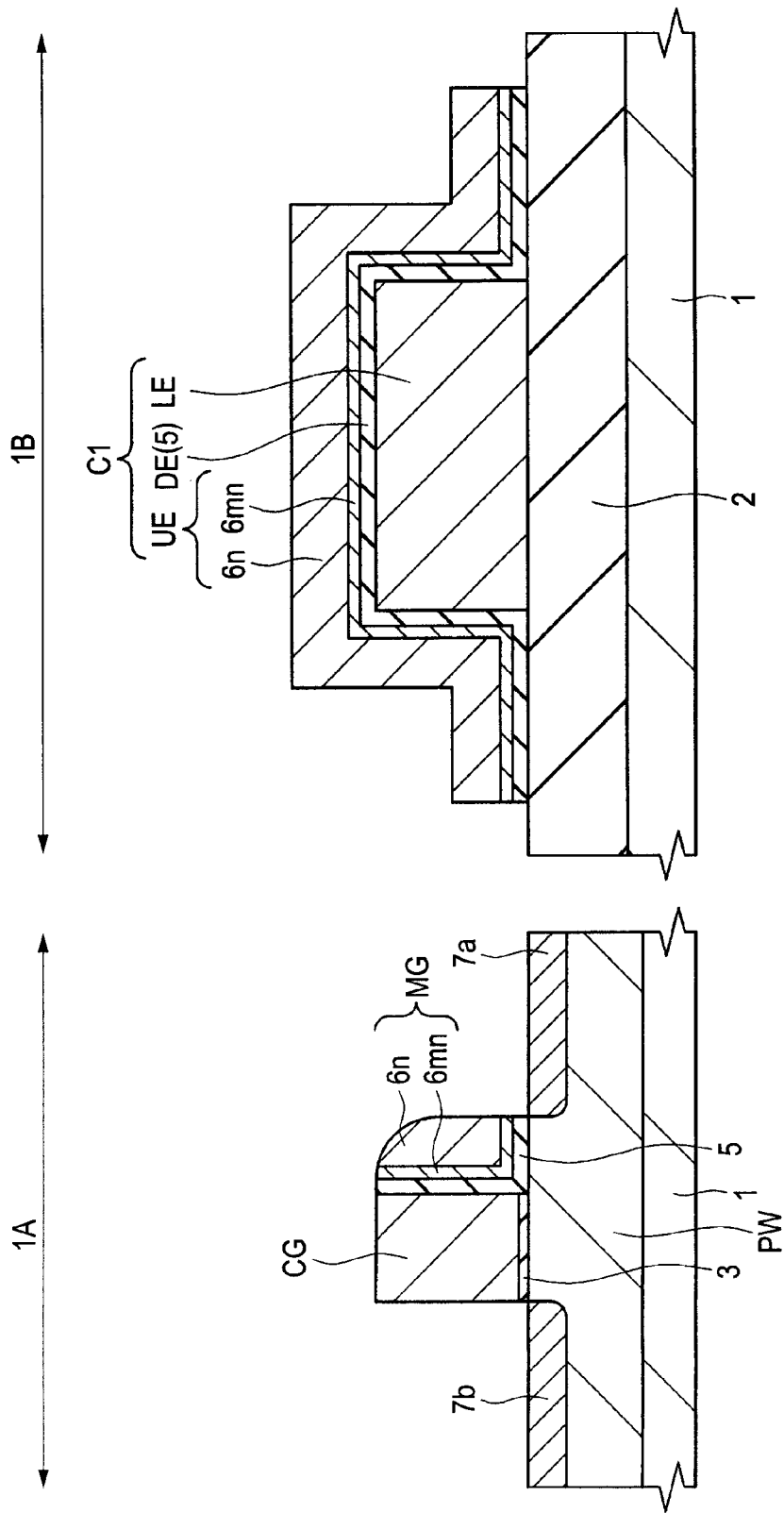
FIG. 44 is an essential part cross-sectional view of the semiconductor device during a manufacturing step following that of FIG. 43.

Then, as with the first embodiment, in Step S11, as shown in FIG. 44 corresponding to FIG. 18, the exposed portions of the insulation film 5 not covered with the memory gate electrode MG and the upper electrode UE are removed by etching. At this step, in the memory cell region 1A, a portion of the insulation film 5 situated under the memory gate electrode MG, and between the memory gate electrode MG and the control gate electrode CG is not removed, and is left; and in the capacitor formation region 1B, a portion of the insulation film 5 situated under the upper electrode UE is not removed, and is left. Whereas, portions of the insulation film 5 in other regions are removed. In the capacitor formation region 1B, the portion of the insulation film 5 left under the upper electrode UE becomes the capacitive insulation film DE of the capacitive element C1.

The subsequent steps of Step S12 to Step S14 are the same as those in the first embodiment, and hence, herein, a description thereon is omitted.

Then, as with the first embodiment, using a salicide technology, over the tops of the control gate electrode CG, the silicon film 6*n* forming the memory gate electrode MG, the n+ type semiconductor regions 8*a* and 8*b*, and the silicon film 6*n* forming the upper electrode UE, the metal silicide layers 11 are formed, respectively. Then, as with the first embodiment, as an interlayer insulation film, the insulation film 12 is formed. In the insulation film 12, the contact hole CNT is formed. In the contact hole CNT, the plug PG is formed, and the insulation film 14 and the wire M1 to be coupled with the plug PG are formed. However, herein, these are not shown, and a detailed description thereon is omitted.

The first comparative example shown in FIG. 24 has the following problems: a phenomenon that during the erase state, holes h1 in the silicon nitride film 105*b* are unnecessarily extracted toward the semiconductor substrate; and a phenomenon that during the erase state, electrons e1 are unnecessarily injected from the semiconductor substrate side. In order to inhibit or prevent the phenomena, in the present embodiment, the memory gate electrode MG is formed of a lamination film of the lower-layer metal film 6*mn* and the upper-layer silicon film 6*n*. For the metal film 6*mn*, a metal film with a work function of 4.5 eV or more is used. By forming the memory cell MC in the present embodiment as described above, the potential difference between the memory gate electrode MG and the semiconductor substrate 1 is reduced. In other words, the metal film 6*mn* with a work function of 4.5 eV or more is formed in contact with the insulation film 5 which is the gate insulation film of the memory transistor. As a result, as with the first embodiment, it is possible to obtain an action capable of providing almost the same energy band structure as that obtained when in the semiconductor device of the first comparative example (FIG. 24), the memory gate electrode MG101 is applied with some negative potential (e.g., about −0.5 V) (the energy band structure is not shown). By this action, in the present embodiment, it is possible to obtain the following effects.

Namely, it is possible to inhibit the phenomenon that holes h1 accumulated in the silicon nitride film 5*b* are unnecessarily extracted toward the semiconductor substrate 1. Further, it is possible to inhibit the phenomenon that electrons e1 are unnecessarily injected from the semiconductor substrate 1 side into the silicon nitride film 5*b*. This can inhibit or prevent the data (erase state) from being eliminated by the phenomena. It is possible to improve the holding characteristic of the data of the nonvolatile memory, i.e., the stored information of the nonvolatile memory. Therefore, it is possible to improve the performances of the semiconductor device having a nonvolatile memory.

Further, in the present embodiment, over the insulation film 5, as the lower-layer film of the memory gate electrode MG, the metal film 6*mn* with a large work function is formed. This controls the energy band structures of the memory gate electrode MG, the insulation film 5, and the p type well PW. As a result, it is possible to inhibit or prevent the data (erase state) from being eliminated by the phenomena (the phenomena schematically indicated with the arrows 21 and 22). For this reason, even when a negative potential is not applied to the memory gate electrode MG of the memory cell in the wait state in which any operation of write, erase, and read is not performed, it is possible to inhibit or prevent the data (erase state) from being eliminated. Therefore, in the memory cell in the wait state in which any operation of write, erase, and read is not performed, the electric potential to be supplied to the memory gate electrode MG can be set at 0 V. Accordingly, it is possible to simplify the circuit configuration of the semiconductor device having a nonvolatile memory. Further, it is possible to reduce the power consumption.

Whereas, a comparison is made between the case where in the semiconductor device of the first comparative example (FIG. 24), the memory gate electrode MG101 is applied with 0 V (zero volt), and the case where in the semiconductor device of the present embodiment, the memory gate electrode MG is applied with 0 V (zero volt). As a result, it is found as follows: over the insulation film 5, as the lower-layer film of the memory gate electrode MG, the metal film 6*mn* with a work function of 4.5 eV or more is formed; consequently, the threshold value of the memory transistor is higher with the semiconductor device of the present embodiment. For this reason, in the present embodiment, it is possible to reduce the amount of electrons to be injected into the silicon nitride film 5*b* in the insulation film 5 for write. Therefore, the write speed can also be improved.

Further, in the present embodiment, in the same semiconductor substrate 1, the nonvolatile memory and the capacitive element C1 are formed. Then, the lamination film of the metal film 6*mn* and the silicon film 6*n* at the same layer as the memory gate electrode MG of the memory cell MC of the nonvolatile memory is used as the upper electrode UE of the capacitive element C1. Namely, of the same-layer films formed in the same step as that for the lamination film of the metal film 6*mn* and the silicon film 6*n*, one is used as the memory gate electrode MG in the memory cell region 1A, and the other is used as the upper electrode UE in the capacitor formation region 1B. Therefore, the lamination film of the metal film 6*mn* and the silicon film 6*n* formed in contact with the insulation film 5 in the memory cell region 1A and the upper electrode UE formed over the capacitive insulation film DE (insulation film 5) in the capacitor formation region 1B have the same layer structure.

In the present embodiment, over the capacitive insulation film DE (insulation film 5), the upper electrode UE including a lamination film of the metal film 6*mn* as the lower layer and the silicon film 6*n* as the upper layer is formed. The metal film 6*mn* is formed in contact with the capacitive insulation film DE. Accordingly, it is possible to avoid the problem of depletion of the upper electrode UE. Therefore, it is possible to improve the precision as the capacitive element, and it is possible to improve the performances of the semiconductor device.

Further, for the memory gate electrode MG in the memory cell region 1A and the upper electrode UE of the capacitive element C1 in the capacitor formation region 1B, the lamination films of the metal film 6*mn* and the silicon film 6*n* at the same layer formed in the same step are used. As a result, it is possible to reduce the number of manufacturing steps of the semiconductor device having (the memory cell MC of) the nonvolatile memory and the capacitive element C1.

The semiconductor device of the present embodiment is not limited to the memory cell of a structure (a split gate type memory cell structure) in which the control gate electrode CG and the memory gate electrode MG are adjacent to each other via the insulation film 5 as shown in FIGS. 36 and 37. It is also applicable to the memory cell in which the control gate electrode CG is not formed, and which includes the insulation film 5 and the memory gate electrode MG. This has the same effects as those of the split gate type memory cell structure.

In that case, in the memory cell, over the insulation film 5 formed over the semiconductor substrate 1, the memory gate electrode MG is formed. The memory gate electrode MG is formed of a lamination film of the metal film 6*mn* as the lower layer, and the silicon film 6*n* as the upper layer. When such a memory cell is formed, the lower electrode LE of the capacitive element C1 can be formed of, for example, a silicon film at the same layer as the gate electrode of the MISFET forming the peripheral circuit formed over the same substrate as that for the memory cell MC and the capacitive element C1.

Fourth Embodiment

The present embodiment is a modified example of the third embodiment. A description will be given to another nonvolatile memory to which the technology of the third embodiment is applicable.

Figure 45:
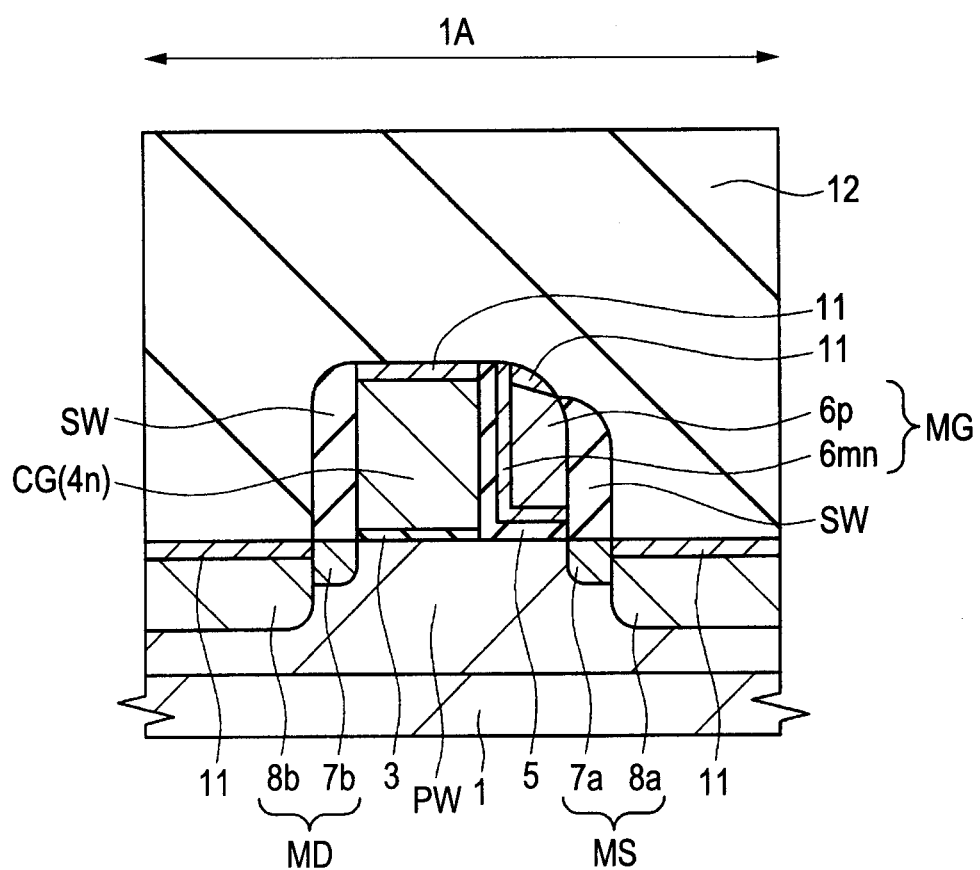
FIG. 45 is an essential part cross-sectional view of a first modified example (fifth modified example) of the semiconductor device of FIG. 36.

FIG. 45 is an essential part cross-sectional view of the semiconductor device of a first modified example of the third embodiment, and corresponds to FIG. 36. However, the capacitor formation region 1B is not shown, and only the memory cell region 1A is shown. Herein, to avoid confusion with the semiconductor device of the first modified example of the first embodiment shown in FIG. 29, the semiconductor device of the first modified example of the third embodiment shown in FIG. 45 will be hereinafter referred to as a semiconductor device of a fifth modified example.

In the semiconductor device of the third embodiment, the memory gate electrode MG was formed of a lamination film of the metal film 6*mn* including a metal material with a work function of 4.5 eV or more, and the silicon film 6*n* which is an n type silicon film. However, in the semiconductor device of the fifth modified example shown in FIG. 45, the memory gate electrode MG is formed of a lamination film of the metal film 6*mn* including a metal material with a work function of 4.5 eV or more, and a silicon film 6*p* which is a p type silicon film. Namely, the memory gate electrode MG in the fifth modified example shown in FIG. 45 includes a lamination of the metal film 6*mn* adjacent to the insulation film 5, and the p type silicon film 6*p* spaced apart from the insulation film 5 via the metal film 6*mn*. The silicon film 6*p* has a low resistivity by including p type impurities introduced therein, and is preferably a p type polysilicon film (p type impurities-introduced polysilicon film or doped polysilicon film).

The manufacturing steps of the semiconductor device of the fifth modified example shown in FIG. 45 can be performed in the same manner as in the third embodiment, except that in Step S8 of FIG. 41, the p type silicon film 6*p* is formed in place of the formation of the n type silicon film 6*n*.

Further, in the case of the semiconductor device of the fifth modified example shown in FIG. 45, in Step S8 of FIG. 41, the p type silicon film 6*p* is formed in place of the n type silicon film 6*n*. As a result, the upper electrode UE (not shown in FIG. 45) of the capacitive element C1 is formed of a lamination film of the metal film 6*mn*, and the p type silicon film 6*p* over the metal film 6*mn*. Other configurations of the semiconductor device of the fifth modified example shown in FIG. 45 are the same as those of the semiconductor device of the third embodiment, and hence, herein, a description thereon is omitted.

Figure 46:
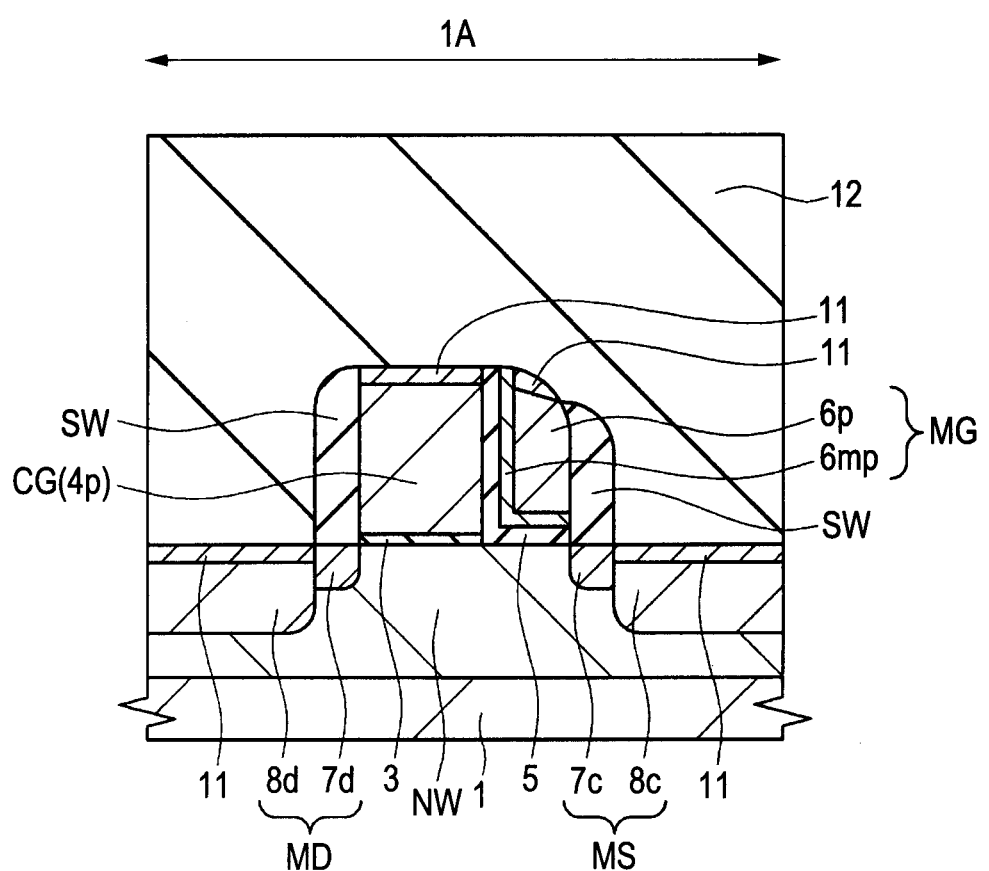
FIG. 46 is an essential part cross-sectional view of the second modified example (sixth modified example) of the semiconductor device of FIG. 36.

FIG. 46 is an essential part cross-sectional view of a semiconductor device of a second modified example of the third embodiment, and corresponds to FIG. 36. However, the capacitor formation region 1B is not shown, but only the memory cell region 1A is shown. Herein, to avoid confusion with the semiconductor device of the second modified example of the first embodiment shown in FIG. 30, the semiconductor device of the second modified example of the third embodiment shown in FIG. 46 will be hereinafter referred to as a semiconductor device of a sixth modified example.

In the semiconductor device of the third embodiment, the memory gate electrode MG was formed of a lamination film of the metal film 6*mn* including a metal material with a work function of 4.5 eV or more, and the silicon film 6*n* which is an n type silicon film. However, in the semiconductor device of the sixth modified example shown in FIG. 46, the memory gate electrode MG is formed of a lamination film of the metal film 6*mp* (second metal film) including a metal material with a work function of 4.5 eV or less, and the silicon film 6*p* (second silicon film) which is a p type silicon film. Namely, the memory gate electrode MG in the sixth modified example shown in FIG. 46 includes a lamination film of the metal film 6*mp* adjacent to the insulation film 5, and the p type silicon film 6*p* spaced apart from the insulation film 5 via the metal film 6*mp*. Accordingly, the work function of the metal film 6*mn* forming the memory gate electrode MG of the third embodiment is 4.5 eV or more. However, the work function of the metal film 6*mp* forming the memory gate electrode MG of the sixth modified example shown in FIG. 46 is 4.5 eV or less. For the metal film 6*mp*, as a metal with a work function of 4.5 eV or less, there is used, for example, Ta (tantalum), Al (aluminum), or La (lanthanum (i.e., the metal film 6*mp* is formed of Ta (tantalum), Al (aluminum), or La (lanthanum)). The silicon film 6*p* has a low resistivity by including p type impurities introduced therein, and is preferably a p type polysilicon film. Further, in the semiconductor device of the third embodiment, the silicon film 4*n* forming the control gate electrode CG was an n type silicon film. However, in the semiconductor device of the sixth modified example shown in FIG. 46, the control gate electrode CG includes the p type silicon film 4*p* in place of the silicon film 4*n*. The silicon film 4*p* has a low resistivity by including p type impurities introduced therein, and is preferably a p type polysilicon film. Further, the region which was the p type well PW in the semiconductor device of the third embodiment has been inverted in conductivity type, and is an n type well NW in the semiconductor device of the sixth modified example shown in FIG. 46. Further, the regions which were the n⁻ type semiconductor region 7*a*, the n⁻ type semiconductor region 7*b*, the n⁺ type semiconductor region 8*a*, and the n⁺ type semiconductor region 8*b* in the semiconductor device of the third embodiment have been inverted in conductivity type, and are a p⁻ type semiconductor region 7*c*, p⁻ type semiconductor region 7*d*, a p⁺ type semiconductor region 8*c*, and a p⁺ type semiconductor region 8*d*, respectively, in the semiconductor device of the sixth modified example shown in FIG. 46.

Further, the manufacturing steps of the semiconductor device of the sixth modified example shown in FIG. 46 will be described based on the manufacturing steps of the third embodiment. In Step S3, in place of the p type well PW, an n type well NW is formed. In Step S5, in place of the n type silicon film 4n, a p type silicon film 4p is formed. Then, in Step S8 of FIG. 41, in place of the metal film 6mn with a work function of 4.5 eV or more, and the n type silicon film 6n, there are formed a metal film 6mp with a work function of 4.5 eV or less, and a p type silicon film 6p. Then, in Step S12, in place of the n⁻ type semiconductor regions 7a and 7b, there are formed p⁻ type semiconductor regions 7c and 7d. In Step S14, in place of the n⁺ type semiconductor regions 8a and 8b, there are formed p⁺ type semiconductor regions 8c and 8d. Other procedures can be performed in the same manner as in the third embodiment.

Further, in the case of the semiconductor device of the sixth modified example shown in FIG. 46, in place of the n type silicon films 4n and 6n, there are formed the p type silicon films 4p and 6p. In place of the metal film 6mn which is a metal with a work function of 4.5 eV or more, there is formed the metal film 6mp which is a metal with a work function of 4.5 eV or less. As a result, the lower electrode LE (not shown in FIG. 46) of the capacitive element C1 is formed of the p type silicon film 4p; and the upper electrode UE (not shown in FIG. 46) is formed of a lamination film of the metal film 6mp which is a metal film with a work function of 4.5 eV or less, and the p type silicon film 6p over the metal film 6mp. Other configurations of the semiconductor device of the sixth modified example shown in FIG. 46 are the same as those of the semiconductor device of the third embodiment, and hence, herein, a description thereon is omitted.

Therefore, in the semiconductor device of the third embodiment, the control transistor (MISFET having the control gate electrode CG) and the memory transistor (MISFET having the memory gate electrode MG) were both n channel type MISFETs. The control gate electrode CG was formed of an n type silicon, and the memory gate electrode MG was formed of a lamination film of a metal film with a work function of 4.5 eV or more, and an n type silicon. On the other hand, in the semiconductor device of the fifth modified example shown in FIG. 45, the control transistor (MISFET having the control gate electrode CG), and the memory transistor (MISFET having the memory gate electrode MG) are both n channel type MISFETs. The control gate electrode CG is formed of an n type silicon, and the memory gate electrode MG is formed of a lamination film of a metal film with a work function of 4.5 eV or more, and a p type silicon. Further, in the semiconductor device of the sixth modified example shown in FIG. 46, the control transistor (MISFET having the control gate electrode CG), and the memory transistor (MISFET having the memory gate electrode MG) are both p channel type MISFETs. The control gate electrode CG is formed of a p type silicon. The memory gate electrode MG is formed of a lamination film of a metal film with a work function of 4.5 eV or less, and a p type silicon. The configuration of the insulation film 5 is the same as those of the semiconductor device of the third embodiment, the semiconductor device of the fifth modified example shown in FIG. 45, and the semiconductor device of the sixth modified example shown in FIG. 46.

Also in the case of the semiconductor device of the fifth modified example shown in FIG. 45, or in the case of the semiconductor device of the sixth modified example shown in FIG. 46, by applying the technology of the third embodiment (particularly, the configuration of the memory gate electrode MG), it is possible to obtain the effects as described in the third embodiment.

In the case of the semiconductor device of the fifth modified example shown in FIG. 45, the memory gate electrode MG is formed of a lamination film of the metal film 6mn with a work function of 4.5 eV or more as the lower layer, and the p type silicon film 6p as the upper layer. Accordingly, the potential difference between the memory gate electrode MG and the semiconductor substrate 1 (P type well PW) is smaller than that of the semiconductor device of the third embodiment. In this case, it is possible to obtain larger effects than the effects described in the third embodiment. Further, in general, when the upper electrode and the lower electrode of the capacitive element are formed of silicon films of mutually different, conductivity types, both the upper electrode and the lower electrode may be depleted. Accordingly, the variation in capacitance may be increased, resulting in reduction of the precision as the capacitive element. In contrast, the lower layer of the upper electrode UE is formed of the metal film 6mn as in the fifth modified example. As a result, it is possible to avoid the problem of depletion of the upper electrode UE. Accordingly, the variation in capacitance is decreased, resulting in an improvement of the precision as the capacitive element. This enables the improvement of the performances of the semiconductor device.

In the case of the semiconductor device of the sixth modified example shown in FIG. 46, the memory cell is formed of a p channel type MISFET, and is opposite in conductivity type to the semiconductor device of the third embodiment. Further, the memory gate electrode MG is formed of a lamination film of the metal film 6mp with a work function of 4.5 eV or less as the lower layer, and the p type silicon film 6p as the upper layer. Accordingly, as compared with the case where the memory gate electrode MG is formed of only the p type silicon film 6p, the potential difference between the memory gate electrode MG and the semiconductor substrate 1 (N type well NW) becomes smaller. In this case, it is possible to obtain the effects provided upon inverting the polarity in the third embodiment. In other words, even when the voltage to be applied to the memory gate electrode MG is 0 V, it is possible to obtain an action capable of providing almost the same energy band structure as that obtained upon applying some positive potential (e.g., about 0.5 V). In still other words, it is possible to inhibit the phenomenon that the electrons accumulated (held) in the silicon nitride film 5b are unnecessarily extracted toward the semiconductor substrate. Further, it is possible to inhibit the phenomenon that the holes are unnecessarily injected from the semiconductor substrate into the silicon nitride film 5b. This can inhibit or prevent the data (write state) from being eliminated. Thus, it is possible to improve the holding characteristic of the data of the nonvolatile memory, namely, the stored information of the nonvolatile memory. Therefore, it is possible to improve the performances of the semiconductor device having a nonvolatile memory. Further, as with the fifth modified example, in general, when the upper electrode and the lower electrode of the capacitive element are formed of silicon films of mutually different conductivity types, both the upper electrode and the lower electrode may be depleted. Accordingly, the variation in capacitance may be increased, resulting in reduction of the precision as the capacitive element. In contrast, as in the semiconductor device of the sixth embodiment, the lower layer of the upper electrode UE is formed of the metal film 6mp. As a result, it is possible to avoid the problem of depletion of the upper electrode UE. Accordingly, the variation in capacitance is decreased, resulting in an improvement of the precision as the capacitive element. This enables the improvement of the performances of the semiconductor device.

Figure 47:
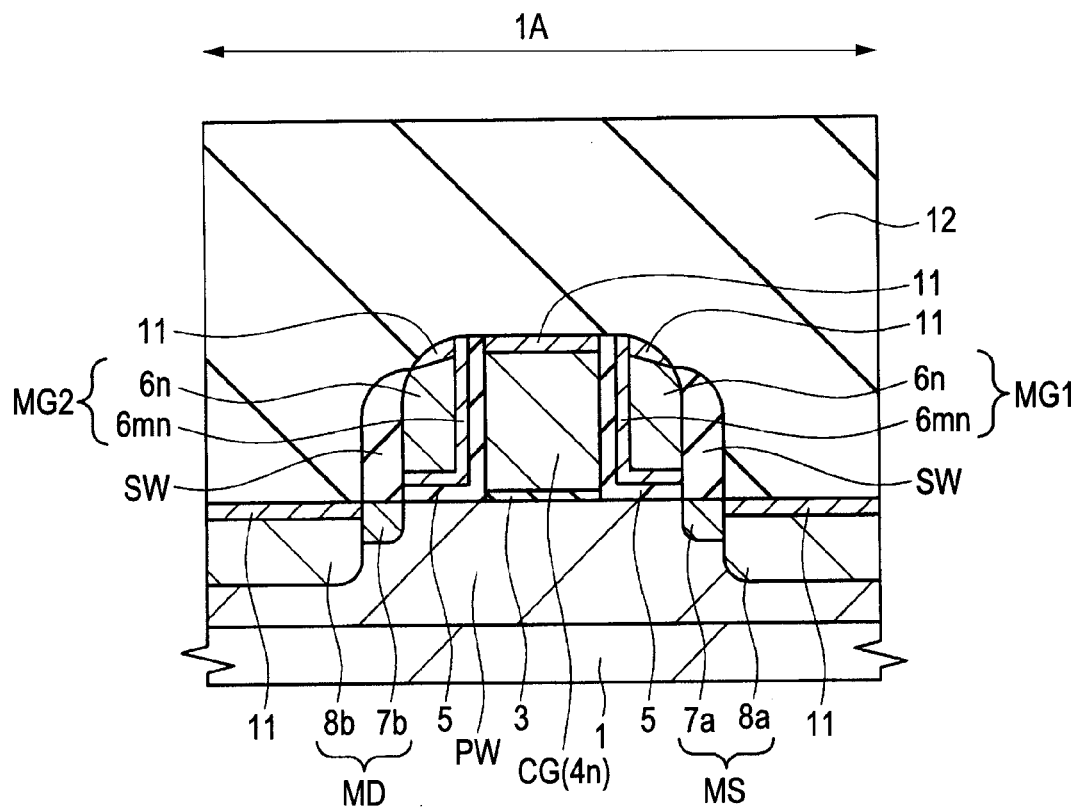
FIG. 47 is an essential part cross-sectional view of the third modified example (seventh modified example) of the semiconductor device of FIG. 36.

FIG. 47 is an essential part cross-sectional view of the semiconductor device of a third modified example of the third embodiment, and corresponds to FIG. 36. However, the capacitor formation region 1B is not shown, and only the memory cell region 1A is shown. Herein, to avoid confusion with the semiconductor device of the third modified example of the first embodiment shown in the FIG. 31, the semiconductor device of the third modified example of the third embodiment shown in FIG. 47 will be hereinafter referred to as a semiconductor device of a seventh modified example.

In the semiconductor device of the third embodiment, over one sidewall of the control gate electrode CG, the memory gate electrode MG was formed via the insulation film 5. However, in the semiconductor device of the seventh modified example shown in FIG. 47, over both the sidewalls of the control gate electrode CG, the memory gate electrodes MG1 and MG2 are formed via the insulation film 5.

Namely, in the semiconductor device of the seventh modified example shown in FIG. 47, over one sidewall of the control gate electrode CG, the memory gate electrode MG1 is formed in a sidewall spacer form via the insulation film 5. Over the other sidewall of the control gate electrode CG, the memory gate electrode MG2 is formed in a sidewall spacer form via the insulation film 5. The memory gate electrode MG1 and the memory gate electrode MG2 are formed over the sidewalls on the mutually opposing sides of the control gate electrode CG, respectively, and have an almost symmetric structure with the control gate electrode CG sandwiched therebetween. The memory gate electrode MG1 is the same as the memory gate electrode MG in the semiconductor device of the third embodiment. Namely, in the semiconductor device of the seventh modified example shown in FIG. 47, the control gate electrode CG, the memory gate electrode MG1 (corresponding to the memory gate electrode MG of the third embodiment), the sidewall insulation film SW over the sidewall of the memory gate electrode MG1, the p type well PW, the n$^-$ type semiconductor region 7a, the n$^+$ type semiconductor region 8a, the metal silicide layer 11 over the control gate electrode CG, and the metal silicide layer 11 over the n$^+$ type semiconductor region 8a are the same as those in the semiconductor device of the third embodiment. Further, in the semiconductor device of the seventh modified example shown in FIG. 47, the insulation film 3 formed between the control gate electrode CG and the semiconductor substrate 1 (p type well PW), and the insulation film 5 formed between the memory gate electrode MG1 and the semiconductor substrate 1 (p type well PW) and between the memory gate electrode MG1 and the control gate electrode CG are also the same as those in the semiconductor device of the third embodiment.

However, in the semiconductor device of the seventh modified example shown in FIG. 47, as described above, over the sidewall of the control gate electrode CG (the sidewall opposite to the side on which the memory gate electrode MG1 is formed), the memory gate electrode MG2 is formed in a sidewall spacer form via the insulation film 5. Between the memory gate electrode MG2 and the semiconductor substrate 1 (p type well PW), and between the memory gate electrode MG2 and the control gate electrode CG, the insulation film 5 is formed. The insulation film 5 formed between the memory gate electrode MG2 and the semiconductor substrate 1 (p type well PW), and between the memory gate electrode MG2 and the control gate electrode CG, and the insulation film 5 formed between the memory gate electrode MG1 and the semiconductor substrate 1 (p type well PW) and between the memory gate electrode MG1 and the control gate electrode CG are the insulation films at the same layer formed in the same step (corresponding to the step of FIG. 39). The insulation films 5 have the same structure (layer structure), but are separated from each other. The memory gate electrodes MG1 and MG2 each include a lamination film of the metal film 6mn adjacent to the insulation film 5, and the p type silicon film 6p spaced apart from the insulation film 5 via the metal film 6mn.

The memory gate electrode MG1, the control gate electrode CG, and the memory gate electrode MG2 extend and are disposed side by side along the main surface of the semiconductor substrate 1 with the insulation film 5 interposed between the opposing side surfaces (sidewalls) thereof. The direction of extension of the memory gate electrode MG1, the control gate electrode CG, and the memory gate electrode MG2 is the direction perpendicular to the paper plane of FIG. 47. The memory gate electrodes MG1 and MG2, and the control gate electrode CG are formed over the top of the semiconductor substrate 1 (p type well PW) between the semiconductor region MD and the semiconductor region MS via the insulation films 3 and 5 (for the control gate electrode CG, via the insulation film 3, and for the memory gate electrodes MG1 and MG2, via the insulation film 5). On the side of the semiconductor region MS, the memory gate electrode MG1 is situated. On the side of the semiconductor region MD, the memory gate electrode MG2 is situated. At the center, the control gate electrode CG is situated. Over the sidewall of the memory gate electrode MG2 (the side surface on the side opposite to the side thereof in contact with the control gate electrode CG), the sidewall insulation film SW is formed.

Further, in the semiconductor device of the seventh modified example shown in FIG. 47, the n$^-$ type semiconductor region 7b forming the semiconductor region MD for drain is formed in self-alignment with the sidewall of the memory gate electrode MG2 (the side surface on the side opposite to the side thereof in contact with the control gate electrode CG). Whereas, the n$^+$ type semiconductor region 8b forming the semiconductor region MD for drain is formed in self-alignment with the side surface of the sidewall insulation film SW over the sidewall of the memory gate electrode MG2 (the side surface on the side opposite to the side thereof in contact with the memory gate electrode MG2). Accordingly, the low-concentration n$^-$ type semiconductor region 7b is formed under the sidewall insulation film SW over the sidewall of the memory gate electrode MG2. The high-concentration n$^+$ type semiconductor region 8b is formed outside the low-concentration n$^-$ type semiconductor region 7b. Therefore, the low-concentration n$^-$ type semiconductor region 7b is formed in such a manner as to be adjacent to the channel region under the memory gate electrode MG2. The high-concentration n$^+$ type semiconductor region 8b is formed in such a manner as to be in contact with the low-concentration n$^-$ type semiconductor region 7b, and to be spaced apart from the channel region under the memory gate electrode MG2 by the n$^-$ type semiconductor region 7b. Over the tops of the silicon film 6n forming the memory gate electrodes MG1 and MG2, and the n$^+$ type semiconductor regions 8a and 8b, the metal silicide layers 11 are formed, respectively.

Other configurations of the semiconductor device of the seventh modified example shown in FIG. 47 are the same as those of the semiconductor device of the third embodiment, and hence, herein, a description thereon is omitted.

Figure 48:
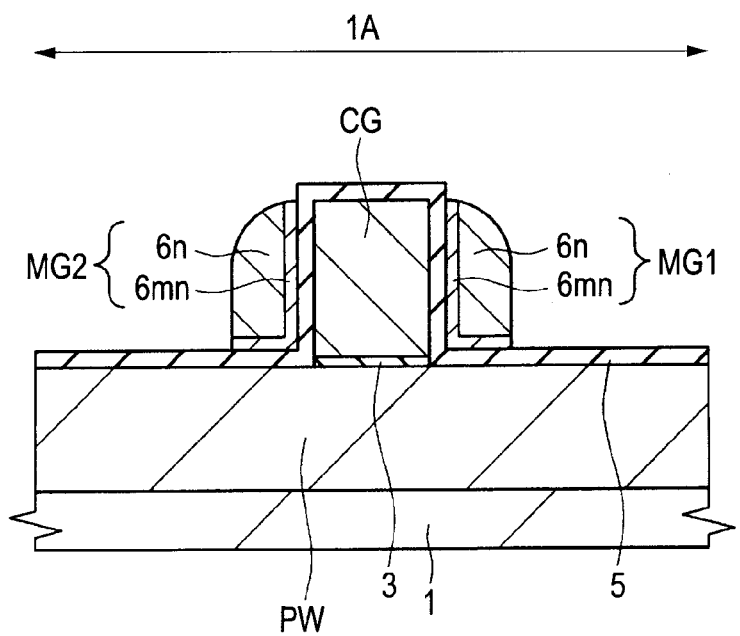
FIG. 48 is an essential part cross-sectional view of the semiconductor device during a manufacturing step of FIG. 47.
Figure 49:
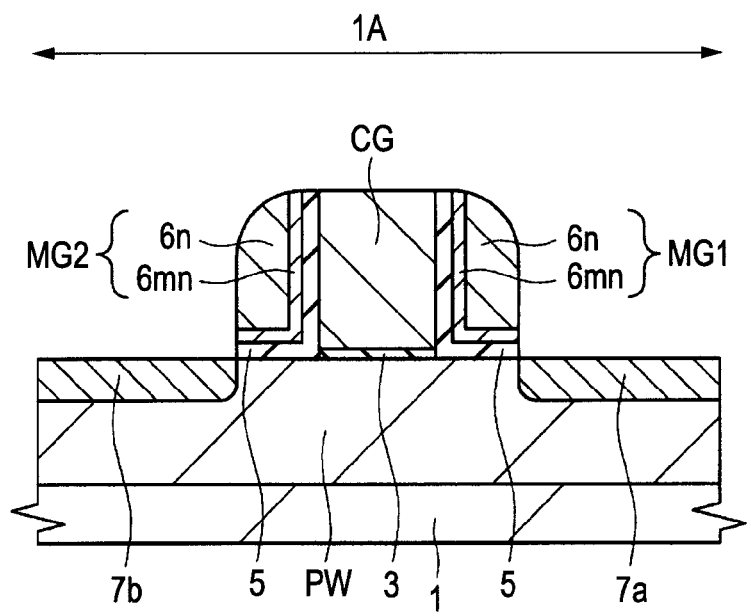
FIG. 49 is an essential part cross-sectional view of the semiconductor device during a manufacturing step following that of FIG. 48.
Figure 50:
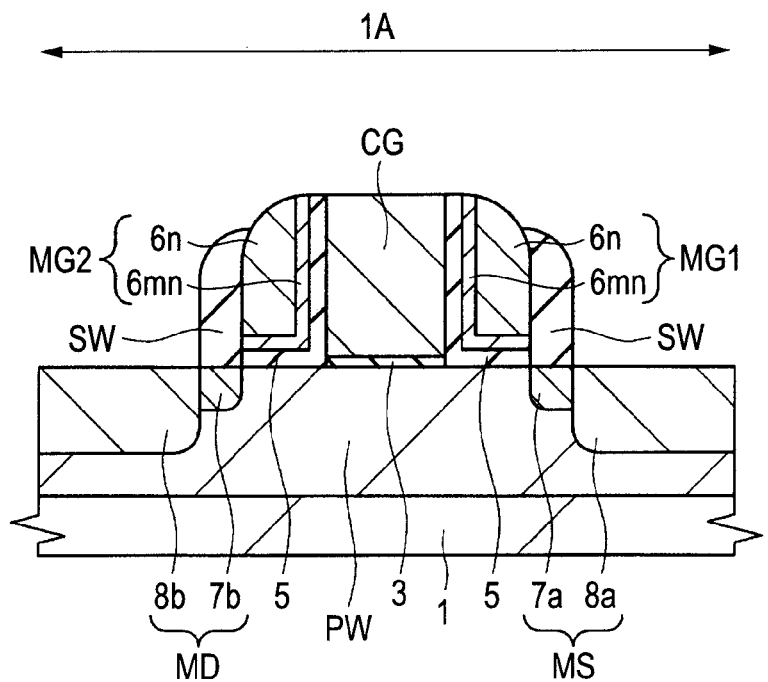
FIG. 50 is an essential part cross-sectional view of the semiconductor device during a manufacturing step following that of FIG. 49.

A description will be given to the manufacturing steps of the semiconductor device of the seventh modified example shown in FIG. 47. FIGS. 48 to 50 are each an essential part cross-sectional view of the semiconductor device during a manufacturing step of the seventh modified example shown in FIG. 47, and shows the essential part cross-sectional view of the memory cell region 1A. The manufacturing steps in the capacitor formation region 1B are the same as those in the third embodiment, and hence, herein, a description thereon is omitted. The manufacturing steps in the memory cell region 1A will be described.

In the same manner as in the third embodiment, the steps up to Step S9 (etching back step of the silicon film 6n and the metal film 6mn) are performed, resulting in a structure of FIG. 48 corresponding to FIG. 42. The memory gate electrode MG of the third embodiment corresponds to the memory gate electrode MG1 in FIG. 48. In the third embodiment, the silicon spacer SP1 formed via the insulation film 5 over the sidewall on the side of the control gate electrode CG opposite to the side thereof on which the memory gate electrode MG1 is formed corresponds to the memory gate electrode MG2 in FIG. 48.

The step corresponding to Step S9 of the third embodiment (etching back step of the silicon film 6n and the metal film 6mn) is performed to form the memory gate electrodes MG1 and MG2. Then, as shown in FIG. 49, the same step as Step S11 of the third embodiment is performed. As a result, the exposed portions of the insulation film 5 not covered with the memory gate electrodes MG1 and MG2, and the upper electrode UE are removed by etching (e.g., wet etching). At this step, in the memory cell region 1A, a portion of the insulation film 5 situated under the memory gate electrode MG1, and between the memory gate electrode MG1 and the control gate electrode CG is not removed, and is left. Whereas, a portion of the insulation film 5 situated under the memory gate electrode MG2, and between the memory gate electrode MG2 and the control gate electrode CG is also not removed, and is left.

Then, the same step as Step S12 (ion implantation step of forming the n⁻ type semiconductor regions 7a and 7b) of the third embodiment is performed to form the n⁻ type semiconductor regions 7a and 7b. At this step, the n⁻ type semiconductor region 7a is formed in self-alignment with the sidewall of the memory gate electrode MG1 (sidewall on the side opposite to the side thereof adjacent to the control gate electrode CG via the insulation film 5) in the memory cell region 1A. The n⁻ type semiconductor region 7b is formed in self-alignment with the sidewall of the memory gate electrode MG2 (sidewall on the side opposite to the side thereof adjacent to the control gate electrode CG via the insulation film 5) in the memory cell region 1A.

Then, the same step as Step S13 (the sidewall insulation film SW formation step) of the third embodiment is performed. As a result, as shown in FIG. 50, over the sidewalls of the memory gate electrodes MG1 and MG2 (sidewalls on the respective sides opposite to the sides thereof adjacent to the control gate electrode CG via the respective insulation films 5), the sidewall insulation film SW is formed.

Then, the same step as Step S14 (the ion implantation step of forming the n⁺ type semiconductor regions 8a and 8b) of the third embodiment is performed to form the n⁺ type semiconductor regions (impurity diffusion layers) 8a and 8b. At this step, in the memory cell region 1A, the n⁺ type semiconductor region 8a is formed in self-alignment with the sidewall insulation film SW over the sidewall of the memory gate electrode MG1. The n⁺ type semiconductor region 8b is formed in self-alignment with the sidewall insulation film SW over the sidewall of the memory gate electrode MG2.

Then, in the same manner as in the third embodiment, the metal silicide layers 11 are formed. The metal silicide layers 11 are formed at the tops (the top surfaces, surfaces, or top layer parts) of the control gate electrode CG, the silicon film 6n of the memory gate electrodes MG1 and MG2, the n⁺ type semiconductor regions 8a and 8b, and the upper electrode UE (not shown in FIG. 35), respectively.

Then, in the same manner as in the third embodiment, the insulation film 12, the contact hole CNT, the plug PG, the insulation film 14, and the wire M1 are formed. However, herein, these are not shown, and a detailed description thereon is omitted.

Also in the case of the semiconductor device of the seventh modified example shown in FIG. 47, by applying the technology of the third embodiment (particularly, the configuration of the memory gate electrode MG), it is possible to obtain the effects as described in the third embodiment.

Further, although not shown, a semiconductor device of a fourth modified example of the third embodiment (which will be hereinafter referred to as an eighth modified example) is a semiconductor device obtained in the following manner: over the control gate electrode CG of any of the semiconductor device of the third embodiment, and the semiconductor devices of the fifth to seventh modified examples described in the present embodiment, a cap insulation film is further formed; and the memory gate electrodes MG (MG1 and MG2) are formed over the sidewalls of a lamination film of the control gate electrode CG and the cap insulation film. The insulation films 5 are situated under the memory gate electrodes MG (MG1 and MG2), and between the lamination film of the control gate electrode CG and the cap insulation film and the memory gate electrodes MG (MG1 and MG2). Also in the case of the semiconductor device of the eighth modified example, by applying the technology of the third embodiment (particularly, the configuration of the memory gate electrode MG), it is possible to obtain the effects as described in the third embodiment. Further, also in the eighth modified example, the capacitive element C1 formed in the capacitor formation region 1B has the same configuration as those of the third embodiment, and the fifth to seventh modified examples described in the present embodiment. Over the lower electrode LE, an insulation film at the same layer as the cap insulation film is not formed, and is removed. This is for the following purpose: by removing the cap insulation film, the film thickness (of the insulation film) formed between the lower electrode LE and the upper electrode UE is reduced, which prevents the reduction of the capacitance.

The manufacturing steps of the semiconductor device of the eighth modified example are the same as the manufacturing steps of the third embodiment, except that in the process flow of FIG. 8, between Step S5 and Step S6, a step of forming an insulation film to be the cap insulation film is added, that in Step S6, the insulation film to be the cap insulation film is also patterned simultaneously with the silicon film 4n, and that between Step S6 and Step S7, a step of removing the cap insulation film formed over the lower electrode LE is added, in the manufacturing steps of the third embodiment. Therefore, a detailed description thereon is omitted.

Fifth Embodiment

In the first and second embodiments, the uppermost-layer insulation film 5d of the insulation film 5 was formed as an insulation film capable of causing Fermi level pinning, and an insulation film with a high dielectric constant. Alternatively, in the third and fourth embodiments, the memory gate electrode MG was formed of a lamination film of the metal film 6mn (metal film 6mp) and the silicon film 6n (silicon film 6p). As a result, it was possible to obtain the foregoing desired effects. In the present embodiment, a description will be given to the case where for the uppermost layer of the insulation film 5, the insulation film 5d is formed, and the memory gate electrode MG is formed of a lamination film of the metal film 6mn (metal film 6mp) and the silicon film 6n (silicon film 6*p*). Also in the present embodiment, as with the first and third embodiments, the polarity will be described based on the n channel type MISFET.

Figure 51:
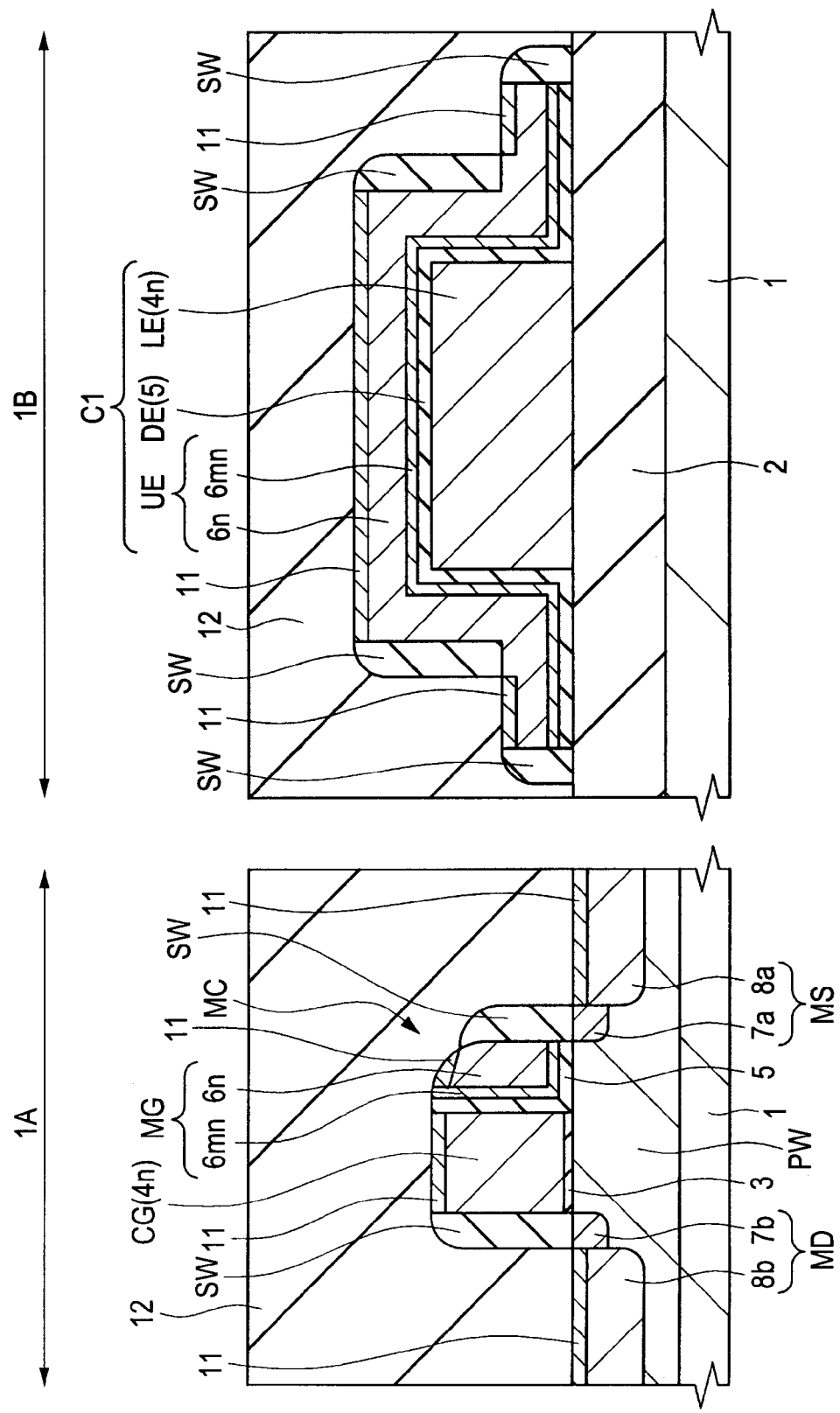
FIG. 51 is an essential part cross-sectional view of a semiconductor device during a manufacturing step of a still other embodiment of the present invention.
Figure 52:
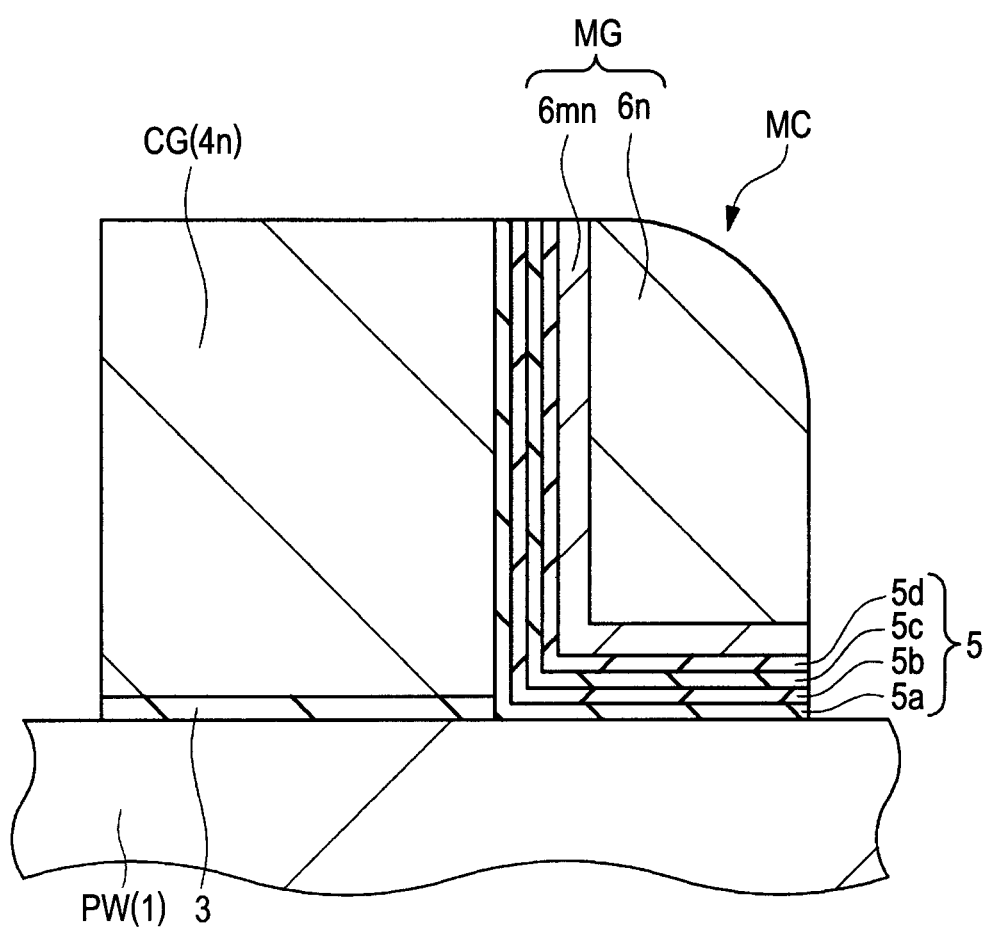
FIG. 52 is a partially enlarged cross-sectional view of a portion of FIG. 51 on an enlarged scale.
Figure 53:
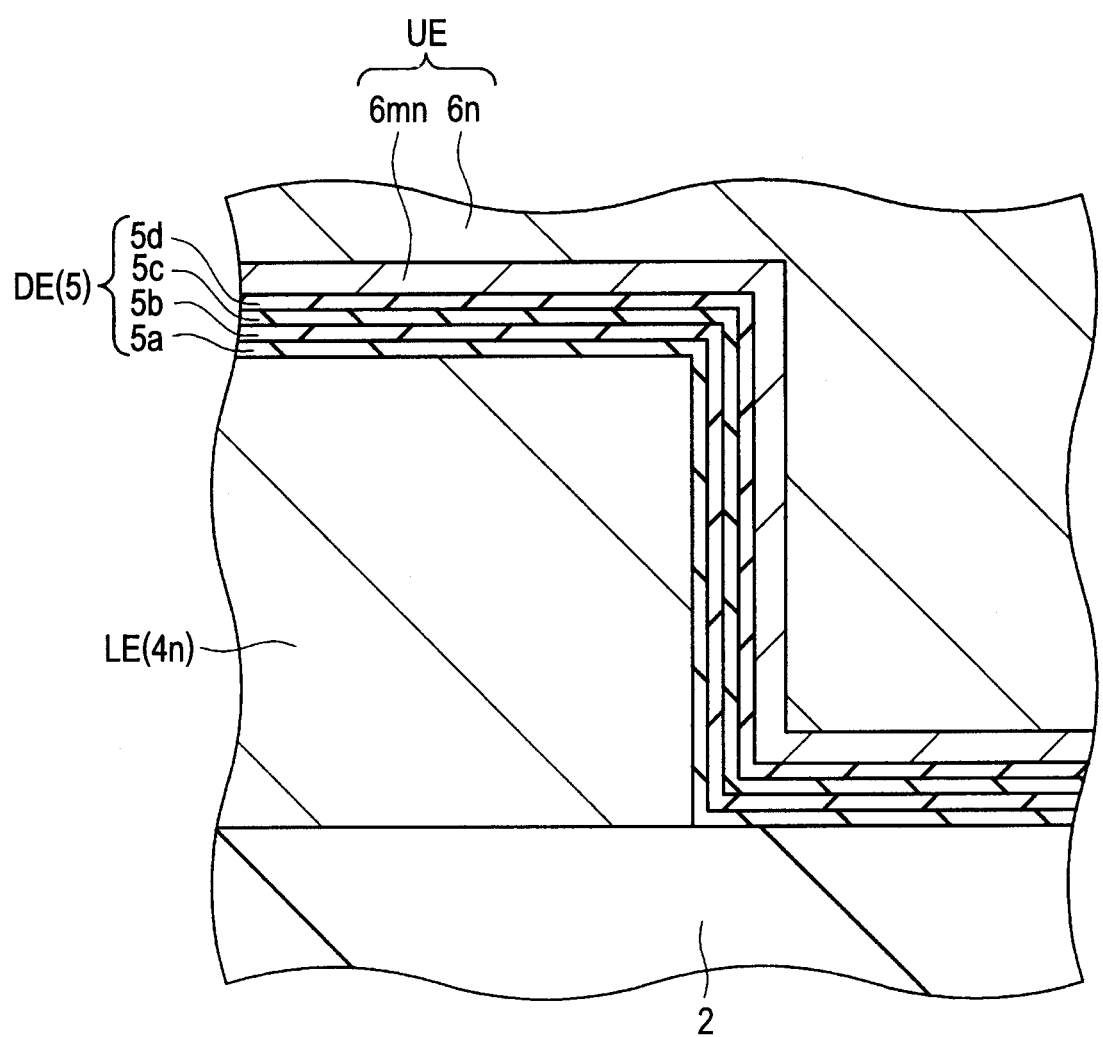
FIG. 53 is a partially enlarged cross-sectional view of a portion of FIG. 51 on an enlarged scale.

FIG. 51 is an essential part cross-sectional view of the semiconductor device of the present embodiment. FIG. 52 is a partially enlarged cross-sectional view (essential part cross-sectional view) of the memory cell MC in the semiconductor device of the present embodiment, and shows a part (a part of the memory cell region 1A) of FIG. 51 on an enlarged scale. FIG. 53 is a partially enlarged cross-sectional view (essential part cross-sectional view) of the capacitive element C1 in the semiconductor device of the present embodiment, and shows a part (a part of the capacitor formation region 1B) of FIG. 51 on an enlarged scale. Incidentally, FIG. 51 corresponds to FIGS. 1 and 36 of the first and third embodiments; FIG. 52 corresponds to FIGS. 2 and 37 of the first and third embodiments; and FIG. 53 corresponds to FIGS. 4 and 38 of the first and third embodiments.

As shown in FIGS. 51 and 52, in the memory cell MC of the nonvolatile memory in the present embodiment, the insulation film 5 includes a lamination structure of the silicon oxide film 5*a*, the silicon nitride film 5*b*, the silicon oxide film 5*c*, and the insulation film 5*d*; the insulation film 5*d* is an insulation film capable of causing Fermi level pinning, and is an insulation film with a high dielectric constant. Namely, the insulation film 5 in the present embodiment has the same configuration (lamination structure) as that of the insulation film 5 in the first embodiment. Therefore, in the present embodiment, the silicon oxide film 5*a*, the silicon nitride film 5*b*, the silicon oxide film 5*c*, and the insulation film 5*d* forming the insulation film 5 are the same as the silicon oxide film 5*a*, the silicon nitride film 5*b*, the silicon oxide film 5*c*, and the insulation film 5*d* forming the insulation film 5 in the first embodiment, respectively. Therefore, herein, a detailed description thereon is omitted. The insulation film 5*d* is an insulation film capable of causing Fermi level pinning. Accordingly, at the interface between the insulation film 5*d* and the memory gate electrode MG, Fermi level pinning is caused. Thus, as compared with the case where there is no insulation film 5*d*, Fermi level is pinned at a lower position. Namely, the potential difference between the memory gate electrode MG and the semiconductor substrate 1 (p type well PW) is reduced.

Further, the memory gate electrode MG in the present embodiment is formed of a lamination film of the metal film 6*mn* and the n type silicon film 6*n*. The metal film 6*mn* is formed to extend from the sidewall of the control gate electrode CG over the semiconductor substrate via the insulation film 5. Namely, the memory gate electrode MG includes a lamination film of the metal film 6*mn* adjacent to the insulation film 5, and the n type silicon film 6*n* spaced apart from the insulation film 5 via the metal film 6*mn*. Therefore, the memory gate electrode MG in the present embodiment has the same configuration (lamination structure) as that of the memory gate electrode MG in the third embodiment. In the present embodiment, the metal film 6*mn* and the silicon 6*n* forming the memory gate electrode MG are the same as the metal film 6*mn* and the silicon film 6*n* forming the memory gate electrode MG in the third embodiment, respectively. As the main feature, the metal film 6*mn* has a large work function (more specifically, the work function is 4.5 eV or more). For the metal film 6*mn* formed as the lower layer of the memory gate electrode MG, as a metal film having a work function of 4.5 eV or more, for example, Ti (titanium) or Pt (platinum) is used (i.e., the metal film 6*mn* is formed of Ti or Pt). As a result, the potential difference between the memory gate electrode MG and the semiconductor substrate 1 (p type well PW) is reduced. Other configurations of the memory cell MC of the present embodiment are the same as the configurations of the first embodiment, and hence a description thereon is omitted.

On the other hand, in the capacitive element C1, as shown in FIGS. 51 and 53, the capacitive insulation film DE is formed of the same layer as the insulation film 5 in the memory cell MC, i.e., in a lamination structure of the silicon oxide film 5*a*, the silicon nitride film 5*b*, the silicon oxide film 5*c*, and the insulation film 5*d*; and the upper electrode UE is formed of the same layer as the memory gate electrode MG in the memory cell MC, i.e., in a lamination structure of the metal film 6*mn* and the silicon film 6*n*. Therefore, the capacitive insulation film DE in the present embodiment has the same configuration (lamination structure) as that of the capacitive insulation film DE in the first embodiment. The upper electrode UE in the present embodiment has the same configuration (lamination structure) as that of the upper electrode UE in the third embodiment. By forming the metal film 6*mn* as the lower layer of the upper electrode UE of the capacitive element C1, it is possible to avoid a problem of depletion of the upper electrode UE. Therefore, it is possible to improve the precision as the capacitive element. Other configurations of the capacitive element C1 of the present embodiment are the same as the configurations of the first embodiment, and hence a description thereon is omitted.

The operation system of the memory cell MC, and the conditions for applying voltages in the present embodiment are also the same as those in the first embodiment, and hence a description thereon is omitted.

The manufacturing steps of the semiconductor device of the present embodiment are the same as the manufacturing steps of the third embodiment, except that in the manufacturing steps of the semiconductor device of the third embodiment, the formation step of the insulation film 5 of Step S7 is performed in the same manner as the formation step of the insulation film 5 of Step S7 of the first embodiment (i.e., as the insulation film 5, a lamination film of the silicon oxide film 5*a*, the silicon nitride film 5*b*, the silicon oxide film 5*c*, and the insulation film 5*d* is formed). Therefore, herein a description thereon is omitted.

Also in the present embodiment, for the upper layer of the insulation film 5, the insulation film 5*d* is formed; and for the lower layer of the memory gate electrode MG, the metal film 6*mn* is formed. Accordingly, it is possible to reduce the potential difference between the memory gate electrode MG and the semiconductor substrate 1 (p type well PW). As a result, it is possible to obtain an action capable of providing almost the same energy band structure as that obtained when in the semiconductor device of the first comparative example of the first embodiment, the memory gate electrode MG101 is applied with some negative potential (e.g., about −0.5 V). Therefore, it is possible to obtain the same effects as those in the first and third embodiments.

Further, also in the present embodiment, the insulation film 5 at the same layer as the insulation film 5 used as the gate insulation film of the memory transistor in the memory cell MC of the nonvolatile memory is used as the capacitive insulation film DE of the capacitive element C1. Accordingly, for the upper layer of the capacitive insulation film DE, the insulation film 5*d* which is an insulation film with a high dielectric constant is formed. As a result, it is possible to obtain the same effects as with the capacitive element C1 in the semiconductor device of the first embodiment. Further, the conductive film at the same layer as the conductive film used as the memory gate electrode MG of the memory transistor in the memory cell MC of the nonvolatile memory (the lamination film of the metal film 6*mn* and the silicon film 6*n*) is used as the upper electrode UE of the capacitive element C1. Accordingly, over the capacitive insulation film DE, the metal film is formed. As a result, it is possible to obtain the same effects as with the capacitive element C1 in the semiconductor device of the third embodiment.

Further, in the present embodiment, the same modified example as the modified examples described in the second and fourth embodiments is also applicable to the present embodiment. Namely, as the first modified example of the present embodiment, mention may be made of the case where in the semiconductor device of the fifth modified example shown in FIG. 45, as the insulation film 5, the same insulation film 5 as that of the first embodiment (i.e., the insulation film 5 including a lamination film of the silicon oxide film 5a, the silicon nitride film 5b, the silicon oxide film 5c, and the insulation film 5d) is used. Whereas, as the second modified example of the present embodiment, mention may be made of the case where in the semiconductor device of the sixth modified example shown in FIG. 46, as the insulation film 5, the same insulation film 5 as that of the first embodiment (i.e., the insulation film 5 including a lamination film of the silicon oxide film 5a, the silicon nitride film 5b, the silicon oxide film 5c, and the insulation film 5d) is used. Further, as the third modified example of the present embodiment, mention may be made of the case where in the semiconductor device of the seventh modified example shown in FIG. 47, as the insulation film 5, the same insulation film 5 as that of the first embodiment (i.e., the insulation film 5 including a lamination film of the silicon oxide film 5a, the silicon nitride film 5b, the silicon oxide film 5c, and the insulation film 5d) is used. Still further, as the fourth modified example of the present embodiment, mention may be made of the case where in the semiconductor device of the eighth modified example (not shown), as the insulation film 5, the same insulation film 5 as that of the first embodiment (i.e., the insulation film 5 including a lamination film of the silicon oxide film 5a, the silicon nitride film 5b, the silicon oxide film 5c, and the insulation film 5d) is used. Also in these cases (modified examples), it is possible to obtain the same effects as those with the modified examples described in the second and fourth embodiments (the first to eighth modified examples).

Sixth Embodiment

In the first to fifth embodiments, a description was given to the semiconductor devices in each of which over the same semiconductor substrate 1, in addition to (the memory cell MC of) the nonvolatile memory, the capacitive element C1 was formed (merged). However, the capacitive element C1 is not necessarily required to be formed over the same semiconductor substrate as that for the memory cell MC, and may be formed alone as the capacitive element C1.

Figure 54:
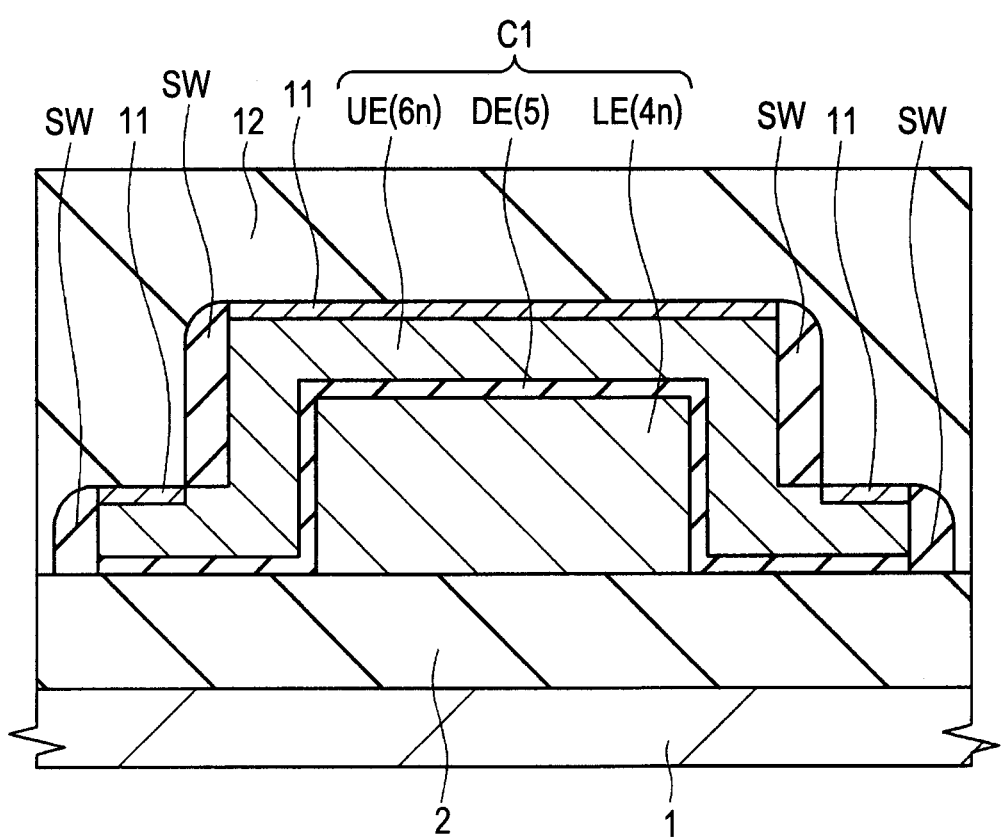
FIG. 54 is an essential part cross-sectional view of a semiconductor device during a manufacturing step of a further embodiment of the present invention.
Figure 55:
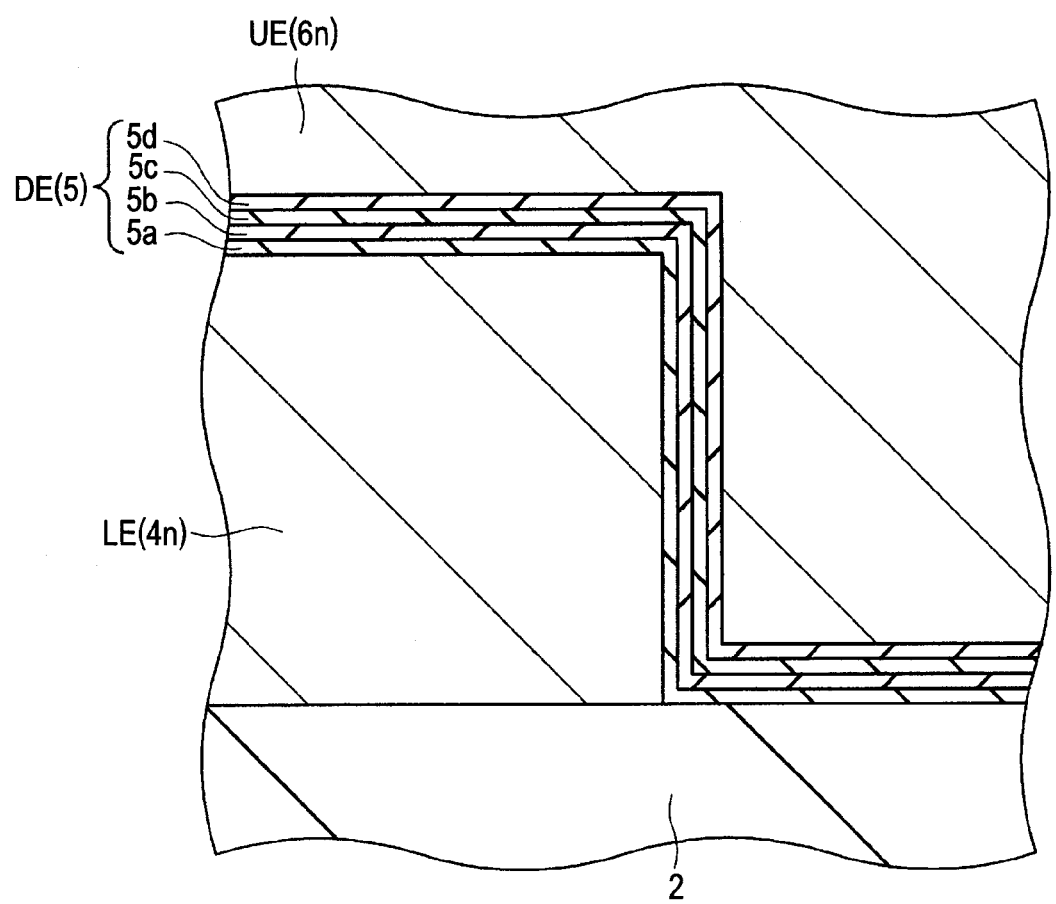
FIG. 55 is a partially enlarged cross-sectional view of a portion of FIG. 54 on an enlarged scale.

FIG. 54 is an essential part cross-sectional view of the semiconductor device of the present embodiment. FIG. 55 is a partially enlarged cross-sectional view (essential part cross-sectional view) of the capacitive element C1 shown in FIG. 54, and shows a part of FIG. 54 on an enlarged scale.

The capacitive element C1 shown in FIGS. 54 and 55 has the same configuration as that of the capacitive element C1 described in the first embodiment, and hence, a description thereon is omitted.

In the capacitive element C1 shown in FIGS. 54 and 55, the insulation film 5d is formed at the top (top layer part) of the insulation film 5. As a result, as compared with the case where the insulation film 5d is not formed, the physical film thickness increases. This enables the reduction of the defect density of the silicon oxide film 5c formed in contact with the insulation film 5d. As a result, it becomes possible to improve the reliability as the capacitive element. Further, the insulation film 5d is formed as a film having a high dielectric constant. Therefore, as described above, even when the insulation film 5d is added, it is possible to inhibit the reduction of the capacitance value of the capacitive element C1 as compared with the case where the insulation film 5d is not formed. For this reason, it is possible to inhibit or prevent the increase in facing area between the lower electrode LE and the upper electrode UE via the capacitive insulation film DE. This can inhibit or prevent the increase in area of the capacitor formation region. Namely, it becomes possible to improve the reliability of the semiconductor device while inhibiting or preventing the increase in area of the semiconductor device.

Figure 56:
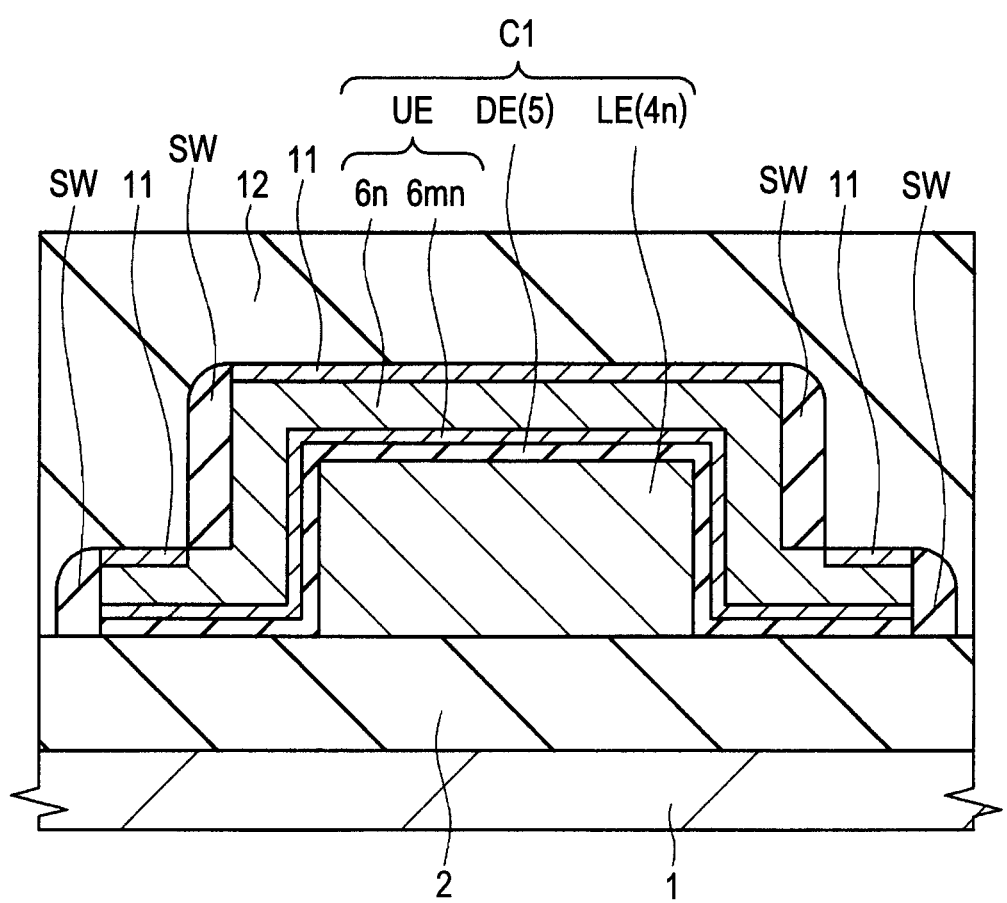
FIG. 56 is an essential part cross-sectional view of a semiconductor device during a manufacturing step of a furthermore embodiment of the present invention.
Figure 57:
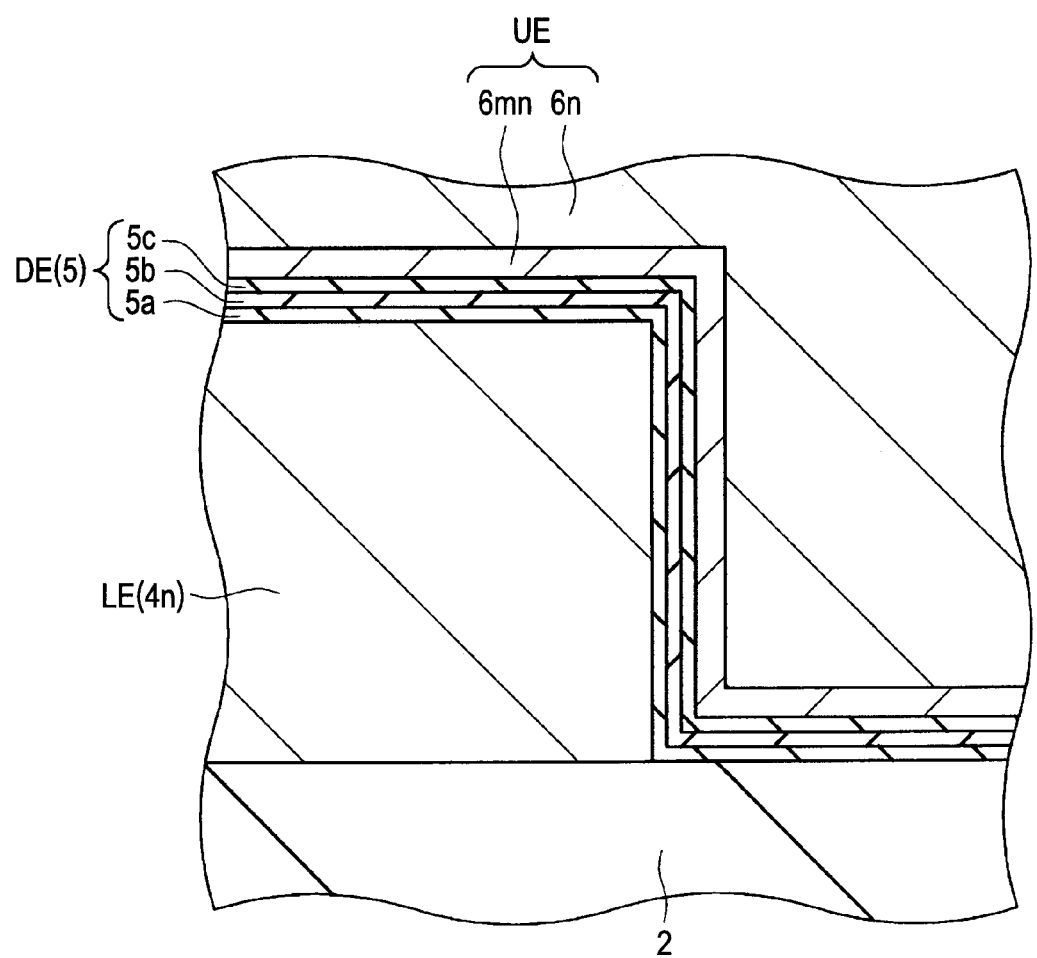
FIG. 57 is a partially enlarged cross-sectional view of a portion of FIG. 56 on an enlarged scale.

FIG. 56 is an essential part cross-sectional view of a semiconductor device of another form in the present embodiment. FIG. 57 is a partially enlarged cross-sectional view (essential part cross-sectional view) of the capacitive element C1 shown in FIG. 56, and shows a part of FIG. 56 on an enlarged scale.

The capacitive element C1 shown in FIGS. 56 and 57 has the same configuration as that of the capacitive element C1 described in the third embodiment, and hence, a description thereon is omitted.

In the capacitive element C1 shown in FIGS. 56 and 57, by forming the metal film 6mn for the lower layer of the upper electrode UE, it is possible to avoid a problem of depletion of the upper electrode UE. Therefore, the variation in capacitance is reduced, resulting in an improvement of the precision as the capacitive element. This enables the improvement of the performances of the semiconductor device.

Further, in the capacitive element C1 shown in FIGS. 56 and 57, as with the capacitive element C1 in the semiconductor device in the fifth or sixth modified example of the third embodiment (FIG. 45 or 46), also when the upper electrode UE is formed of a p type silicon film (corresponding to the silicon film 6p), by forming the metal film 6mn for the lower layer of the upper electrode UE, it is possible to avoid a problem of depletion of the upper electrode UE. Therefore, the variation in capacitance is reduced, resulting in an improvement of the precision as the capacitive element. This enables the improvement of the performances of the semiconductor device.

Figure 58:
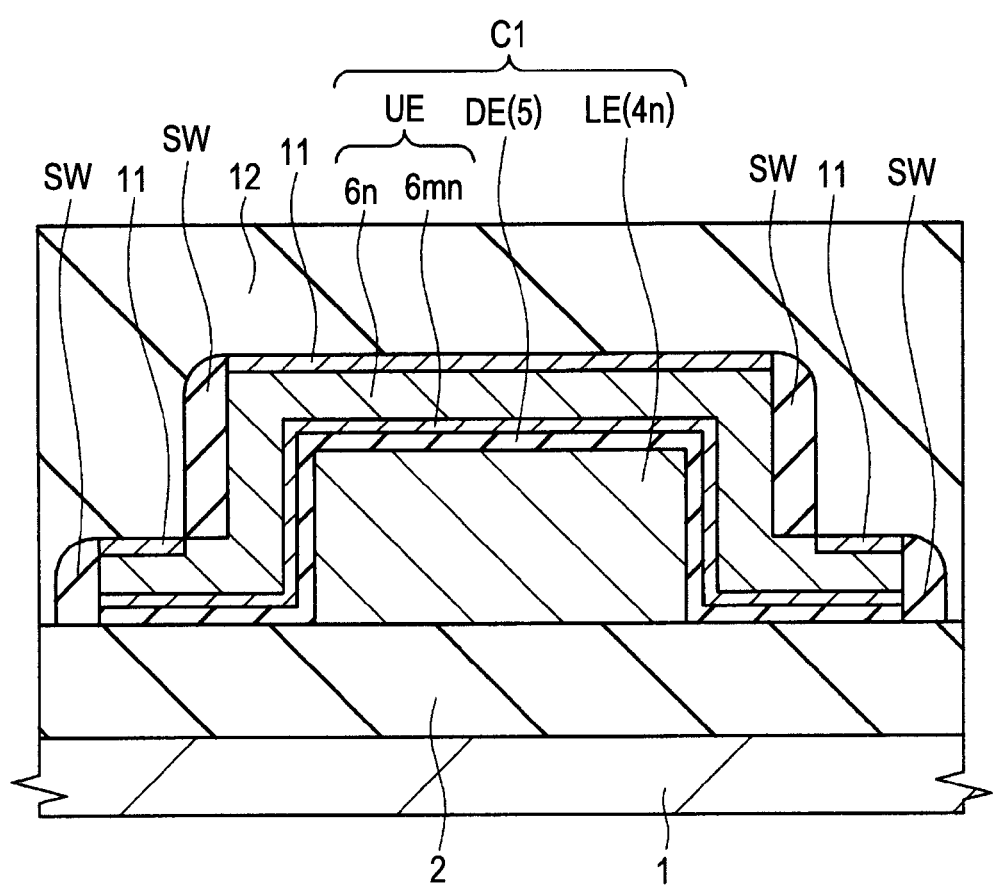
FIG. 58 is an essential part cross-sectional view of a semiconductor device during a manufacturing step of a still other embodiment of the present invention.
Figure 59:
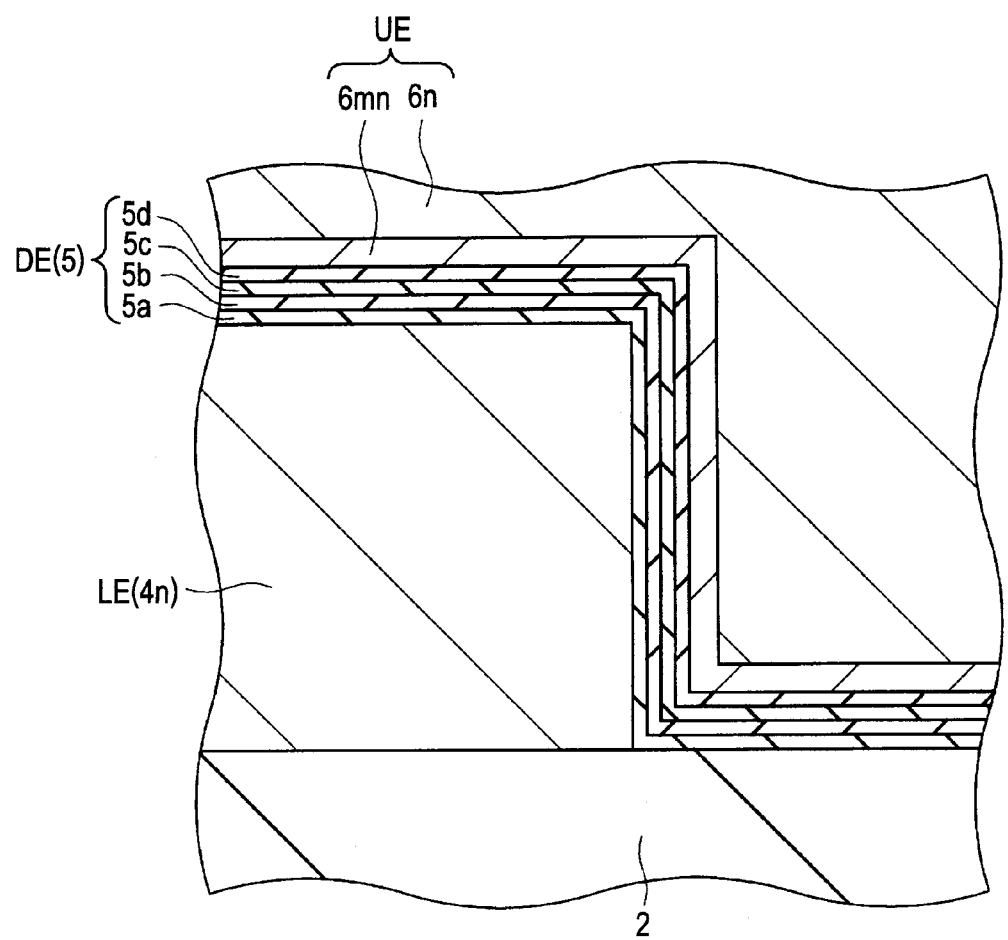
FIG. 59 is a partially enlarged cross-sectional view of a portion of FIG. 58 on an enlarged scale.

FIG. 58 is an essential part cross-sectional view of a semiconductor device of a still other form in the present embodiment. FIG. 59 is a partially enlarged cross-sectional view (essential part cross-sectional view) of the capacitive element C1 shown in FIG. 58, and shows a part of FIG. 58 on an enlarged scale.

The capacitive element C1 shown in FIGS. 58 and 59 has the same configuration as that of the capacitive element C1 described in the fifth embodiment, and hence, a description thereon is omitted.

In the capacitive element C1 shown in FIGS. 58 and 59, the insulation film 5d is formed at the top (top layer part) of the insulation film 5. As a result, as compared with the case where the insulation film 5d is not formed, the physical film thickness increases. This enables the reduction of the defect density of the silicon oxide film 5c formed in contact with the insulation film 5d. As a result, it becomes possible to improve the reliability as the capacitive element. Further, the insulation film 5d is formed as a film having a high dielectric constant. Therefore, as described above, even when the insulation film 5d is added, it is possible to inhibit the reduction of the capacitance value of the capacitive element C1 as compared with the case where the insulation film 5d is not formed. For this reason, it is possible to inhibit or prevent the increase in facing area between the lower electrode LE and the upper electrode UE via the capacitive insulation film DE. This can inhibit or prevent the increase in area of the capacitor formation region. Namely, it becomes possible to improve the reliability of the semiconductor device while inhibiting or preventing the increase in area of the semiconductor device.

Further, in the capacitive element C1 shown in FIGS. 58 and 59, by forming the metal film 6mn for the lower layer of the upper electrode UE, it is possible to avoid a problem of depletion of the upper electrode UE. Therefore, the variation in capacitance is reduced, resulting in an improvement of the precision as the capacitive element. This enables the improvement of the performances of the semiconductor device.

Further, in the capacitive element C1 shown in FIGS. 58 and 59, as with the capacitive element C1 in the semiconductor device in the fifth or sixth modified example of the third embodiment (FIG. 45 or 46), also when the upper electrode UE is formed of a p type silicon film (corresponding to the silicon film 6p), by forming the metal film 6mn for the lower layer of the upper electrode UE, it is possible to avoid a problem of depletion of the upper electrode UE. Therefore, the variation in capacitance is reduced, resulting in an improvement of the precision as the capacitive element. This enables the improvement of the performances of the semiconductor device.

Up to this point, the invention made by the present inventors was specifically described by way of embodiments thereof. However, it is naturally understood that the present invention is not limited to the embodiments, and can be variously changed within the scope not departing from the gist thereof.

The present invention is effectively applicable to a semiconductor device.

What is claimed is:

1. A semiconductor device, comprising:
a semiconductor substrate;
a first gate electrode formed over the top of the semiconductor substrate;
a second gate electrode formed over the top of the semiconductor substrate, and adjacent to the first gate electrode;
a first insulation film formed between the first gate electrode and the semiconductor substrate; and
a second insulation film formed between the second gate electrode and the semiconductor substrate, and between the first gate electrode and the second gate electrode,
wherein the second insulation film comprises a lamination film of a first silicon oxide film formed directly on the semiconductor substrate, a charge accumulation layer formed directly on the first silicon oxide film, a second silicon oxide film formed directly on the charge accumulation layer, and a third insulation film formed directly on the second silicon oxide film,
wherein the third insulation film is formed of a metal compound containing at least one of Hf, Zr, Al, Ta, and La,
wherein the thickness of the third insulation film is smaller than the thickness of the second silicon oxide film,
wherein the third insulation film is in contact with the second gate electrode and the second silicon oxide film,
wherein the third insulation film causes Fermi level pinning, and
wherein the second gate electrode comprises silicon.

2. The semiconductor device according to claim 1,
wherein the charge accumulation layer is a silicon nitride film.

3. The semiconductor device according to claim 2,
wherein the first gate electrode comprises silicon.

4. The semiconductor device according to claim 3,
wherein the thickness of the third insulation film is equal to or smaller than the thickness of the second silicon oxide film.

5. The semiconductor device according to claim 4,
wherein the thickness of the third insulation film is 0.5 nm or more and 2 nm or less.

6. The semiconductor device according to claim 5,
wherein the thickness of the second silicon oxide film is 4 nm or more.

7. The semiconductor device according to claim 6,
wherein the thickness of the third insulation film is 10% or less of the total thickness of the first silicon oxide film, the charge accumulation layer, and the second silicon oxide film.

8. The semiconductor device according to claim 7,
wherein the third insulation film is a hafnium oxide film, a zirconium oxide film, or an aluminum oxide film.

9. The semiconductor device according to claim 1,
wherein the semiconductor device has the memory cell of a nonvolatile memory,
wherein the first and second gate electrodes are gate electrodes forming the memory cell of the nonvolatile memory, and
wherein the voltage to be supplied to the second gate electrode for reading the stored information of the memory cell of the nonvolatile memory is 0 V.

10. The semiconductor device according to claim 1,
wherein a MISFET formed of the second gate electrode is an n channel type MISFET.

11. The semiconductor device according to claim 10,
wherein the second gate electrode comprises an n type silicon.

12. The semiconductor device according to claim 10,
wherein the second gate electrode comprises a p type silicon.

13. The semiconductor device according to claim 1,
wherein a MISFET formed of the second gate electrode is a p channel type MISFET.

14. The semiconductor device according to claim 1,
wherein the second gate electrode comprises a lamination film of a first metal film adjacent to the second insulation film, and with a work function of 4.5 eV or more, and an n type first silicon film spaced apart from the second insulation film via the first metal film.

15. The semiconductor device according to claim 14,
wherein the first metal film is formed of Ti or Pt.

16. The semiconductor device according to claim 1,
wherein the second gate electrode comprises a lamination film of a second metal film adjacent to the second insulation film, and with a work function of 4.5 eV or less, and a p type second silicon film spaced apart from the second insulation film via the second metal film.

17. The semiconductor device according to claim 16,
wherein the second metal film is formed of Ta, Al, or La.

18. The semiconductor device according to claim 1,
wherein each of the first silicon oxide film, the charge accumulation layer, and the second silicon oxide film is formed of a single layer.

* * * * *